(12) United States Patent
Malhotra et al.

(10) Patent No.: US 11,639,559 B2
(45) Date of Patent: *May 2, 2023

(54) HIGH REFRACTIVE INDEX OPTICAL DEVICE FORMED BASED ON SOLID CRYSTAL AND FABRICATION METHOD THEREOF

(71) Applicant: Meta Platforms Technologies, LLC, Menlo Park, CA (US)

(72) Inventors: Tanya Malhotra, Redmond, WA (US); Tingling Rao, Bellevue, WA (US); Andrew John Ouderkirk, Kirkland, WA (US); Arman Boromand, Redmond, WA (US); Lafe Joseph Purvis, Redmond, WA (US); Oleg Yaroshchuk, Kyiv (UA); Sheng Ye, Redmond, WA (US); Sandeep Rekhi, San Jose, CA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 129 days.

This patent is subject to a terminal disclaimer.

(21) Appl. No.: 17/159,746

(22) Filed: Jan. 27, 2021

(65) Prior Publication Data
US 2021/0263313 A1  Aug. 26, 2021

Related U.S. Application Data

(60) Provisional application No. 62/981,528, filed on Feb. 25, 2020, provisional application No. 63/063,379, filed on Aug. 9, 2020.

(51) Int. Cl.
*C30B 29/60* (2006.01)
*C30B 29/54* (2006.01)
(Continued)

(52) U.S. Cl.
CPC .......... *C30B 29/605* (2013.01); *C30B 29/54* (2013.01); *G02B 1/08* (2013.01); *C30B 11/003* (2013.01);
(Continued)

(58) Field of Classification Search
CPC ....... C30B 23/02; C30B 29/54; C30B 29/605; C30B 30/25; G02B 5/3083; G02B 5/30;
(Continued)

(56) References Cited

U.S. PATENT DOCUMENTS 9,733,475 B1  8/2017  Brown et al.
2005/0103258 A1  5/2005  Lazarev
(Continued)

FOREIGN PATENT DOCUMENTS

EP  0352931 A1  1/1990

OTHER PUBLICATIONS

International Search Report and Written Opinion dated Jul. 16, 2021, issued in International Application No. PCT/US2021/019293, filed on Feb. 23, 2021 (17 pages).
(Continued)

*Primary Examiner* — Xuemei Zheng
(74) *Attorney, Agent, or Firm* — Millburn IP PLLC

(57) ABSTRACT

An optical element is provided. The optical element includes a solid crystal including crystal molecules aligned in a predetermined alignment pattern at least partially defined by an alignment structure.

19 Claims, 43 Drawing Sheets

(51) Int. Cl.
  G02B 1/08   (2006.01)
  G02B 5/30   (2006.01)
  *C30B 23/02*    (2006.01)
  *C30B 11/00*    (2006.01)
  *C30B 30/04*    (2006.01)
  *C30B 30/02*    (2006.01)

(52) U.S. Cl.
  CPC .............. *C30B 23/02* (2013.01); *C30B 30/02* (2013.01); *C30B 30/04* (2013.01); *G02B 5/3041* (2013.01)

(58) Field of Classification Search
  CPC ...... G02B 5/3025; G02B 5/1833; G02B 6/34; G02B 1/08
  See application file for complete search history.

(56) References Cited

U.S. PATENT DOCUMENTS

| | | | |
|---|---|---|---|
| 2008/0134961 | A1  | 6/2008  | Bao et al. |
| 2017/0108621 | A1  | 4/2017  | Park et al. |
| 2018/0143470 | A1* | 5/2018  | Oh ........................ B81C 1/0046 |
| 2021/0149098 | A1* | 5/2021  | Sasata ................... G02B 5/1833 |
| 2021/0347149 | A1* | 11/2021 | Shibata ................ G02B 5/3016 |
| 2021/0364880 | A1* | 11/2021 | Tan ................... G02F 1/133615 |
| 2022/0128747 | A1* | 4/2022  | Nimura ............. H01L 27/14629 |
| 2022/0214476 | A1* | 7/2022  | Sasata ..................... G02B 5/003 |
| 2022/0214584 | A1* | 7/2022  | Saitoh ...................... G02B 5/30 |
| 2022/0229218 | A1* | 7/2022  | Yonemoto ........... H01L 51/5281 |
| 2022/0236587 | A1* | 7/2022  | Yanai ................... G02B 6/0056 |

OTHER PUBLICATIONS

Annex to Form PCT/ISA/206 Communication Relating to the Results of the Partial International Search, dated May 25, 2021, in International Application No. PCT/US2021/019293, filed on Feb. 23, 2021 (8 pages).
Anonymous, "Single crystal—Wikipedia," Aug. 9, 2019, available online at RUL: https://web.archive.org/web/20190809141325/https://en.wikipedia.org/wiki/Single_crystal, retrieved on Jun. 1, 2021 (4 pages).
Kurlov, V.N., "Sapphire: Properties, Growth, and Applications," Reference Module in Materials Science and Materials Engineering, Oxford: Elsevier, 2016, pp. 1-11 (11 pages).
Cakmakci, O., et al., "Optical design of a thin curved lightguide and manufacturing using ophthalmic approaches," Proceedings of the Society of Photo-Optical Instrumentation Engineers (SPIE), vol. 11062, Digital Optical Technologies 2019, pp. 110620H-1 to 110620H-10 (10 pages).
Kurlov, V.N., et al., "Fabrication of near-net-shaped sapphire domes by noncapillary shaping method," Journal of Crystal Growth, vol. 179, Issues 1-2, 1997, pp. 175-180 (6 pages).
Kratzer, M., et al., "Adsorption and epitaxial growth of small organic semiconductors on hexagonal boron nitride," Journal of Physics D: Applied Physics, vol. 52, No. 38, 383001, 2019 (23 pages).
Yamao, T., et al., "Direct Formation of Thin Single Crystals of Organic Semiconductors onto a Substrate," Chemistry of Materials, vol. 19, Issue 15, 2007, pp. 3748-3753 (6 pages).
Park, Y., et al., "Large-area single-crystal organic patterned thin films by vertically confined lateral crystal growth via capillary force lithography," Applied Surface Science, vol. 494, 2019, pp. 1023-1029 (7 pages).
Soeda, J., et al., "Stable growth of large-area single crystalline thin films from an organic semiconductor/polymer blend solution for high-mobility organic field-effect transistors," Organic Electronics, vol. 39, 2016, pp. 127-132 (6 pages).
Ye, C., et al., "Controlled Directional Crystallization of Oligothiophenes Using Zone Annealing of Preseeded Thin Films," ACS Applied Materials & Interfaces, vol. 7, Issue 41, 2015, pp. 23008-23014 (7 pages).
Choi, H. H., et al., "A large anisotropic enhancement of the charge carrier mobility of flexible organic transistors with strain: a Hall effect and Raman study," Advanced Science, vol. 7, 2020, 1901824 (10 pages).
Weng Y., et al., "Polarization volume grating with high efficiency and large diffraction angle," Optics Express, vol. 24, No. 16, Aug. 8, 2016, pp. 17746-17759 (14 pages).
International Search Report and Written Opinion dated May 25, 2021, issued in International Application No. PCT/US2021/019124, filed on Feb. 22, 2021 (9 pages).
Smith et al., "Oriented crystal growth on amorphous substrates using artificial surface-relief gratings," Applied Physics Letters, 32 (6), Mar. 15, 1978, pp. 349-350 (2 pages).
International Preliminary Report on Patentability for International Application No. PCT/US2021/019124, dated Sep. 9, 2022, 7 pages.
International Preliminary Report on Patentability for International Application No. PCT/US2021/019293, dated Sep. 9, 2022, 13 pages.

* cited by examiner

440
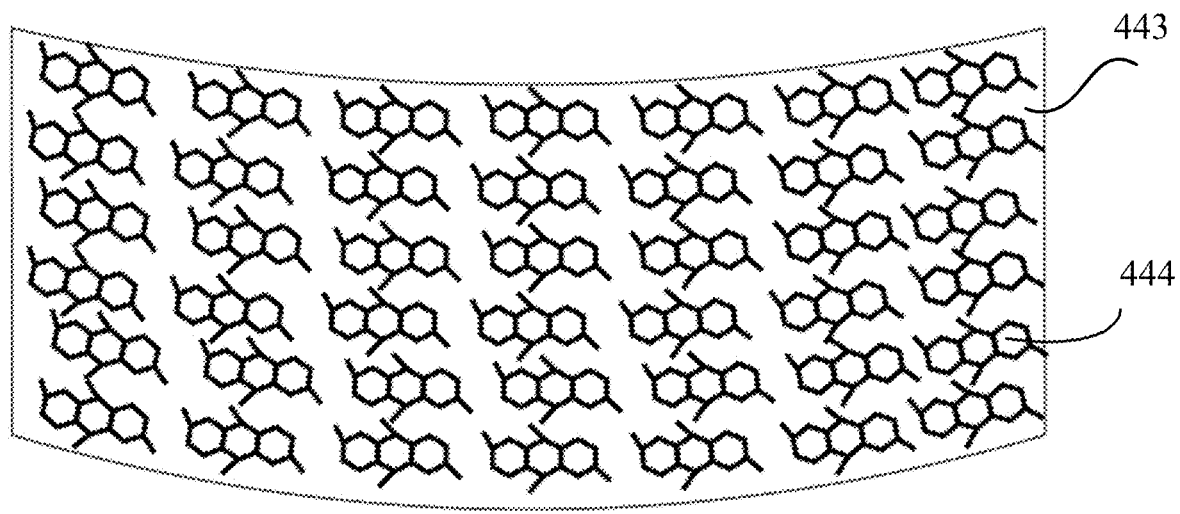
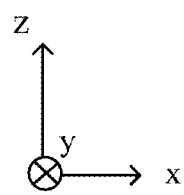
FIG. 4C

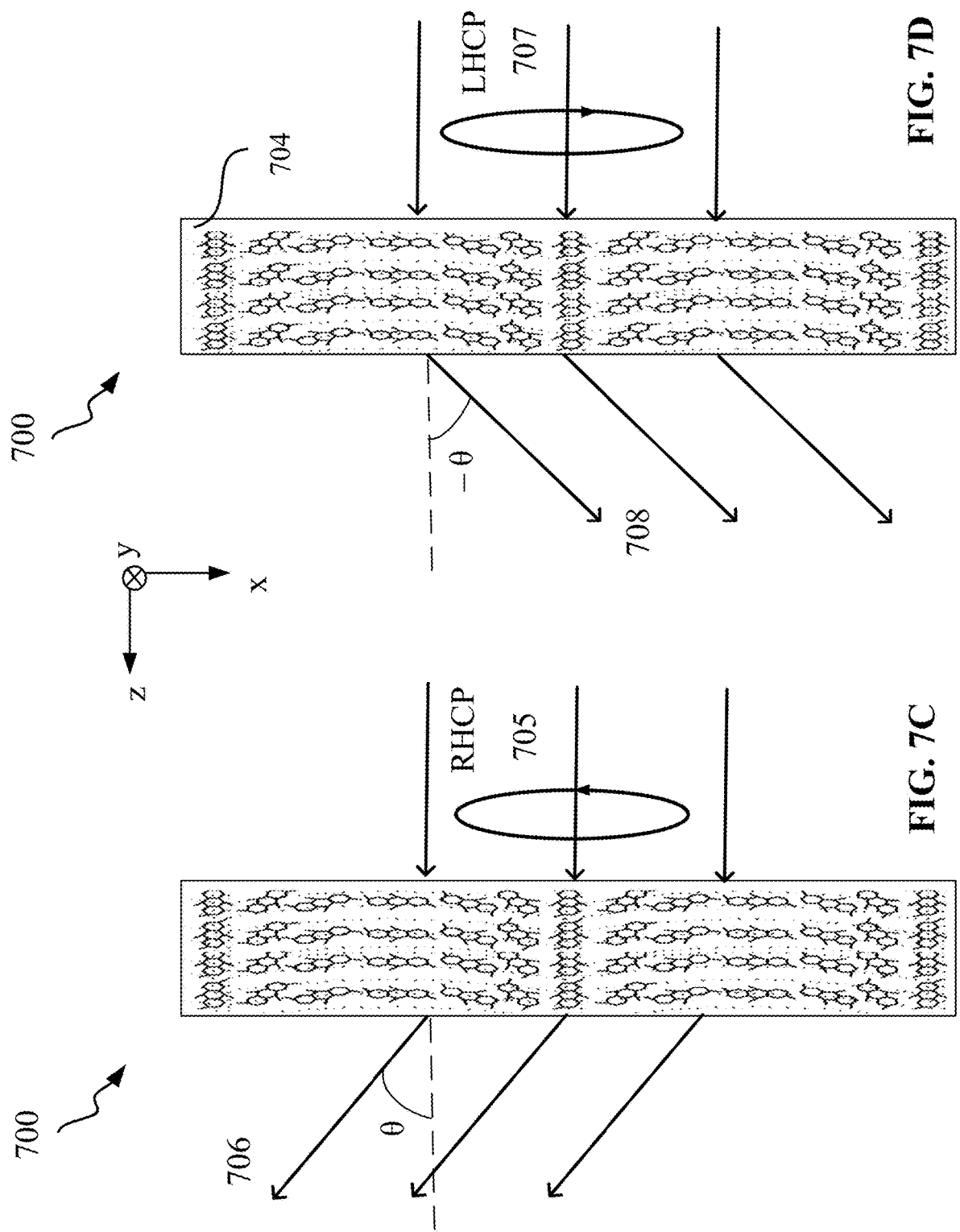

1150

```
┌─────────────────────────────────────────────────────────────┐
│ Move a molten crystal material in a space between two       │
│ substrates while maintaining contact between the molten     │
│ crystal material and two surfaces of the two substrates,    │ ~ 1155
│ wherein each of the two surfaces includes an alignment      │
│ structure disposed in contact with the molten crystal       │
│ material                                                    │
└─────────────────────────────────────────────────────────────┘
                              │
                              ▼
┌─────────────────────────────────────────────────────────────┐
│ Grow, from the molten crystal material using a seed         │
│ crystal, a solid crystal including crystal molecules        │
│ aligned in a predetermined alignment pattern at least       │ ~ 1160
│ partially defined by the alignment structures               │
└─────────────────────────────────────────────────────────────┘
```

```
┌─────────────────────────────────────────────────────────────┐
│ Dispense a mixture of a liquid crystal material and a solid │ ⟵ 2605
│        crystal material on an alignment structure            │
└─────────────────────────────────────────────────────────────┘
                              │
                              ▼
┌─────────────────────────────────────────────────────────────┐
│ At least partially phase separate the liquid crystal        │ ⟵ 2610
│           material and the solid crystal material            │
└─────────────────────────────────────────────────────────────┘
                              │
                              ▼
┌─────────────────────────────────────────────────────────────┐
│ Crystallize the solid crystal material to form a solid      │
│ crystal layer with crystal molecules at least partially     │ ⟵ 2615
│             aligned by the liquid crystal material           │
└─────────────────────────────────────────────────────────────┘
```

FIG. 26

HIGH REFRACTIVE INDEX OPTICAL DEVICE FORMED BASED ON SOLID CRYSTAL AND FABRICATION METHOD THEREOF

CROSS-REFERENCE TO RELATED APPLICATIONS

This application claims the benefit of priority to U.S. Provisional Patent Application No. 62/981,528, filed on Feb. 25, 2020, and U.S. Provisional Patent Application No. 63/063,379, filed on Aug. 9, 2020. The contents of the above-referenced applications are incorporated by reference in their entirety.

TECHNICAL FIELD

The present disclosure relates generally to optical devices and, more specifically, to a high refractive index optical device formed based on a solid crystal and a fabrication method thereof.

BACKGROUND

Visually appealing, light-weight, compact, and power efficient consumer electronic devices are in high demand. Accordingly, it is desirable to design optical elements or devices used in these devices such that these devices can be adaptive, optically efficient, light-weight, compact, and broadband. Technology for fabricating optical devices with enhanced optical performance and physical properties has become an attractive topic for research and development. Liquid crystals ("LCs") have been used to fabricate polarization selective optical elements. Optical characteristics of the polarization selective optical elements may depend on the refractive index and/or birefringence of LCs. For example, an angular and diffraction bandwidth of a polarization selective grating may increase as the birefringence of LCs increases. Currently available LCs may be formulated to achieve a large refractive index of about 1.97 and a large birefringence of about 0.3. Optical elements based on materials having higher refractive index and larger birefringence are highly desirable to reduce the size and weight and to enhance the optical characteristics.

SUMMARY

One aspect of the present disclosure provides an optical element. The optical element includes a solid crystal. The solid crystal includes crystal molecules aligned in a predetermined alignment pattern at least partially defined by an alignment structure.

Another aspect of the present disclosure provides a solid crystal. The solid crystal includes a crystal layer having a crystal orientation varying along at least one in-plane direction, a refractive index in a range of 1.6-2.6, and an optical anisotropy of greater than or equal to 0.1.

Other aspects of the present disclosure can be understood by those skilled in the art in light of the description, the claims, and the drawings of the present disclosure.

BRIEF DESCRIPTION OF THE DRAWINGS

The following drawings are provided for illustrative purposes according to various disclosed embodiments and are not intended to limit the scope of the present disclosure. In the drawings:

FIGS. 4A-4C schematically illustrate cross-sectional views of optical devices, according to various embodiments of the present disclosure;

FIGS. 7C and 7D schematically illustrate diagrams of a positive state and a negative state of the PBP grating shown in FIG. 7B, respectively, according to embodiments of the present disclosure;

FIGS. 11A-11E are flowcharts illustrating methods for fabricating an optical device, according to various embodiments of the present disclosure;

FIGS. 20-28 are flowcharts illustrating methods for fabricating a solid crystal layer with a predetermined alignment pattern (or methods for patterning a solid crystal layer), according to various embodiments of the present disclosure.

DETAILED DESCRIPTION

Figure 1A:
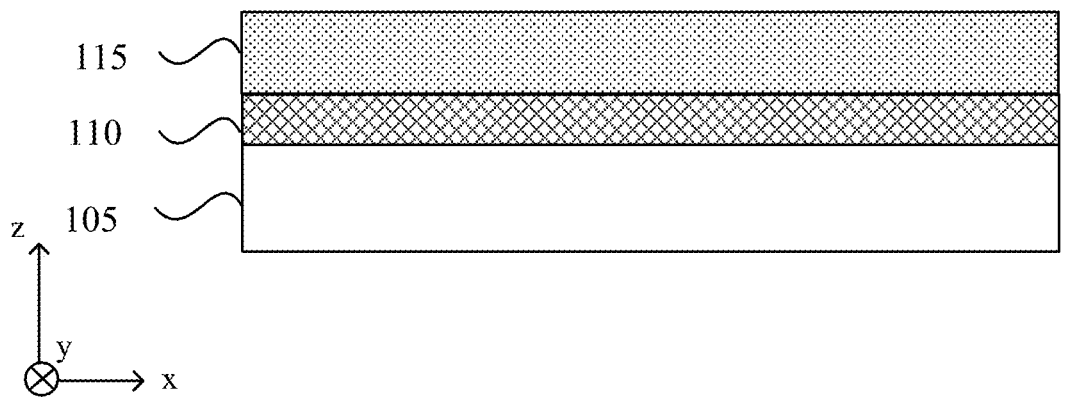
FIGS. 1A and 1B schematically illustrate cross-sectional views of optical devices, according to various embodiments of the present disclosure.

Embodiments consistent with the present disclosure will be described with reference to the accompanying drawings, which are merely examples for illustrative purposes and are not intended to limit the scope of the present disclosure. Wherever possible, the same reference numbers are used throughout the drawings to refer to the same or similar parts, and a detailed description thereof may be omitted.

Further, in the present disclosure, the disclosed embodiments and the features of the disclosed embodiments may be combined. The described embodiments are some but not all of the embodiments of the present disclosure. Based on the disclosed embodiments, persons of ordinary skill in the art may derive other embodiments consistent with the present disclosure. For example, modifications, adaptations, substitutions, additions, or other variations may be made based on the disclosed embodiments. Such variations of the disclosed embodiments are still within the scope of the present disclosure. Accordingly, the present disclosure is not limited to the disclosed embodiments. Instead, the scope of the present disclosure is defined by the appended claims.

As used herein, the terms "couple," "coupled," "coupling," or the like may encompass an optical coupling, a mechanical coupling, an electrical coupling, an electromagnetic coupling, or a combination thereof. An "optical coupling" between two optical devices refers to a configuration in which the two optical devices are arranged in an optical series, and a light output from one optical device may be directly or indirectly received by the other optical device. An optical series refers to optical positioning of a plurality of optical devices in a light path, such that a light output from one optical device may be transmitted, reflected, diffracted, converted, modified, or otherwise processed or manipulated by one or more of other optical devices. In some embodiments, the sequence in which the plurality of optical devices are arranged may or may not affect an overall output of the plurality of optical devices. A coupling may be a direct coupling or an indirect coupling (e.g., coupling through an intermediate element).

The phrase "at least one of A or B" may encompass all combinations of A and B, such as A only, B only, or A and B. Likewise, the phrase "at least one of A, B, or C" may encompass all combinations of A, B, and C, such as A only, B only, C only, A and B, A and C, B and C, or A and B and C. The phrase "A and/or B" has a meaning similar to that of the phrase "at least one of A or B." For example, the phrase "A and/or B" may encompass all combinations of A and B, such as A only, B only, or A and B. Likewise, the phrase "A, B, and/or C" has a meaning similar to that of the phrase "at least one of A, B, or C." For example, the phrase "A, B, and/or C" may encompass all combinations of A, B, and C, such as A only, B only, C only, A and B, A and C, B and C, or A and B and C.

When a first element is described as "attached," "provided," "formed," "affixed," "mounted," "secured," "connected," "bonded," "recorded," or "disposed," to, on, at, or at least partially in a second element, the first element may be "attached," "provided," "formed," "affixed," "mounted," "secured," "connected," "bonded," "recorded," or "disposed," to, on, at, or at least partially in the second element using any suitable mechanical or non-mechanical manner, such as depositing, coating, etching, bonding, gluing, screwing, press-fitting, snap-fitting, clamping, etc. In addition, the first element may be in direct contact with the second element, or there may be an intermediate element between the first element and the second element. The first element may be disposed at any suitable side of the second element, such as left, right, front, back, top, or bottom.

When the first element is shown or described as being disposed or arranged "on" the second element, term "on" is merely used to indicate an example relative orientation between the first element and the second element. The description may be based on a reference coordinate system shown in a figure, or may be based on a current view or example configuration shown in a figure. For example, when a view shown in a figure is described, the first element may be described as being disposed "on" the second element. It is understood that the term "on" may not necessarily imply that the first element is over the second element in the vertical, gravitational direction. For example, when the assembly of the first element and the second element is turned 180 degrees, the first element may be "under" the second element (or the second element may be "on" the first element). Thus, it is understood that when a figure shows that the first element is "on" the second element, the configuration is merely an illustrative example. The first element may be disposed or arranged at any suitable orientation relative to the second element (e.g., over or above the second element, below or under the second element, left to the second element, right to the second element, behind the second element, in front of the second element, etc.).

When the first element is described as being disposed "on" the second element, the first element may be directly or indirectly disposed on the second element. The first element being directly disposed on the second element indicates that no additional element is disposed between the first element and the second element. The first element being indirectly disposed on the second element indicates that one or more additional elements are disposed between the first element and the second element.

The wavelength ranges, spectra, or bands mentioned in the present disclosure are for illustrative purposes. The disclosed optical device, system, element, assembly, and method may be applied to a visible wavelength range, as well as other wavelength ranges, such as an ultraviolet ("UV") wavelength range, an infrared ("IR") wavelength range, or a combination thereof.

The term "film" and "layer" may include rigid or flexible, self-supporting or free-standing film, coating, or layer, which may be disposed on a supporting substrate or between substrates. The phrases "in-plane direction," "in-plane orientation," "in-plane rotation," "in-plane alignment pattern," and "in-plane pitch" refer to a direction, an orientation, a rotation, an alignment pattern, and a pitch in a plane of a film or a layer (e.g., a surface plane of the film or layer, or a plane parallel to the surface plane of the film or layer), respectively. The term "out-of-plane direction" indicates a direction that is non-parallel to the plane of the film or layer (e.g., perpendicular to the surface plane of the film or layer, e.g., perpendicular to a plane parallel to the surface plane). For example, when an "in-plane" direction refers to a direction within a surface plane, an "out-of-plane" direction may refer to a thickness direction perpendicular to the surface plane, or a direction that is not parallel with the surface plane.

Optical devices, such as lenses, waveplates, gratings, waveguides, etc., have been widely used in optical systems. For example, such optical devices have been implemented in near-eye displays ("NEDs") for augmented reality ("AR"), virtual reality ("VR"), and/or mixed reality ("MR") applications. For example, optical waveguides have been used in NEDs to overlay virtual and real worlds. When a waveguide functions as a combiner to overlay virtual and real world images, e.g., for AR applications, the waveguide may also be referred to as a waveguide combiner. A waveguide display system may include a light source assembly configured to emit image lights, and a waveguide configured to guide the image lights to an eye of a user. The image lights from the light source assembly (e.g., a virtual image projector) may be coupled into the waveguide, and relayed to the eye via total internal reflection ("TIR") within the waveguide. The image lights emitted from the light source assembly may include a plurality of different colors (e.g., red, green, and blue). In some embodiments, multiple waveguides that share a spectral band may be used to efficiently deliver the image lights of different colors to the eye, which may increase the number and the weight of the optical elements (and hence, the size and weight of the waveguide display system). Further, the field of view ("FOV") of the virtual world may depend on the refractive index of the material of the waveguide. The FOV provided by the waveguide may increase as the refractive index of the material of the waveguide increases.

In addition, polarization selective optical devices have been used in NEDs as in-coupling elements (e.g., gratings) for the waveguide combiners, accommodation elements in a varifocal and/or multifocal block, and/or eye-tracking components in an eye-tracking system, etc. Liquid crystals ("LCs") have been used to fabricate polarization selective optical devices. Optical characteristics of the polarization selective optical devices may depend on the refractive index and/or birefringence of LCs. For example, an angular and diffraction bandwidth of a polarization selective LC grating may increase as the birefringence of LCs increases. Currently available LCs may be formulated to achieve a refractive index up to about 1.97 and a birefringence up to about 0.3. Optical waveguides and polarization selective optical devices based on materials having a higher refractive index and a larger birefringence are highly desirable to reduce the size and weight of the NEDs, and to enhance the optical characteristics, as well as to realize futuristic smart NEDs.

The present disclosure provides an optical device including a solid crystal (or a solid crystal material) in a form of a solid crystal film or layer. The solid crystal may be a single crystal or a polycrystal. The solid crystal material may include an organic material, an inorganic material, or a combination thereof. For example, the solid crystal may include an organic and crystalline material, an organic and non-crystalline material, an organic and amorphous material, an organic and semi-crystalline and semi-amorphous material, an inorganic and crystalline material, an inorganic and non-crystalline material, an inorganic and amorphous material, an inorganic and semi-crystalline and semi-amorphous material, an organic and semi-crystalline and semi-non-crystalline material, an inorganic and semi-crystalline and semi-non-crystalline material, or a combination thereof. For discussion purposes, a solid organic crystal material may be used as an example of the solid crystal material. For convenience of discussion, solid crystal molecules included in the solid crystal material may also be referred to as organic molecules or crystal molecules. It is understood that the technical solutions disclosed herein is not limited to organic crystal materials.

As used herein, an "axis" of a crystal (or solid crystal) may refer to an axis of the solid crystal along which the solid crystal has the highest or largest refractive index. An "axis" of a crystal molecule included in the solid crystal may refer to an axis of the crystal molecule along which the crystal molecule may have the highest or largest refractive index. The axis of the crystal may be an aggregated effect of the axes of the crystal molecules included in the crystal. Local orientations of axes of the crystal molecules included in the solid crystal (and hence the orientation of the axis of the solid crystal) may be configured, such that the solid crystal may provide at least one predetermined optical function for the optical device that includes the solid crystal. The orientation of the axis of the solid crystal may be an aggregated effect of the orientations of the axes of crystal molecules in the solid crystal. The above definitions of the axis of the solid crystal and the axis of the crystal molecules are for the convenience of discussion. The orientation of the axis of the solid crystal may also be referred to as a crystal orientation of the solid crystal. The orientations associated with the solid crystal and the crystal molecules are not limited to be defined by the axes along which the refractive index is the highest. Other suitable axes (e.g., axes along which the refractive index is the smallest, or axes perpendicular to the axes along which the refractive index is the highest) may be used as a configurable object for the discussion of the orientation of the solid crystal and the orientations of the crystal molecules, or for the discussion of the alignment pattern associated with the solid crystal or the crystal molecules.

In some embodiments, the orientation of the axis of the solid crystal may be configured by aligning the crystal molecules (e.g., aligning the orientations of the axes of the crystal molecules) in a predetermined alignment pattern. In some embodiments, the predetermined alignment pattern may refer to a non-natural alignment pattern of the crystal molecules in the solid crystal. For example, the predetermined alignment pattern may be at least partially configured at a substrate on which the crystal molecules are disposed, or may be configured within the solid crystal through a special mechanism (e.g., etching), or may be configured in a separate material which is disposed on a substrate. The predetermined alignment pattern of the crystal molecules may be specifically designed, configured, or introduced for the purpose of realizing at least one predetermined optical function of the optical element. The predetermined alignment pattern may be a one-dimensional pattern (e.g., crystal molecules may be aligned in a same, single direction), a two-dimensional pattern (e.g., crystal molecules may be aligned in predetermined directions in a two-dimensional plane), or a three-dimensional pattern (e.g., crystal molecules may be aligned in a three-dimensional directions).

In some embodiments, the predetermined alignment pattern of the crystal molecules of the solid crystal may be at least partially configured, set, or defined by an alignment structure. In some embodiments, the alignment structure may be an alignment film or layer formed, etched, disposed, or otherwise provided at a surface of a substrate, on which the crystal molecules of the solid crystal are disposed. In some embodiments, the alignment structure may be formed in a separate material and disposed on the surface of the substrate. In some embodiments, the alignment structure may be formed directly (e.g., etched directly) at (e.g., on or at least partially in) the surface of the substrate. In some embodiments, the alignment structure may be directly formed within the solid crystal (e.g., the solid crystal layer) through a special mechanism. The alignment structure may be a structural property inside the solid crystal. For example, the alignment pattern may be formed during a crystallization process of the solid crystal occurring in a presence of a magnetic field or an electric field that may be configured to affect the alignment of the grown solid crystal. In some embodiments, the alignment structure may be integrally formed at a surface of the solid crystal during the crystallization process.

In some embodiments, the optical device may include an alignment structure configured to at least partially align the crystal molecules in the predetermined alignment pattern. The alignment structure may include or define an alignment structure pattern. In some embodiments, the alignment structure pattern may be substantially the same as the predetermined alignment pattern of the crystal molecules. For example, different layers of crystal molecules included in the solid crystal may be disposed over the alignment structure. A first plurality of crystal molecules that are in contact with the alignment structure may be aligned by the alignment structure in the alignment structure pattern. In some embodiments, a second plurality of crystal molecules stacked over the first plurality of crystal molecules in the solid crystal may be aligned in the same pattern as the corresponding first plurality of crystal molecules. In such a configuration, crystal molecules in the solid crystal may be aligned substantially in the alignment structure pattern, and the alignment structure pattern may be substantially the same as the predetermined alignment pattern of the crystal molecules.

In some embodiments, the first plurality of crystal molecules that are in contact with the alignment structure may be aligned by the alignment structure in the alignment structure pattern. The second plurality of crystal molecules disposed over (e.g., stacked over) the first plurality of crystal molecules may not be aligned in the same pattern as the corresponding first plurality of crystal molecules (e.g., the second plurality of crystal molecules may be aligned in a pattern different from the alignment structure pattern). Instead, the second plurality of crystal molecules may be rotated by one or more predetermined rotation angles based on the alignment structure pattern relative to the corresponding first plurality of crystal molecules (e.g., the second plurality of crystal molecules may include a twist introduced through chiral dopants added to the solid crystal). The one or more predetermined rotation angles may be at least one of an in-plane rotation angle or an out-of-plane rotation angle. The predetermined alignment pattern of the crystal molecules may be a result of a combination of the alignment structure pattern in which the first plurality of crystal molecules are aligned, and the twisting (or rotation) alignment pattern associated with the second plurality of crystal molecules stacked over the first plurality of crystal molecules. In such a configuration, the alignment structure pattern of the alignment structure may be different from the predetermined alignment pattern of the crystal molecules. The alignment structure may at least partially align the crystal molecules in the predetermined alignment pattern.

For example, the alignment structure may align the crystal molecules that are in contact with the alignment structure (e.g., first plurality of molecules) in the alignment structure pattern. The remaining (e.g., second plurality of) crystal molecules included in the solid crystal that are disposed over (e.g., stacked over) the first plurality of crystal molecules may be aligned relative to the corresponding neighboring first plurality of crystal molecules that have been aligned by the alignment structure. In some embodiments, the remaining crystal molecules may follow the same alignment of the first plurality of crystal molecules. For example, orientations of axes of the remaining crystal molecules may follow orientations of axes of corresponding first plurality of crystal molecules. In some embodiments, at least a portion of the remaining crystal molecules may have orientations of axes rotated by one or more predetermined rotation angles relative to the orientations of axes of the corresponding first plurality of crystal molecules.

In some embodiments, the alignment structure may refer to a structure (such as a layer, a film, or physical features) configured to define or set the orientations of the axes of the crystal molecules (e.g., a direction of growth of a solid crystal material that is grown on the alignment structure). In some embodiments, the alignment structure may be thin, such as a few molecules thick. The layer, film, or physical features of the alignment structure may interact with molecules of the solid crystal material (e.g., solid crystal molecules) to be grown via mechanical, dipole-dipole, magnetic mechanisms, or any other suitable mechanisms. For example, the alignment structure may be similar to those that have been used in LC devices (e.g., LC displays) for aligning orientations of the nematic LC molecules.

In some embodiments, the crystal molecules may be aligned substantially uniformly over the alignment structure. That is, orientations of axes of the crystal molecules may be substantially uniformly aligned, resulting in a spatially non-varying (e.g., constant) orientation of the axis of the solid crystal. In some embodiments, the crystal molecules may be aligned non-uniformly over the alignment structure. For example, the orientations of the axes of the crystal molecules may spatially vary within the solid crystal, resulting in a spatially varying orientation of the axis of the solid crystal. With different orientations of the axis of the solid crystal, which may be configured by different predetermined alignment patterns of the crystal molecules, the optical device may exhibit different optical functions. For example, the optical device may function as a waveguide, a grating, a prism, a lens, an axicon, an optical rotator, a waveplate or a phase retarder, a lens array, a prism array, etc., depending on the predetermined alignment patterns of the crystal molecules.

The solid crystal may be in a form of a layer, a film, a plate, or a stack of layers, films, or plates. The solid crystal may have a high refractive index. As a result, the solid crystal may be made thin and light weight. For example, the solid crystal may have a thickness of about 500 nanometer ("nm") to about 5 micrometer ("µm"). Accordingly, the optical device including the solid crystal may be made thin, light weight, and compact. Solid crystal materials have been used to fabricate semiconductor elements or devices with limited small sizes. For example, conventional semiconductor elements or devices fabricated using solid original crystal materials may have a size of about 10 millimeter ("mm") by 10 mm or less. The technical solution disclosed in the present disclosure enables fabrication of solid crystals having a large size. For example, by forming (e.g., growing) a solid crystal using an alignment structure, the solid crystal may be fabricated to have one or more lateral dimensions of about 30-100 mm or greater. Solid crystals having large sizes may widen the applications of the optical device in a wide variety of technical fields.

FIG. 1A schematically illustrates an x-z sectional view of an optical element or device 100, according to an embodiment of the present disclosure. As shown in FIG. 1A, the optical device 100 may include a solid crystal 115 in a form of a film (a layer, or a plate). Although the body of the solid crystal 115 is shown as flat for illustrative purposes, the body of the solid crystal 115 may have a curved shape. In the present disclosure, for discussion purposes, a solid crystal may also be referred to as a solid crystal film (or a solid crystal layer). The solid crystal 115 may include a solid crystal material having a plurality of crystal molecules.

In some embodiments, the optical device 100 may also include an alignment structure 110 configured to at least partially define or set an orientation of an axis of the solid crystal 115 or a predetermined alignment pattern for aligning the crystal molecules included in the solid crystal 115. For discussion purposes, the axis of the solid crystal 115 may refer to an axis along which the solid crystal 115 may have a highest or largest refractive index. An axis of a crystal molecule in the solid crystal 115 may refer to as an axis along which the crystal molecule may have a highest or largest refractive index. The orientation of the axis of the solid crystal 115 may be an aggregated effect of the orientations of the axes of the crystal molecules included in the solid crystal 115. The solid crystal 115 may be disposed on the alignment structure 110. In some embodiments, the solid crystal 115 may be grown on the alignment structure 110. In some embodiments, the alignment structure 110 may be omitted. For example, the predetermined alignment pattern may be introduced inside the solid crystal 115 through crystallization in the presence of a ferroelectric or ferromagnetic material and a ferroelectric or ferromagnetic field.

In some embodiments, the optical device 100 may also include a substrate 105 configured to provide support and/or protection to various layers, films, and/or structures disposed at the substrate 105 (e.g., on the substrate 105). The alignment structure 110 may be disposed at the substrate. In some embodiments, the alignment structure 110 may be an integral part of the substrate 105. For example, the alignment structure 110 may be etched on or at least partially in a surface of the substrate 105. In some embodiments, the alignment structure 110 may be integrally formed inside the substrate 105. In some embodiments, the alignment structure 110 may be separately formed (e.g., deposited) onto the surface of the substrate 105.

In some embodiments, the substrate 105 may be compatible with (e.g., lattice constant-matched) the crystal molecules included in the solid crystal 115. In some embodiments, the substrate 105 may be optically transparent (e.g., having a light transmittance of at least about 60%) at least in a visible spectrum (e.g., wavelength ranging from about 380 nm to about 700 nm). In some embodiments, the substrate 105 may also be transparent in at least a portion of the infrared ("IR") spectrum (e.g., wavelength ranging from about 700 nm to about 1 mm). The substrate 105 may include a suitable material that is substantially transparent to lights of the above-listed wavelength ranges, such as, a glass, a plastic, a sapphire, a polymer, a semiconductor, or a combination thereof, etc. The substrate 105 may be rigid, semi-rigid, flexible, or semi-flexible. In some embodiments, the substrate 105 may have one or more surfaces in a flat, a convex, a concave, an asphere, or a freeform shape.

In some embodiments, the substrate 105 may be a part of another optical element or device, or a part of another opto-electrical element or device. For example, the substrate 105 may be a solid optical lens or a part of a solid optical lens. In some embodiments, the substrate 105 may be a part of a functional device, such as a display screen. In some embodiments, the substrate 105 may be used to fabricate, store, or transport the optical device 100. In some embodiments, the substrate 105 may be detachable or removable from the rest of the optical device 100 after the rest of the optical device 100 is fabricated or transported to another place or device. That is, the substrate 105 may be used in fabrication, transportation, and/or storage to support the solid crystal 115 provided on the substrate 105, and may be separated or removed from the solid crystal 115 of the optical device 100 when the fabrication of the optical device 100 is completed, or when the optical device 100 is to be implemented in another optical device or in an optical system.

In some embodiments, the solid crystal 115 may fabricated based on one or more solid crystal materials, such as anthracene, tetracene, pentacene or any other saturated or unsaturated polycyclic hydrocarbons and their derivatives; nitrogen, sulfur and oxygen heterocycles; quinolines, benzothiophenes, and benzopyrans; bent and asymmetric acenes such as phenanthrene, phenanthroline, pyrene, and fluoranthene and their derivatives; 2,6-naphthalene dicarboxylic acid, 2,6-dimethyl carboxylic ester molecules and their derivatives; biphenyl, terphenyl, quaterphenyl, or phenylacetylene, or their derivatives including substitutes with alkyl groups, cyano groups, isothiocyanate groups, fluorine, chlorine or fluorinated ether; polycyclic aromatic hydrocarbons, such as naphthalene, anthracene, tetracene, pentacene, pyrene, polycene, fluoranthene, benzophenone, benzochromene, benzil, benzimidazole, benzene, hexachlorobenzene, nitropyridine-N-oxide, benzene-1,4-dicarboxylic acid, diphenylacetylene, N-(4-nitrophenyl)-(s)-prolinal, 4,5-dicyanoimidazole, benzodithiophene, cyanopyridine, thienothiophene, stilbene, azobenzene, or their derivatives. In some embodiments, the solid crystal 115 may include chiral crystal molecules or crystal molecules doped with chiral dopants, and the solid crystal 115 may exhibit chirality, i.e., handedness.

In some embodiments, the solid crystal material may include at least one of the following molecules, each of which may include a ring structure (or a ring structure system) and two terminal groups (or terminal group systems). In some embodiments, the ring structure may include one or more saturated cyclic groups, such as cyclohexane, cyclopentane, tetrahydropyran, piperidine, tetrahydrofuran, pyrrolidine, tetrahydrothiophene, or their derivatives. In some embodiments, the ring structure may include one or more unsaturated aromatic groups, such as benzene, naphthalene, anthracene, thiophene, bi-phenyl, tolane, benzimidazole, diphenylacetylene, cyanopyridine, thienothiophene, dibenzothiophene, carbazole, silafluorene, or their derivatives. The terminal group may include one or more C1-C10 akyle, alkoxy, alkenyl groups, —CN, —NCS, —SCN, —SF5, —Br, —Cl, —F, —OCF3, —CF3, mono- or polyfluorinated C1-C10 alkyl or alkoxy group.

In some embodiments, the solid crystal material may include crystalline polymers. Precursors of the crystalline polymers may include aromatic hydrocarbon or heteroarene groups, and their derivatives. Examples of the crystalline polymers may include polyethylene naphthalate, poly (vinyl phenyl sulfide), poly(a-methylstyrene, polythienothiophene, polythiophene, poly(n-vinylphtalimide), parylene, polysulfide, polysulfone, poly(bromophenyl), poly(vinlynaphtalene), or liquid crystal polymers with precursors with functional groups. In some embodiments, precursors of the liquid crystal polymers may include aliphatic, hetroaliphatic, aromatic hydrocarbon, or heteroarene groups.

In some embodiments, the solid crystal material may include amorphous polymers with aliphatic, hetroaliphatic, aromatic hydrocarbon or heteroarene groups (e.g. polystyrene) as binder. In some embodiments, the solid crystal material may also include additives, such as fatty acid, lipids, plasticizer, or surfactant (e.g. molecules with mono- or polyfluorinated alkyl or alkoxy group).

Figure 19A:
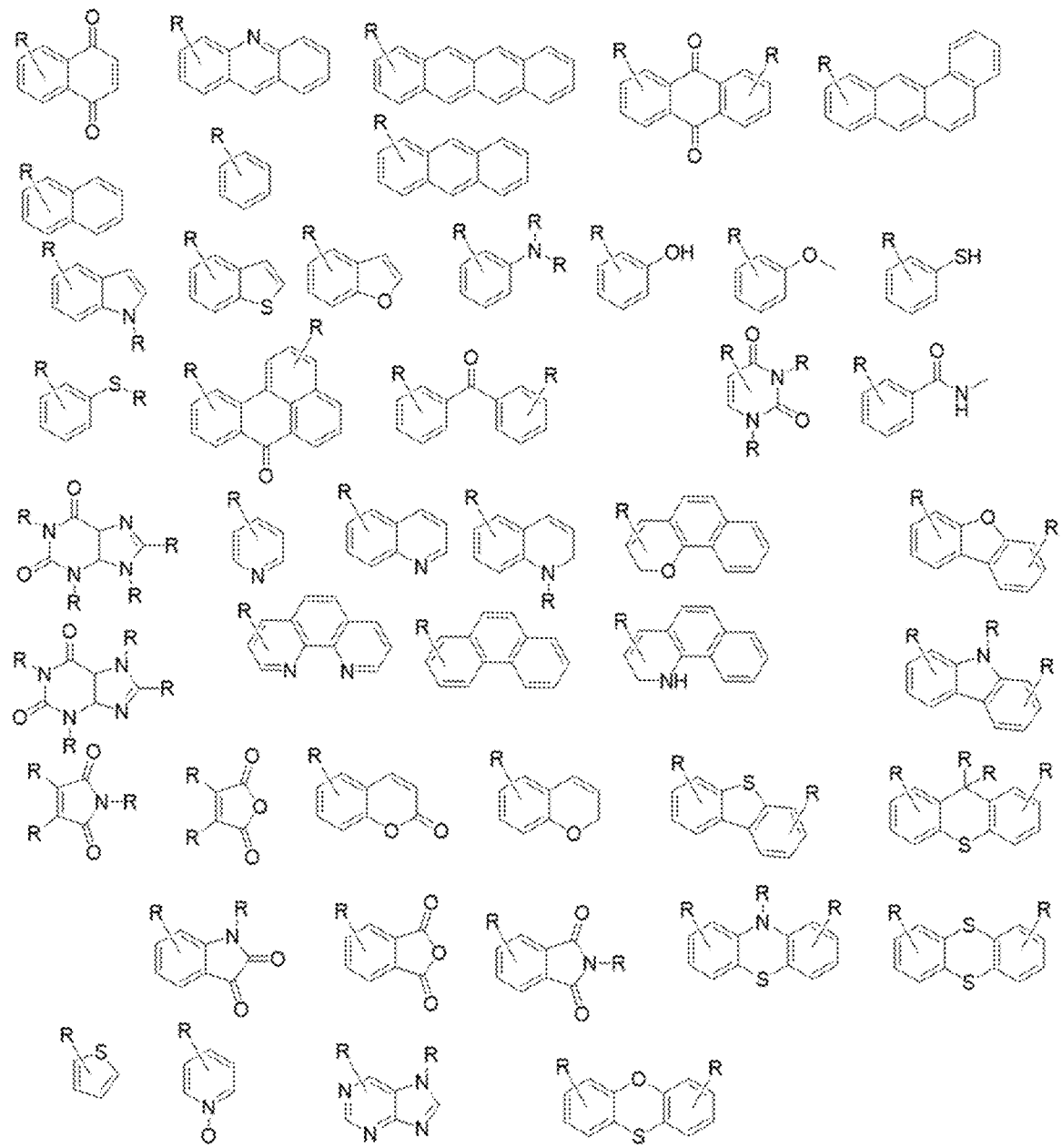
FIGS. 19A-19J illustrate example chemical structures of various molecules that may be included in a solid crystal material, according to various embodiments of the present disclosure.
Figure 19B:
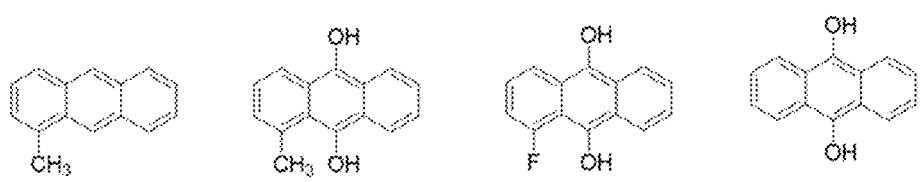

FIG. 19A illustrates example chemical structures of various molecules that may be included in the solid crystal material. In the chemical structures, R is a functional group, which may be any one or any combination of $CH_3$, H, OH, OMe, OEt, OiPr, F, Cl, Br, I, Ph, $NO_2$, $SO_3$, $SO_2Me$, iPr, Pr, t-Bu, sec-Bu, Et, acetyl, SH, SMe, carboxyl, aldehyde, amide, nitrile, ester, $SO_2NH_3$, $NH_2$, $NMe_2$, NMeH, or $C_2H_2$. For example, when a chemical formula includes two or more Rs, all of the Rs may be different, all of the Rs may be the same, at least two Rs may be different, or at least two Rs may be the same. FIG. 19B illustrates example chemical structures of molecules that include one or a combination of the functional groups R listed above and shown in FIG. 19A.

Figure 19C:
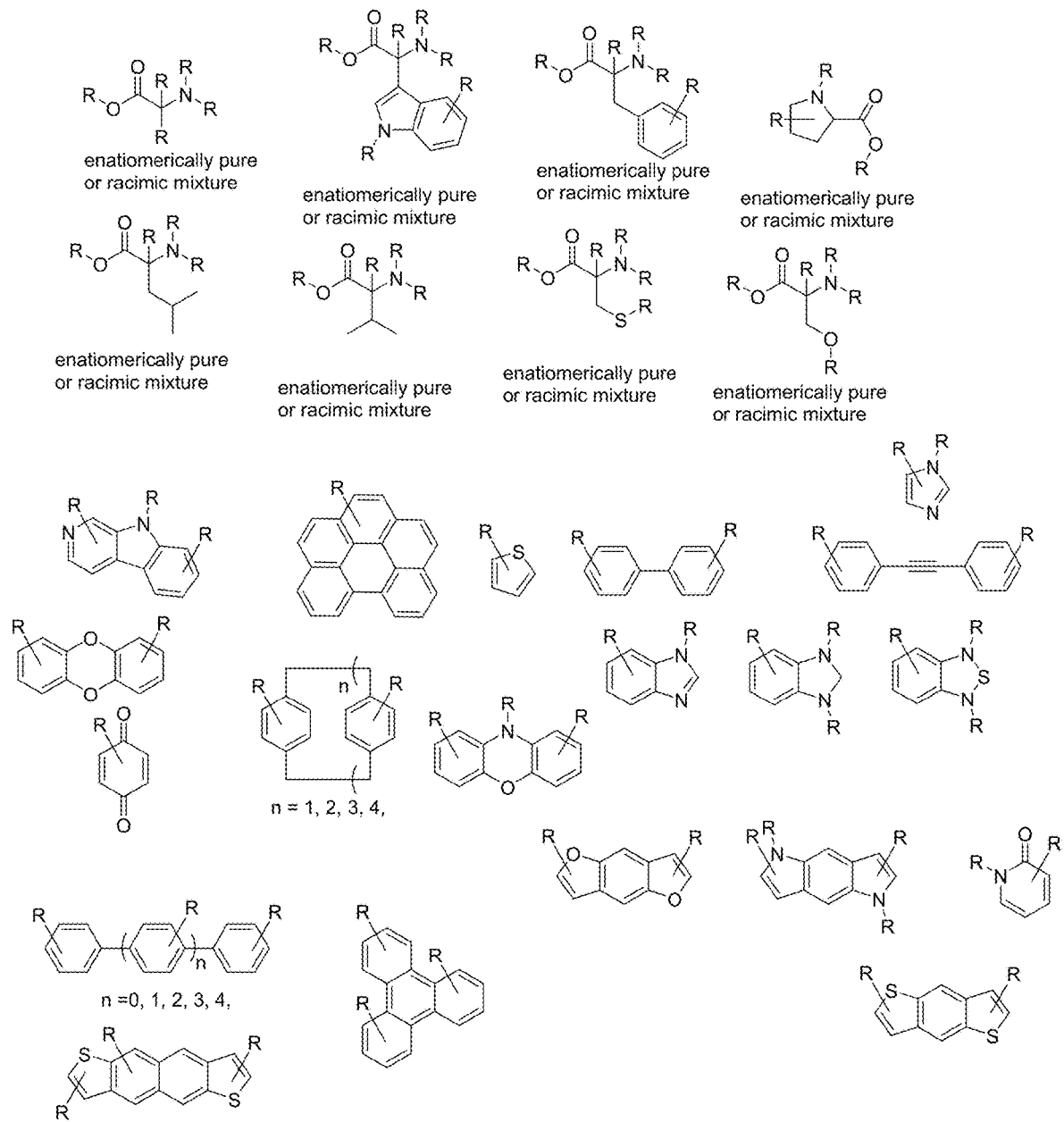

In some embodiments, the solid crystal material may include Amino acids. FIG. 19C illustrates chemical structures of various Amino acids that may be included in the solid crystal material. The functional group R may be any of $CH_3$, H, OH, OMe, OEt, OiPr, F, Cl, Br, I, Ph, $NO_2$, $SO_3$, $SO_2Me$, iPr, Pr, t-Bu, sec-Bu, Et, acetyl, SH, SMe, carboxyl, aldehyde, amide, nitrile, ester, $SO_2NH_3$, $NH_2$, $NMe_2$, NMeH, or $C_2H_2$. In addition, in some embodiments, the molecules shown in FIG. 19C may include any one or any combination of the listed functional groups R.

Figure 19D:
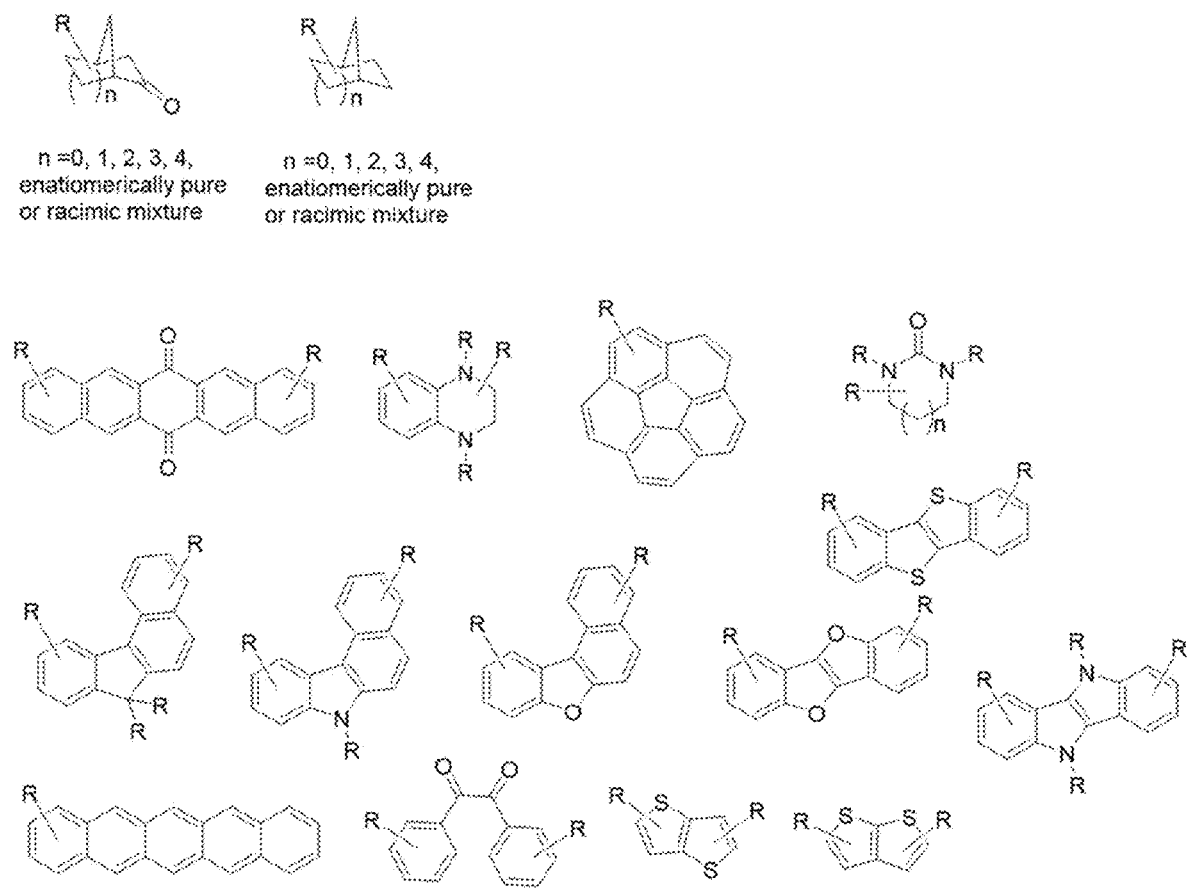

FIG. 19D illustrates example chemical structures of molecules that may be included in the solid crystal material. In some embodiments, a molecule may include one or a combination of the above functional groups R, i.e., any one or any combination of $CH_3$, H, OH, OMe, OEt, OiPr, F, Cl, Br, I, Ph, $NO_2$, $SO_3$, $SO_2Me$, iPr, Pr, t-Bu, sec-Bu, Et, acetyl, SH, SMe, carboxyl, aldehyde, amide, nitrile, ester, $SO_2NH_3$, $NH_2$, $NMe_2$, NMeH, or $C_2H_2$.

Figure 19E:
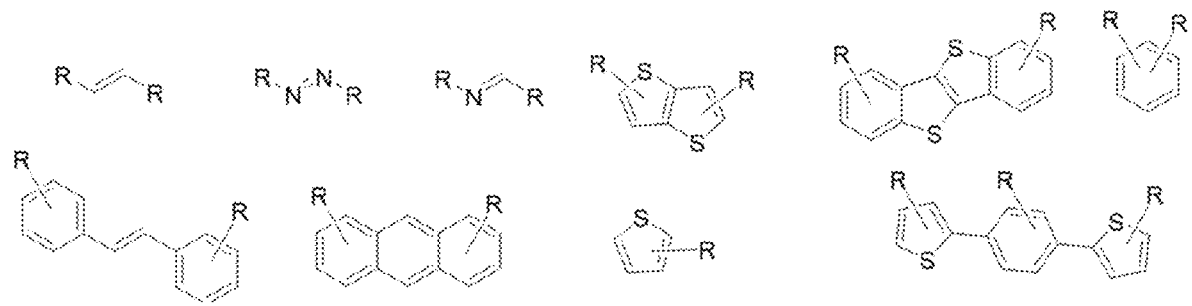
Figure 19F:
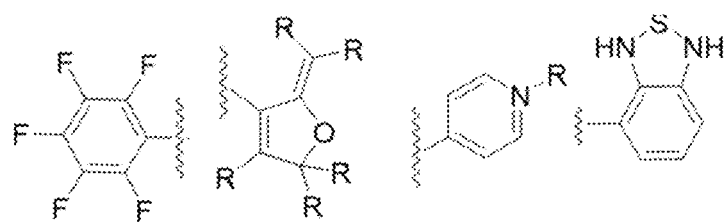
Figure 19G:
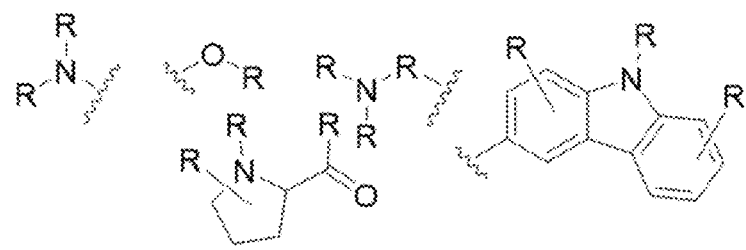

In some embodiments, the molecules that may be included in the solid crystal material may have a donor-bridge-acceptor molecular motif, a donor-bridge-donor molecular motif, or an acceptor-bridge-acceptor molecular motif. FIG. 19E illustrates example bridge functional groups that may be included in the molecules. FIG. 19F illustrates example electron withdrawing groups (acceptor groups) that may be included in the molecules. FIG. 19G illustrates example electron donating groups (donor groups) that may be included in the molecules. In some embodiments, a molecule may include one or a combination of the above functional groups R, e.g., any one or any combination of $CH_3$, H, OH, OMe, OEt, OiPr, F, Cl, Br, I, Ph, $NO_2$, $SO_3$, $SO_2Me$, iPr, Pr, t-Bu, sec-Bu, Et, acetyl, SH, SMe, carboxyl, aldehyde, amide, nitrile, ester, $SO_2NH_3$, $NH_2$, $NMe_2$, NMeH, or $C_2H_2$.

Figure 19H:
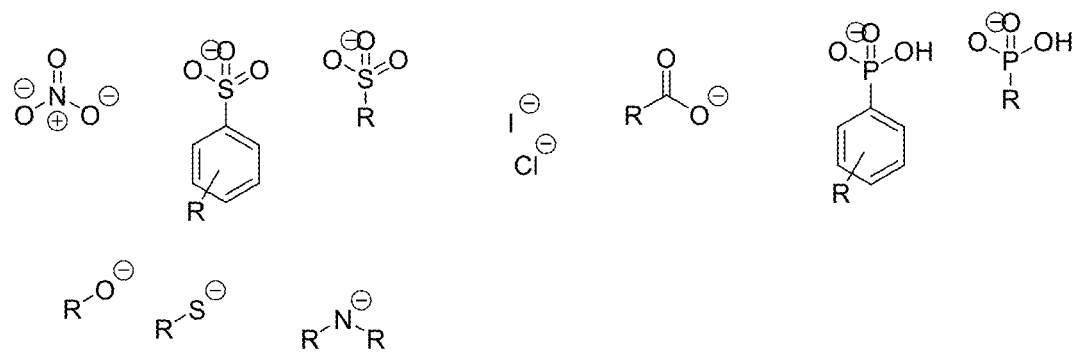
Figure 19I:
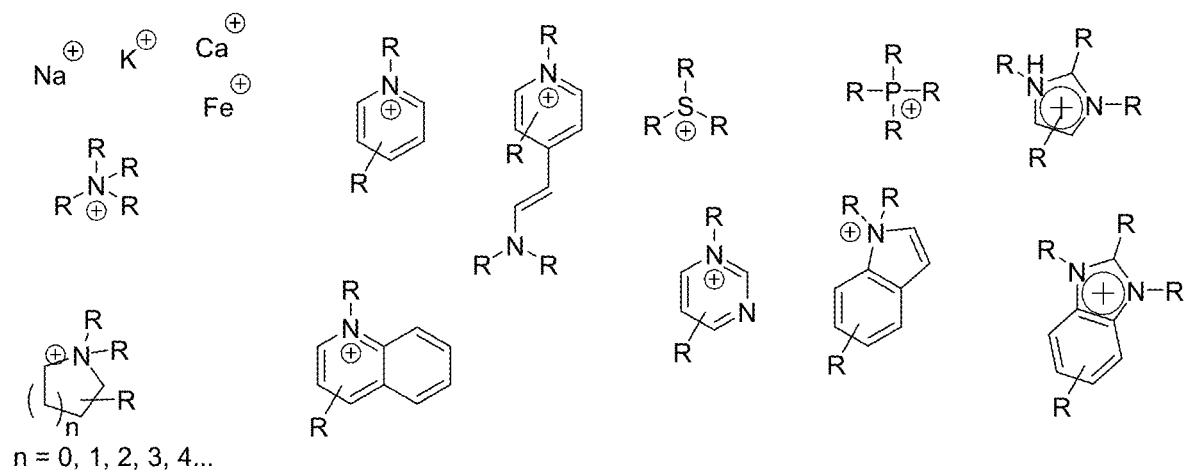
Figure 19J:
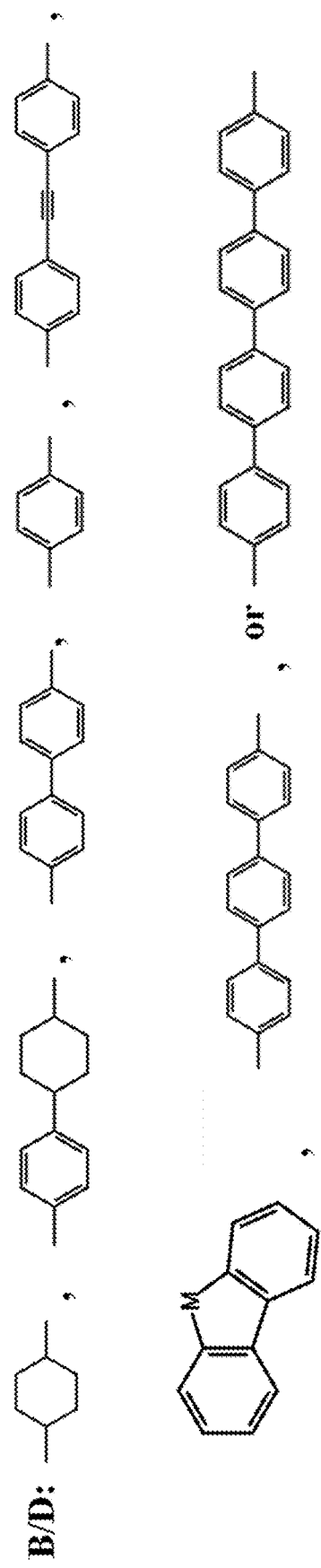

In some embodiments, the solid crystal material may include organo-salts, a mix of anionic and cationic molecules with at least one organic based component. FIG. 19H illustrates example chemical structures of anionic molecules that may be included in the solid crystal material. FIG. 19I illustrates example chemical structures of cationic molecules. The functional group R may be any one or any combination of $CH_3$, H, OH, OMe, OEt, OiPr, F, Cl, Br, I, Ph, $NO_2$, $SO_3$, $SO_2Me$, iPr, Pr, t-Bu, sec-Bu, Et, acetyl, SH, SMe, carboxyl, aldehyde, amide, nitrile, ester, $SO_2NH_3$, $NH_2$, $NMe_2$, NMeH, or $C_2H_2$. In some embodiments, the functional group R may also include a mix of electron donating and electron withdrawing functions shown in FIG. 19F and FIG. 19G. FIG. 19J illustrates example chemical structures of molecules of materials with a solid crystal phase and/or a liquid crystal phase. The chemical structures of molecules of materials with a solid crystal phase and/or a liquid crystal phase may have a structural formula of A-B-C-D-E. Examples of the "A," "B," "C," "D," and "E" elements are shown in FIG. 19J.

The solid crystal 115 may be a continuous solid crystal film, where neighboring crystal lattices may be contiguously connected to each other across the entire optical device 100. In some embodiments, the solid crystal 115 may be optically anisotropic, for example, uniaxially or biaxially optically anisotropic. In some embodiments, the solid crystal 115 may be configured to have a spatially varying or a spatially uniform optical anisotropy within the continuous solid crystal 115, which may be at least partially defined, configured, or set by the alignment structure 110. In some embodiments, the spatially varying or the spatially uniform optical anisotropy may be generated based on spatially varying or spatially uniform orientations of the axes of the molecules included in the solid crystal 115.

In some embodiments, the solid crystal 115 may have a first principal refractive index along a first direction, and a second principal refractive index along an in-plane direction perpendicular to the first direction. In some embodiments, the first direction may be parallel to the axis of the solid crystal 115 along which the solid crystal 115 may have the highest or largest refractive index. In some embodiments, the first principal refractive index of the solid crystal 115 may be at least about 1.5, at least about 1.6, at least about 1.7, at least about 1.8, at least about 1.9, at least about 2.0, at least about 2.1, or at least about 2.2. In some embodiments, the first principal refractive index of the solid crystal 115 may be in a range of 1.6 to 2.6. In some embodiments, an optical anisotropy (e.g., an in-plane birefringence) of the solid crystal 115 may be at least about 0.1, at least about 0.2, at least about 0.3, at least one about 0.35, or at least about 0.4.

The solid crystal 115 may be structurally configured or fabricated to realize at least one predetermined optical function of the optical device 100. In some embodiments, the solid crystal 115 may be structurally configured or fabricated to have a substantially spatially non-varying (e.g., constant) orientation of the axis of the solid crystal 115. In some embodiments, the solid crystal 115 may be structurally configured or fabricated to have a spatially varying orientation of the axis of the solid crystal 115. In some embodiments, configuring the spatially constant or spatially varying orientation of the axis of the solid crystal 115 may be realized by aligning the crystal molecules included in the solid crystal 115 in a predetermined alignment pattern, e.g., a spatially uniform alignment pattern, or a spatially varying alignment pattern. That is, the solid crystal 115 may be structurally configured or fabricated to have the crystal molecules aligned in a predetermined alignment pattern, thereby providing at least one predetermined optical function.

In some embodiments, the alignment structure 110 may be configured to at least partially align the crystal molecules in the predetermined alignment pattern. In some embodiments, the orientations of the axes of the crystal molecules that are in contact with the alignment structure 110 may be aligned by (or with) the alignment structure 110, and the orientations of the axes of remaining crystal molecules may be aligned according to the neighboring crystal molecules that have been aligned and/or configured by the alignment structure 110. In some embodiments, the predetermined alignment pattern of the crystal molecules may result in spatially uniform (or constant) orientations and/or spatially varying orientations of the axes of the crystal molecules within the solid crystal 115. In some embodiments, the orientations of the axes of the crystal molecules within the solid crystal 115 may periodically or non-periodically vary in a linear direction, in a radial direction, in a circumferential (e.g., azimuthal) direction, or a combination thereof. Accordingly, the axis of the solid crystal 115 may be configured to have a constant orientation, an orientation periodically or non-periodically varying in a linear direction, an orientation periodically or non-periodically varying in a radial direction, an orientation periodically or non-periodically varying in a circumferential (e.g., azimuthal) direction, or a combination thereof within the solid crystal 115.

Depending on different orientations of the axis of the solid crystal 115, the optical device 100 may provide different optical functions. For example, depending on different orientations of the axis of the solid crystal 115, the optical device 100 may function as an optical waveguide, a grating, a prism, a lens, an axicon, an optical rotator, a waveplate or a phase retarder, a lens array, a prism array, or a combination thereof. The optical device 100 may function as a transmissive-type optical device, a reflective-type optical device, or a transmissive-reflective-type optical device. In some embodiments, when the optical device 100 functions as a transmissive-type optical device, the solid crystal 115 may be optically transparent (e.g., having a light transmittance of at least about 60%) at least in the visible spectrum (e.g., about 380 nm to about 700 nm). In some embodiments, the solid crystal 115 may also be optically transparent at least a portion of the IR spectrum, e.g., having a light transmittance of at least about 60% in the near IR spectrum.

In some embodiments, the solid crystal 115 at an aligned crystal state may be polarization dependent due to the optical anisotropy. For example, the solid crystal 115 may exhibit different optical functions for incident lights having different polarizations. In some embodiments, the solid crystal 115 may be switchable between an amorphous state and the aligned crystal state through various methods, for example, through a polarization based switching, a thermal based switching, or an external field based switching, etc. In the amorphous state, the solid crystal 115 may remain in a solid state, and the crystal molecules may not be in the predetermined alignment pattern. As a result, the solid crystal 115 in the amorphous state may not exhibit the predetermined optical function that is determined by the predetermined alignment pattern of the crystal molecules in the solid crystal 115. In some embodiments, the solid crystal 115 may be switchable between the amorphous state and the aligned crystal state by switching a polarization of a light incident onto the solid crystal 115. In some embodiments, the solid crystal 115 may be switchable to the amorphous state at an elevated temperature.

In some embodiments, the solid crystal 115 may be switchable between the amorphous state and the aligned crystal state through applying an external field (e.g., an external light field) to the crystal molecules in the solid crystal 115, where the external field may change the orientations and/or alignments of the crystal molecules in the solid crystal 115. After the external field is removed, the crystal molecules may return to the initial orientations and/or alignments. For example, the crystal molecules may be aligned according to an interference pattern (e.g., formed by two optical beams with different states of polarization). The interference pattern may create regions of constructive or destructive interference, where the crystal molecules may be selectively aligned. For example, the crystal molecules may be aligned differently in the regions of constructive or destructive interference. Through creating a holographic pattern or an active exposure that the crystal molecules are subject to and through configuring time scales and length scales, the orientations and/or alignments of the crystal molecules may be dynamically controlled. That is, active orientations and/or alignments of the crystal molecules may be achieved.

In some embodiments, the spatial variation of the orientation of the axis of the solid crystal 115 (or the spatially varying orientation of the axis of the solid crystal 115) may substantially smooth throughout the solid crystal 115. In some embodiments, the solid crystal 115 may include a plurality of grains (or sections) with at least one grain boundary, where each or multiple grains may be at least partially aligned by the alignment structure 110. To realize a smooth transition between neighboring grains and crystal molecules, in some embodiments, one or more additional functional groups may be incorporated into the crystal molecules. In some embodiments, one or more additives or one or more plasticizers configured to release local crystalline strain may be added to the solid crystal 115. In some embodiments, the plasticizers may include molecules with alkyl and/or alkoxy chains (e.g., liquid crystal molecules) that may exhibit weak affinity to crystallinity, thereby making the crystal phase softer and more malleable to deformations and structural changes.

In some embodiments, the alignment structure 110 may include an alignment layer, which may be separate film formed on or bonded to the substrate 105. The alignment layer may be disposed between the substrate 105 and the solid crystal 115, and may be in contact with the solid crystal 115. In some embodiments, the alignment layer may be a photo-alignment material ("PAM") layer, which may include one or more photo-alignment materials. In some embodiments, the photo-alignment materials may include photosensitive molecules that may undergo orientational ordering when subject to a polarized light irradiation. In some embodiments, the photosensitive molecules may include elongated anisotropic photosensitive units (e.g., small molecules or fragments of polymeric molecules), which may be aligned in an alignment structure pattern when subject to the polarized light irradiation.

In some embodiments, the photosensitive units may be polarization sensitive. For example, the photosensitive units may be aligned by a light with a predetermined polarization, and may not be aligned by a light with a different polarization. In some embodiments, the alignment layer may be a mechanically rubbed layer (e.g., a mechanically rubbed polymer layer). In some embodiments, the alignment layer may be a polymer layer with anisotropic nanoimprint, e.g., a polymer layer including a pattern of anisotropic nanostructures fabricated using e.g., a lithographic or a nanoimprinting technique. In some embodiments, the alignment layer may include a ferroelectric or ferromagnetic material configured to at least partially align the crystal molecules in the solid crystal 115 in a presence of a magnetic field or an electric field. In some embodiments, the alignment layer may be a substantially thin crystalline film (or layer) or a crystalline substrate configured to at least partially align the crystal molecules in the solid crystal 115. The crystalline film or the crystalline substrate may include solid crystal molecules that have already been aligned in an alignment structure pattern. When crystal molecules that form the solid crystal 115 are grown on the crystalline film or crystalline substrate, through lattice constant matching, the growth of the crystal molecules that form the solid crystal 115 may be configured, affected, or determined by the alignment structure pattern defined by the molecules of the crystalline film or crystalline substrate.

The alignment structure pattern of the thin crystalline film or crystalline substrate may be formed using any suitable methods disclosed herein. In a process of fabricating the solid crystal 115, crystal molecules of the solid crystal 115 may be deposited on (e.g., grown on) the thin crystalline film or substrate. The crystal molecules of the solid crystal 115 in contact with the thin crystalline film or substrate may be align with the crystal molecules included in the thin crystalline film or substrate. Multiple thin crystalline films or substrates may be used to form a stack of layers of crystal molecules in the solid crystal 115 having different alignment patterns. In some embodiments, the alignment layer may be configured to at least partially align the crystal molecules in the solid crystal 115 based on a crystallization occurring in a presence of a magnetic field or an electric field. In some embodiments, the alignment layer may include an hexagonal boron nitride (h-BN) layer or a graphene layer.

In some embodiments, the alignment structure 110 may include features directly formed on or at least partially in the substrate 105 or formed on or at least partially in the solid crystal 115. In some embodiments, the alignment structure 110 may be generated in the solid crystal 115 based on a crystallization occurring in a presence of a magnetic field or an electric field. In some embodiments, the alignment structure 110 may be generated in the solid crystal 115 based on an external light field, which may at least partially align the crystal molecules in the solid crystal 115 in the predetermined alignment structure. For example, the crystal molecules included in the solid crystal 115 may be aligned according to an interference pattern (e.g., formed by two optical beams with different states of polarization). The interference pattern may create regions of constructive or destructive interference, where the crystal molecules may be selectively aligned. For example, the crystal molecules may be aligned differently in the regions of constructive or destructive interference.

In some embodiments, the substrate 105 may be nanofabricated to have the alignment structure 110 for at least partially aligning the crystal molecules in the solid crystal 115. For example, the substrate 105 may be fabricated from an organic material, such as amorphous or liquid crystalline polymers, crosslinkable monomers including those having liquid crystal properties. In some embodiments, the substrate 105 may be fabricated from an inorganic material, such as metals or oxides used for manufacturing of metasurfaces. The material(s) of the substrate 105 may be isotropic or anisotropic. In some embodiments, the substrate 105 may be nanofabricated from a resist material that is transparent or nearly transparent to a range of electromagnetic frequencies, such as the visible wavelength spectrum. The resist material may be in a form of thermoplastic, polymer, optically transparent photoresist, etc. After being set or cured, the resist material may provide an alignment to the crystal molecules included in the solid crystal 115. That is, in some embodiments, the substrate 105 may also function as an alignment layer for at least partially aligning the crystal molecules included in the solid crystal 115.

Various alignment patterns and features may be realized using the nanofabrication techniques of the substrate 105, which allow for the creation of an alignment structure 110 to at least partially align the crystal molecules included in the solid crystal 115 with high customizability. In some embodiments, the alignment structure 110 may include an anisotropic relief, which may be formed by wet or dry etching the anisotropic relief directly on a surface (e.g., an upper surface in FIG. 1A) of the substrate 105 or on a surface (e.g., a lower surface in FIG. 1A) of the solid crystal 115. In some embodiments, the substrate 105 may be a substantially thin crystalline substrate configured at least partially align the crystal molecules included in the solid crystal 115, and the substrate 105 may function as the alignment structure 110.

Figure 1B:
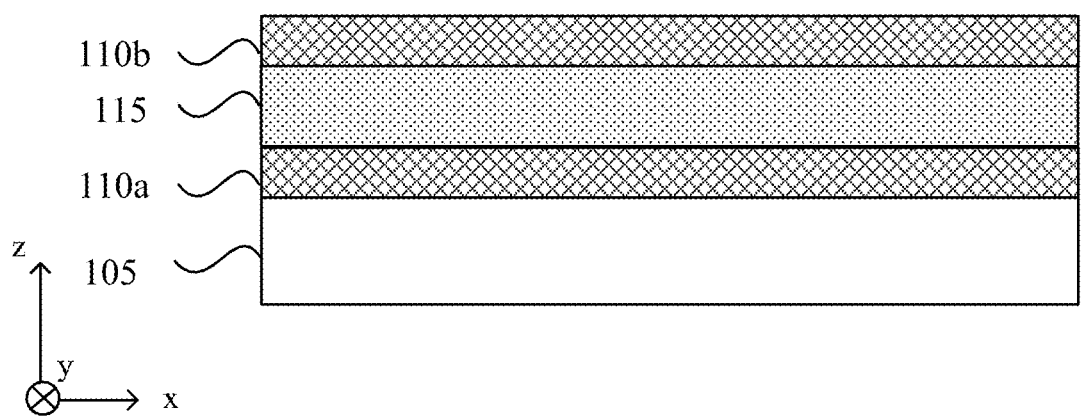

In some embodiments, as shown in FIG. 1B, an optical device 150 may include two alignment structures 110a and 110b sandwiching the solid crystal 115. The solid crystal 115 may be in contact with both alignment structures 110a and 110b. The alignment structures 110a and 110b may be configured to at least partially align the crystal molecules included in the solid crystal 115 in the predetermined alignment pattern. In some embodiments, the orientations of the axes of the crystal molecules that are in contact with the alignment structures 110a and 110b may be determined by the alignment structures 110a and 110b, respectively. The orientations of the axes of other crystal molecules included in the solid crystal 115 may be aligned according to the neighboring crystal molecules that are in contact with and that have been aligned by the alignment structure 110a and/or the alignment structure 110b. The two alignment structures 110a and 110b may each define or have an alignment structure pattern. The alignment structure pattern of the two alignment structures 110a and 110b may be the same, or may be different.

Returning to FIG. 1A, in some embodiments, the optical device 100 may include other elements. For example, the substrate 105 may have a first surface (e.g., an upper surface shown in the view shown in FIG. 1A) and an opposing second surface (a lower surface in the view shown in FIG. 1A). The solid crystal 115 may be disposed at the first surface of the substrate 105. In some embodiments, the optical device 100 may also include a reflective coating disposed at the second surface of the substrate 105. The solid crystal 115 may have a first surface (e.g., an upper surface in the view shown in FIG. 1A) and an opposing second surface (e.g., a lower surface in the view shown in FIG. 1A).

In some embodiments, the optical device 100 may include an anti-reflective coating disposed at at least one of the first surface or the second surface of the solid crystal 115. In some embodiments, the optical device 100 may include two substrates disposed opposite to each other. For example, a second substrate may be disposed on the alignment structure 115.

Likewise, the optical device 150 shown in FIG. 1B may include other elements. For example, a reflective coating may be disposed at a lower surface (the surface opposite to the surface where the alignment structure 110a is disposed) of the substrate 105. An anti-reflective coating may be disposed at at least one of an upper surface or a lower surface of the solid crystal 115. In some embodiments, the optical device 150 may include a second substrate disposed on the alignment structure 115b.

FIG. 1A and FIG. 1B show one solid crystal 115 for illustrative purposes. The number of solid crystals (e.g., solid crystal films, layers, or plates) included in the optical device 100 or 150 may be any suitable number, such as two, three, four, five, six, etc. In some embodiments, the number of alignment structures (e.g., alignment layers) included in the optical device 100 or 150 may not be limited to one or two, and may be more than two, such as three, four, five, six, etc. The number of solid crystals (e.g., solid crystal films, layers, or plates) and the alignment structures that may be included in the optical device 100 or 150 may be determined based on specific applications. For example, the optical device 100 or 150 may include a stack of multiple continuous solid crystals (e.g., solid crystal films, layers, or plates) and multiple alignment structures (e.g., alignment layers) alternately arranged.

The crystal molecules included in the solid crystal may be at least partially aligned by respective alignment structures on which the crystal molecules are disposed. For example, the crystal molecules in a solid crystal film may be at least partially aligned by an alignment structure on which the solid crystal film is disposed. In some embodiments, the multiple alignment structures may be the same. For example, the multiple alignment structures may be configured to at least partially align the crystal molecules included in the respective solid crystal films in a substantially same predetermined alignment pattern. In some embodiments, at least two of the multiple alignment structures may be different from each other. For example, at least two of the multiple alignment structures may be configured to at least partially align the crystal molecules included in the corresponding at least two respective solid crystal films in at least two different predetermined alignment patterns. In some embodiments, when the thick of the stack is greater than or equal to a predetermined thickness, the multiple alignment structures may offer the advantage of resetting or realigning the orientations of the crystal molecules in the respective solid crystal films.

In some embodiments, the multiple solid crystal films may include same solid crystals. In some embodiments, at least two of the multiple solid crystal films may include different solid crystals. For example, the solid crystals may have different optical dispersions (e.g., different birefringence dispersions). For example, two solid crystal films respectively including solid crystals of a positive birefringence dispersion and a negative birefringence dispersion may compensate for each other, resulting in a substantially achromatic optical device in a predetermined wavelength range (e.g., the visible wavelength range). In some embodiments, a single solid crystal film may include a combination of a first solid crystal material having a positive birefringence dispersion and a second solid crystal material having a negative birefringence dispersion, resulting in a substantially achromatic optical device in a predetermined wavelength range.

FIGS. 2A-2D schematically illustrate x-z sectional views of optical devices, according to various embodiments of the present disclosure. In the embodiments shown in FIGS. 2A-2D, the crystal molecules in the respective solid crystal films may be substantially uniformly aligned in a predetermined alignment pattern (e.g., a predetermined direction). The optical devices shown in FIGS. 2A-2D may include structures or elements that are the same as or similar to those included in the optical device 100 shown in FIG. 1A or the optical device 150 shown in FIG. 1B. Descriptions of the same or similar structures or elements included in the embodiments shown in FIGS. 2A-2D can refer to the above descriptions, including those rendered in connection with the embodiments shown in FIG. 1A and FIG. 1B.

Figure 2A:
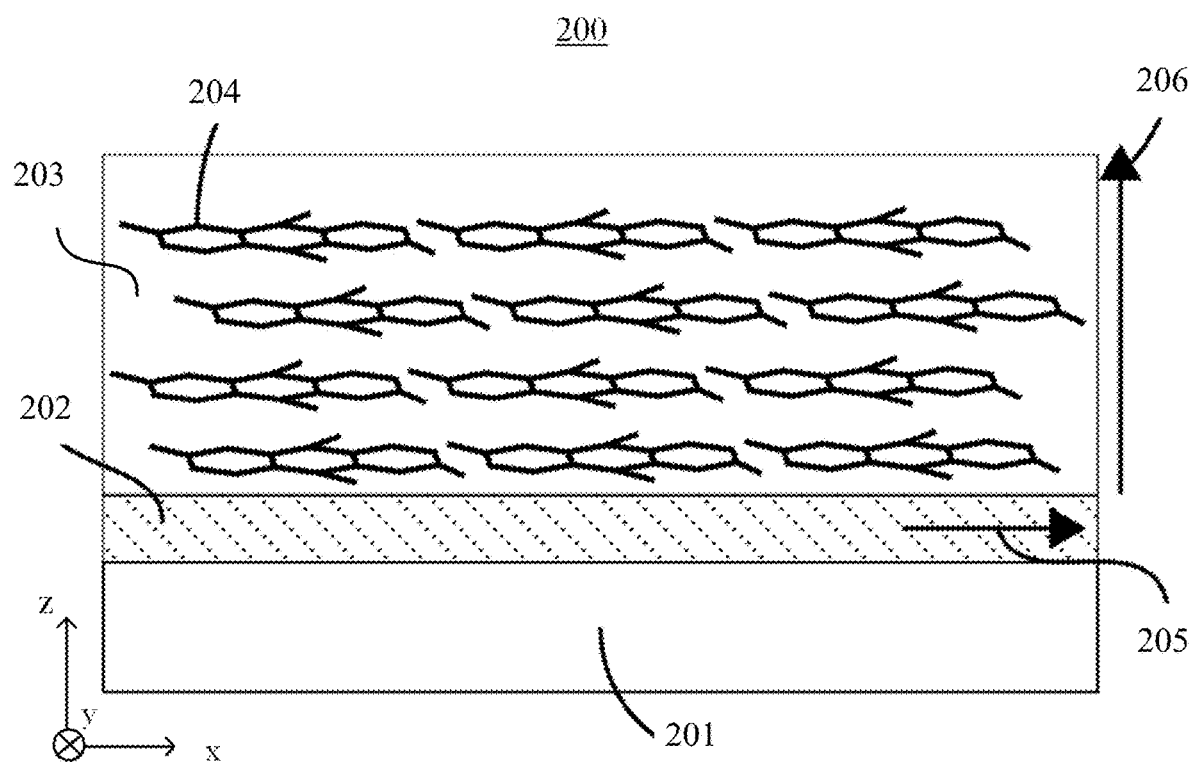
FIGS. 2A-2D schematically illustrate cross-sectional views of optical devices, according to various embodiments of the present disclosure.

As shown in FIG. 2A, an optical device 200 may include a substate 201, an alignment structure 202 disposed at (e.g., on or at least partially in) the substate 201, and a solid crystal 203 disposed at (e.g., on) the alignment structure 202. The solid crystal 203 may be in a form of a film, a layer, or a plate. For convenience of discussion, the solid crystal 203 may also be referred to as a solid crystal film 203 or a solid crystal layer 203. For illustrative purposes, the substrate 201, the alignment structure 202, and the solid crystal 203 are shown as having a flat shape. In some embodiments, at least one of the substrate 201, the alignment structure 202, or the solid crystal 203 may be have a curved shape. The solid crystal film 203 may be in contact with the alignment structure 202, and crystal molecules 204 included in the solid crystal film 203 may be at least partially aligned by the alignment structure 202. In some embodiments, each layer of the crystal molecules 204 included in the solid crystal film 203 may lie flat on the alignment structure 202 in the x-y plane, and may follow an orientation or an alignment direction 205 (denoted by an arrow as shown in FIG. 2A) within the x-y plane perpendicular to a thickness direction 206 (e.g., a z-axis direction) of the solid crystal film 203. For example, the crystal molecules 204 may be spatially uniformly aligned along an x-axis direction as shown in FIG. 2A.

Multiple layers of the crystal molecules 204 may be disposed (e.g., grown) along the z-axis direction to form the solid crystal film 203. For discussion purposes, each molecule 204 is depicted as having a longitudinal direction (or a length direction) and a lateral direction (or a width direction), and an axis of the molecule 204 is presumed to be in the longitudinal direction of the molecule 204, along the presumed axis of highest refractive index for molecule 204. As shown in FIG. 2A, the orientations of the axes of the molecules 204 are uniformly aligned by the alignment structure 202 in the alignment direction 205. That is, different layers of molecules 204 may be aligned substantially in the same alignment direction 205. A plane including the longitudinal direction and the lateral direction of the molecule 204 is parallel to the surface of the substrate 201 or the x-y plane (i.e., the molecule 204 lies flat in the x-y plane). For illustrative purposes, the crystal molecules 204 in the solid crystal film 203 or the solid crystal layer 203 are drawn to have a same shape. In some embodiments, the crystal molecules 204 in a solid crystal layer may be the same (e.g., molecules of the same crystal material). In some embodiments, the crystal molecules 204 in one solid crystal layer may include two or more different molecules (e.g., molecules of two or more different crystal materials).

Figure 2B:
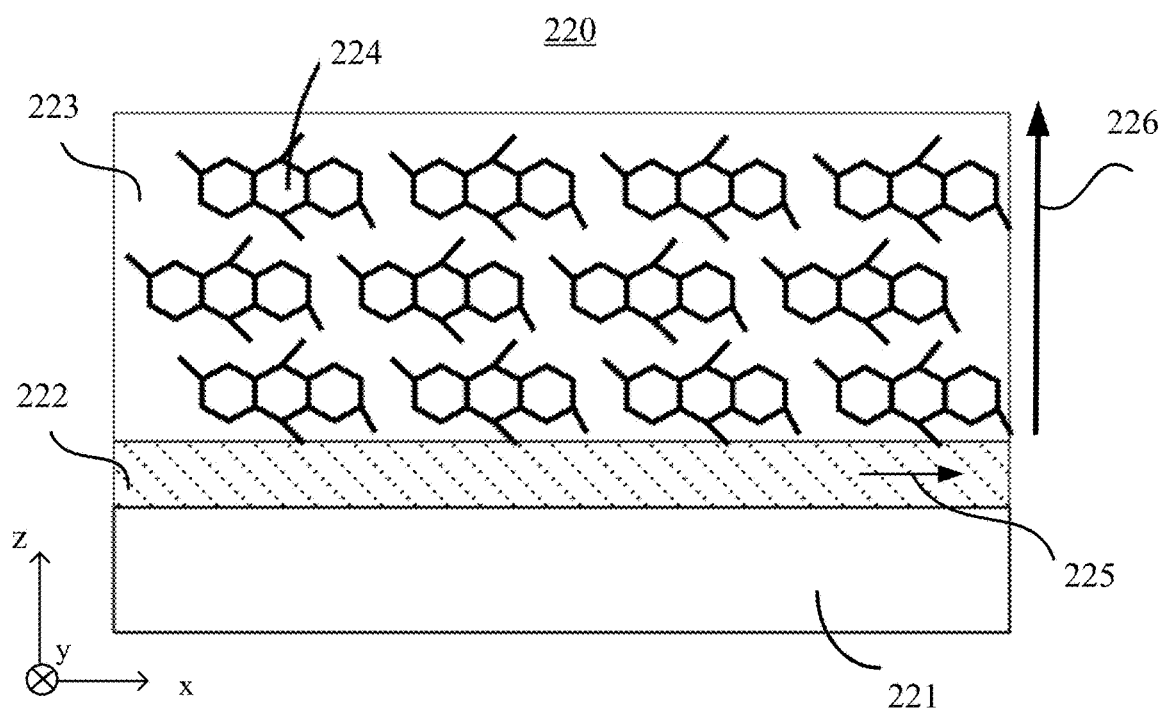

As shown in FIG. 2B, an optical device 220 may include a solid crystal film 223. Crystal molecules 224 included in the solid crystal film 223 may be at least partially aligned by an alignment structure 222. In the embodiment shown in FIG. 2A, the crystal molecules 204 lie flat in the x-y plane (e.g., a plane including a longitudinal direction and a lateral direction of the crystal molecules 204 is parallel to the surface of the substrate 201, or the x-y plane). In the embodiment shown in FIG. 2B, the crystal molecules 224 may not lie flat in the x-y plane, but may lie flat in the x-z plane. That is, a plane including the longitudinal direction and the lateral direction of the crystal molecules 204 may be perpendicular to the surface of the substrate 221, or the x-y plane. Each layer of the crystal molecules 224 may follow an orientation or an alignment direction 225 (denoted by an arrow as shown in FIG. 2B) within the x-y plane that is perpendicular to a thickness direction 226 (e.g., a z-axis direction) of the solid crystal film 223. For example, the crystal molecules 224 may be spatially uniformly aligned along the x-axis direction as shown in FIG. 2B. In other words, the orientations of the axes of the molecules 224 may be uniformly aligned by the alignment structure 222. That is, different layers of molecules 224 may be uniformly aligned in the same alignment direction 225.

Figure 2C:
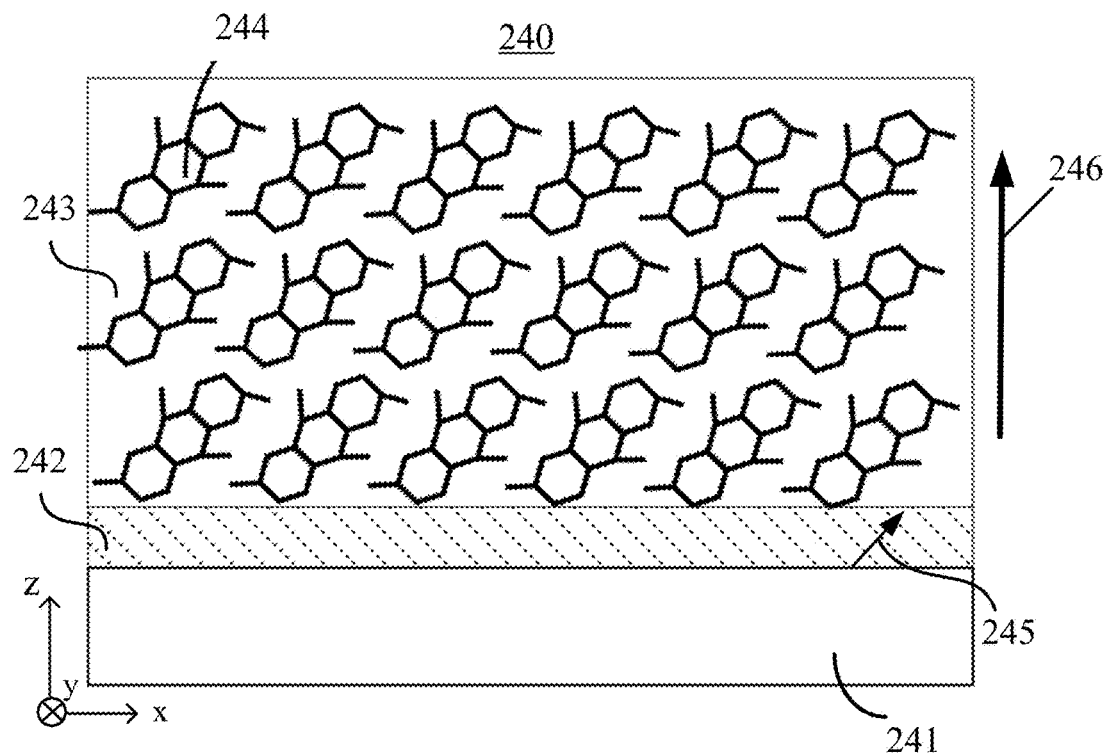

As shown in FIG. 2C, an optical device 240 may include a solid crystal film 243. Crystal molecules 244 included in the solid crystal film 243 may be at least partially aligned by an alignment structure 242. The longitudinal direction (e.g., orientation of the axis) of each crystal molecule 244 in the x-z plane may form an angle with respective to a surface of a substrate 241 (or a surface of the alignment structure 242). For example, the crystal molecules 244 may follow an orientation or an alignment direction 245 (denoted by an arrow as shown in FIG. 2C) within an x-z plane. That is, the orientations of axes of the molecules 244 may be uniformly aligned in the alignment direction 245 in the x-z plane, forming a suitable angle relative to a surface of the substrate 241 (or a surface of the alignment structure 242). The angle of the crystal molecules 244 (e.g., the orientations of the axes of the molecules 244) with respect to the surface of the substrate 241 may be any suitable angles, such as 30°, 45°, etc. In some embodiments, the crystal molecules 244 included in the solid crystal film 243 may have other suitable orientations or alignment directions under appropriate crystal growth conditions. For example, the crystal molecules 244 may follow an orientation or an alignment direction in the thickness direction (e.g., the z-axis direction) of the solid crystal film 243.

Figure 2D:
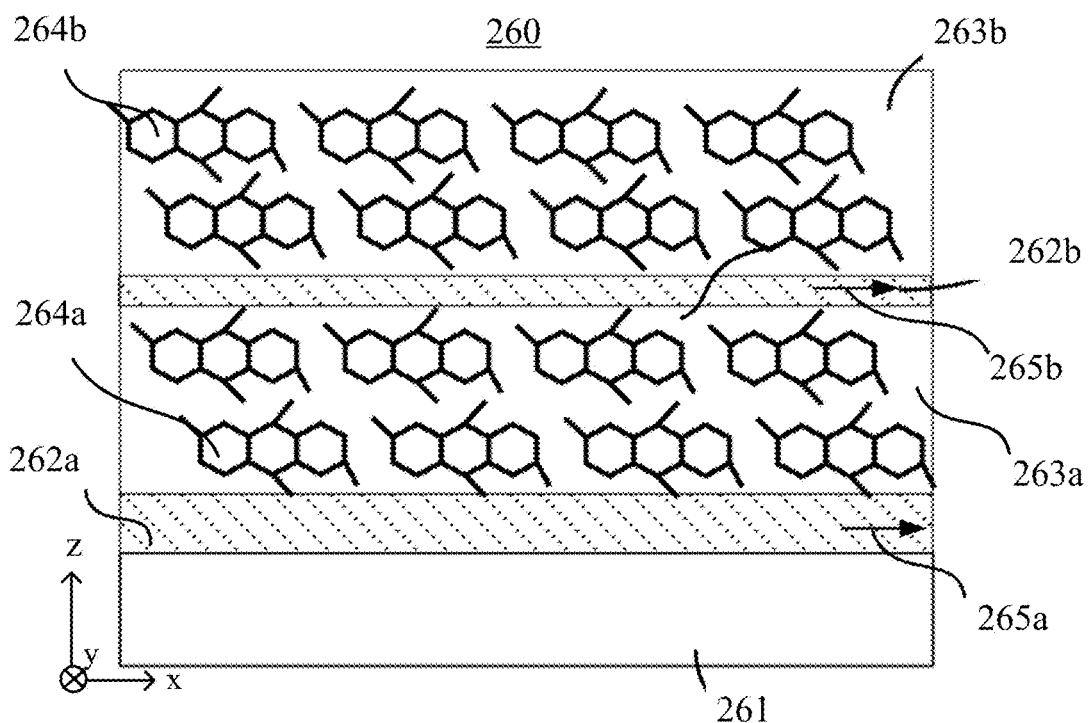

As shown in FIG. 2D, an optical device 260 may include a stack of multiple continuous solid crystal films and multiple alignment structures (e.g., alignment layers) alternately arranged. For illustrative purposes, two solid crystal films 263a and 263b, and two alignment structures 262a and 262b are shown to be included in the optical device 260. Crystal molecules 264a included in the solid crystal film 263a may be at least partially aligned by the alignment structure 262a, and crystal molecules 264b included in the solid crystal film 263b may be at least partially aligned by the alignment structure 262b. The multiple alignment structures may define the same or different predetermined alignment patterns for aligning crystal molecules disposed thereon. In the embodiment shown in FIG. 2D, the two alignment structures may provide a substantially same alignment pattern for the crystal molecules included in the respective solid crystal films. For example, the crystal molecules 264a and 264b may be aligned in the x-axis directions 265a and 265b, as shown in FIG. 2D. Although each solid crystal film 263a and 263b is shown to be similar to the solid crystal film 223 shown in FIG. 2B, in some embodiments, each solid crystal film 263a and 263b may be similar to the solid crystal film 203 shown in FIG. 2A or the solid crystal film 243 shown in FIG. 2C.

Figure 3A:
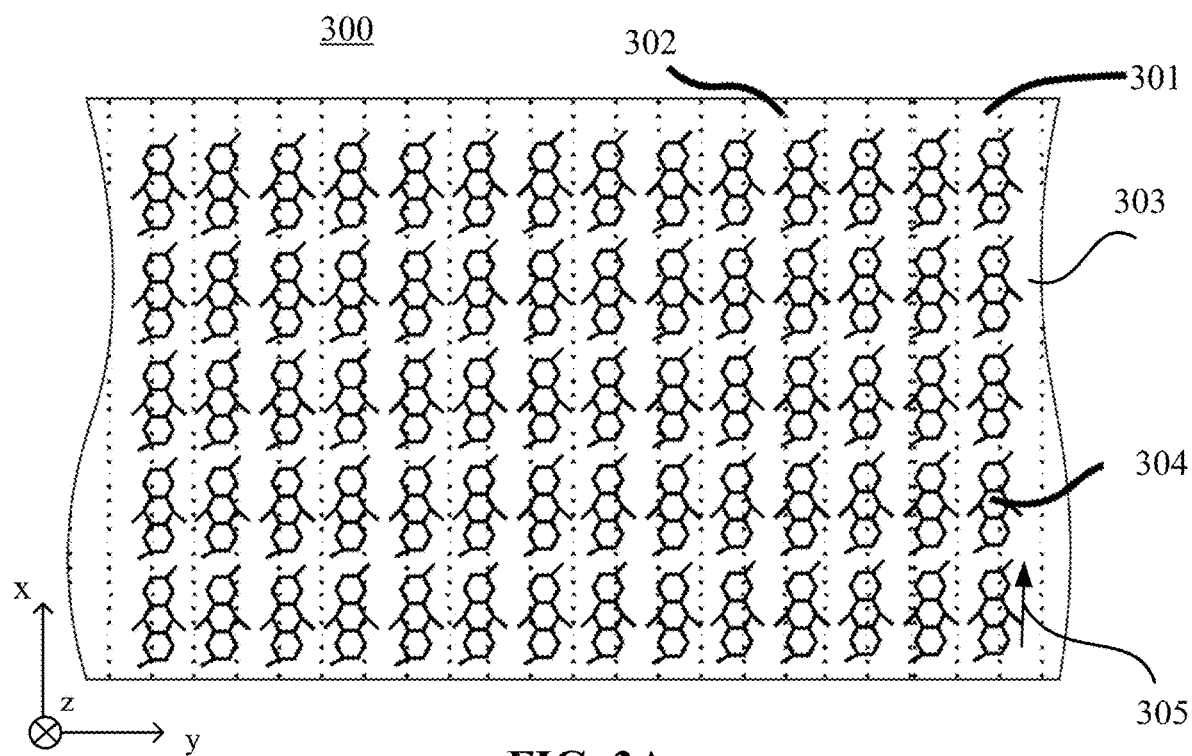
FIGS. 3A and 3B schematically illustrate top views of optical devices, according to various embodiments of the present disclosure.
Figure 3B:
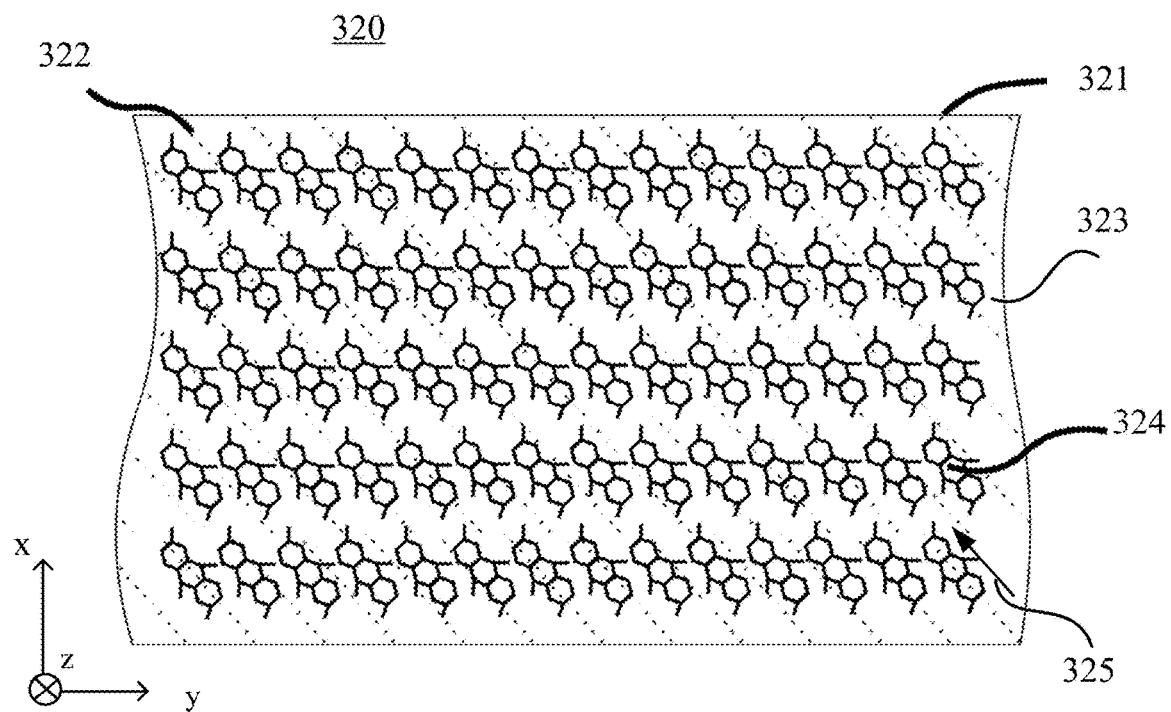

FIGS. 3A and 3B schematically illustrate top views (e.g., x-y sectional views) of optical devices, according to various embodiments of the present disclosure. In the embodiments shown in FIGS. 3A and 3B, the crystal molecules in the respective solid crystal films may be substantially uniformly aligned in a predetermined pattern (e.g., in a predetermined direction). The optical devices shown in FIGS. 3A and 3B may include structures or elements that are the same as or similar to those included in the optical devices shown in FIGS. 1A-2D (e.g., optical device 100 shown in FIG. 1A). Descriptions of the same or similar structures or elements included in the embodiments shown in FIGS. 3A and 3B can refer to the above descriptions (including, e.g., those rendered in connection with the embodiment shown in FIG. 1A). The specific alignment of the molecules in the top views of FIG. 3A and FIG. 3B are for illustrative purposes.

As shown in FIG. 3A, an optical device 300 may include a substrate 301, an alignment structure 302 disposed at (e.g., on) the substrate 301, and a solid crystal film 303 disposed at (e.g., on) the alignment structure 302. The solid crystal film 303 may be in contact with the alignment structure 302. Crystal molecules 304 included in the solid crystal film 303 may be at least partially aligned by the alignment structure 302. The crystal molecules 304 included in the solid crystal film 303 may lie flat on the alignment structure 302, and may follow an orientation or an alignment pattern (e.g., direction 305) (denoted by an arrow as shown in FIG. 3A) within a plane (e.g., an x-y plane) perpendicular to a thickness direction (e.g., a z-axis) of the solid crystal film 303. For example, the crystal molecules 304 may be aligned along an x-axis direction in FIG. 3A. In other words, the orientations of the axes of the molecules may be aligned in the alignment direction 305. In some embodiments, the crystal molecules 304 may be aligned along a y-axis direction. In some embodiments, the crystal molecules 304 may be aligned in a suitable direction within an x-y plane. In some embodiments, the optical device 300 having the top view shown in FIG. 3A may have a corresponding cross-sectional view shown in FIG. 2A.

As shown in FIG. 3B, an optical device 320 may include a substate 321, an alignment structure 322 disposed at (e.g., on) the substate 321, and a solid crystal film 323 disposed at (e.g., on) the alignment structure 322. Crystal molecules 324 included in the solid crystal film 323 may lie flat on the alignment structure 322, and may follow an orientation or an alignment pattern (e.g., direction 325) (denoted by an arrow as shown in FIG. 3B) within a plane (e.g., the x-y plane) perpendicular to a thickness direction (e.g., a z-axis) of the solid crystal film 323. In other words, the orientations of the axes of the molecules may be aligned in the alignment direction 325. The alignment direction 325 may form an angle relative to the x or y axis. Any suitable angle may be configured. For example, in some embodiments, the crystal molecules 324 may be aligned in a direction having an angle of about 45° with respect to the x-axis direction.

Figure 4A:
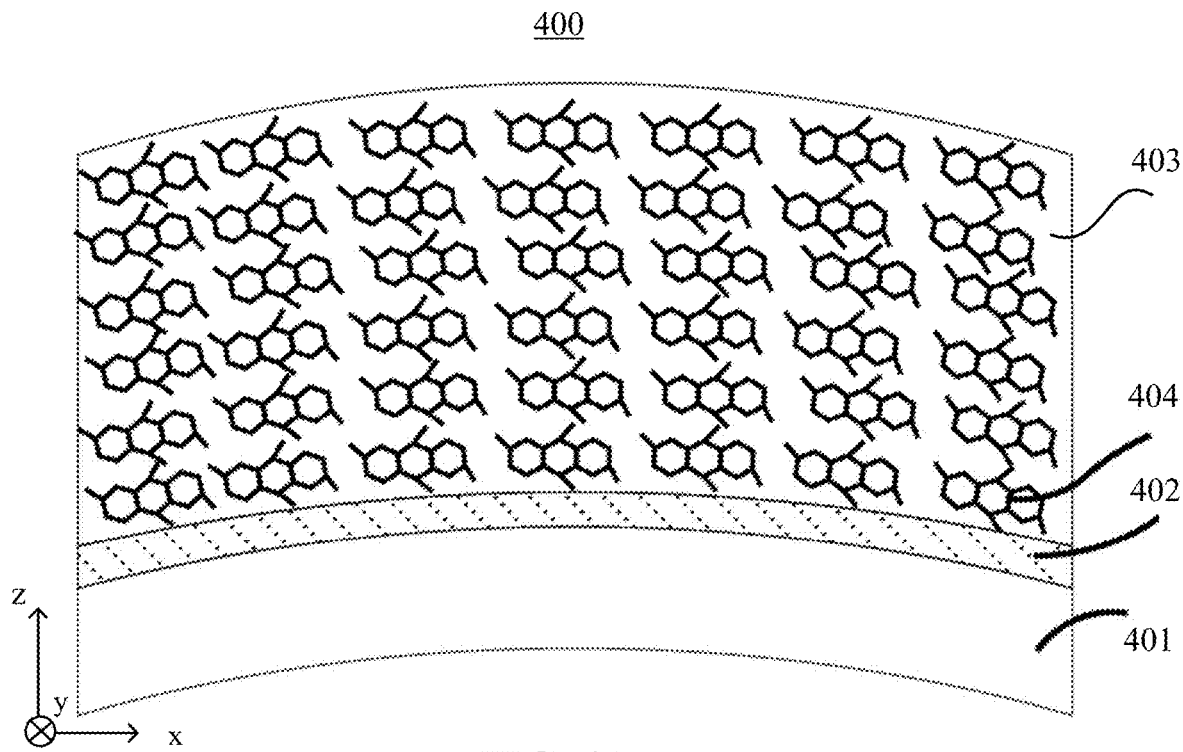
Figure 4B:
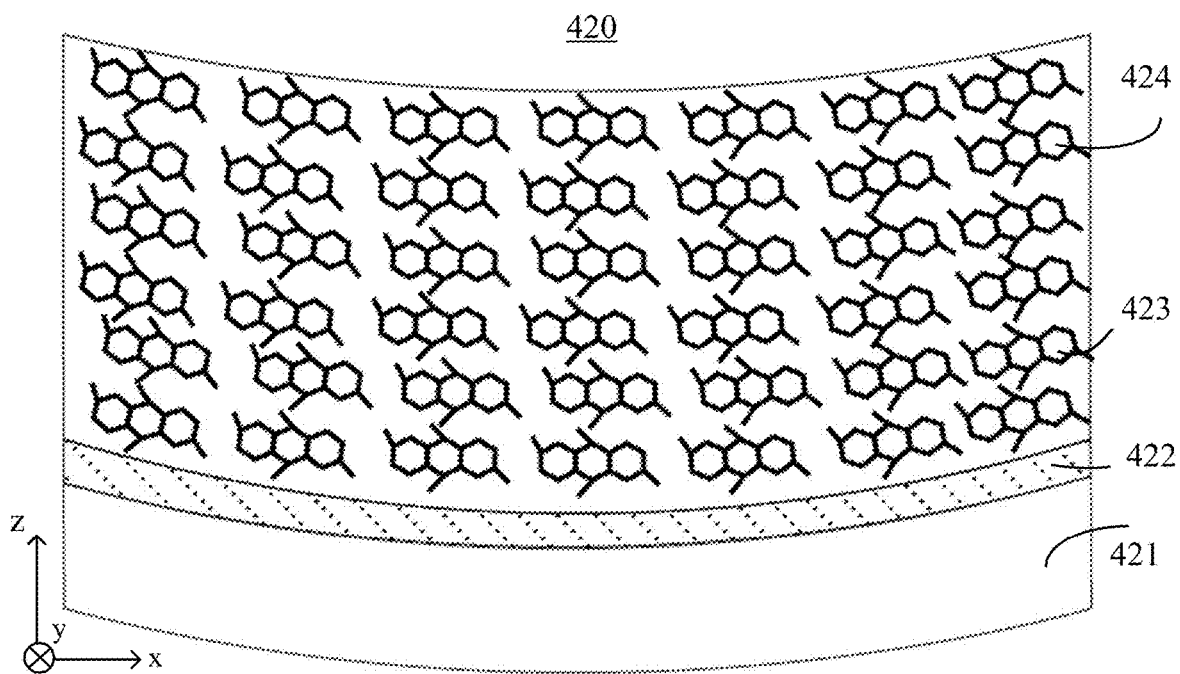

FIGS. 4A-4C schematically illustrate x-z sectional views of optical devices, according to various embodiment of the present disclosure. The optical devices shown in FIGS. 4A-4C may include curved substrates and curved solid crystal films, and may function as curved optical waveguides. The optical devices shown in FIGS. 4A-4C may include structures or elements that are the same as or similar to those included in the optical device shown in FIGS. 1A-3B (e.g., the optical device 100 shown in FIG. 1A). Descriptions of the same or similar structures or elements included in the embodiments shown in FIGS. 4A-4C can refer to the above descriptions (including, e.g., those rendered in connection with the embodiment shown in FIG. 1A).

As shown in FIG. 4A, an optical device 400 may include a substate 401, an alignment structure 402 disposed at (e.g., on) the substate 401, and a solid crystal film 403 disposed at (e.g., on) the alignment structure 402. The solid crystal film 403 may be in contact with the alignment structure 402. Crystal molecules 404 included in the solid crystal film 403 may be at least partially aligned by the alignment structure 402. The crystal molecules 404 included in the solid crystal film 403 may have substantially uniform orientations or alignments within the solid crystal film 403. The substrate 401 may include one or more curved surfaces. For example, one or both of an upper surface and a lower surface of the substrate 401 may have a curved shape. In some embodiments, the alignment structure 402 disposed at the substrate 401 may include one or more curved surfaces. For example, at least a lower surface of the alignment structure 402 that faces the upper surface of the substrate 401 may have a curved shape. The curved shape of the alignment structure 402 may match with the curved shape of the upper surface of the substrate 401. In some embodiments, as shown in FIG. 4A, both the substrate 401 and the alignment structure 402 may have a convex shape. In some embodiments, the alignment structure 402 may directly formed (e.g., etched) on a curved surface of the substrate 401.

The solid crystal film 403 may have a first surface and an opposing second surface. One or both of the first surface and second surface of the solid crystal film 403 may be non-rectilinear. In some embodiments, both the first surface and second surface of the solid crystal film 403 may be non-rectilinear. For example, both the first surface (e.g., an upper surface) and the second surface (e.g., a lower surface) of the solid crystal film 403 may have a curved shape that matches with the curved shape of the alignment structure 402. For example, as shown in FIG. 4A, the solid crystal film 403 may have a convex shape that may match with the convex shape of the substrate 402. The solid crystal film 403 may guide an electromagnetic radiation (e.g., a light) to propagate internally within the solid crystal film 403 via TIR. In some embodiments, the solid crystal film 403 may be grown on a top surface of the substrate 401. The growing process may include first disposing the alignment structure 402 on the top surface of the substrate 401, and then epitaxially depositing (e.g., growing) the crystal molecules 404 on the alignment structure 402. In some embodiments, a front surface (or top surface) and an opposing back surface (or bottom surface) of the solid crystal film 403 may not be parallel to one another.

As shown in FIG. 4B, an optical device 420 may include a substate 421 having a concave shape, an alignment structure 422 having a concave shape, and a solid crystal film 423 having a concave shape. Although in the embodiment shown in FIG. 4B, the alignment structure 422 is shown as a separate element disposed on the substrate 421, in some embodiments, the alignment structure 422 may be directly formed (e.g., etched) on a curved surface of the substrate 421. The alignment structure 422 may be configured to at least partially align the solid crystal molecules 423 in a predetermined alignment pattern.

As shown in FIG. 4C, an optical device 440 may include a curved (e.g., concave) solid crystal film 443. In some embodiments, the curved solid crystal film 443 may be obtained by shaping a meniscus during a crystal growth process. Crystal molecules 444 may be aligned during the growth process based on the shape of the meniscus. In such an embodiment, an alignment structure and a substrate may be omitted during the fabrication process of the solid crystal film 443.

Figure 5A:
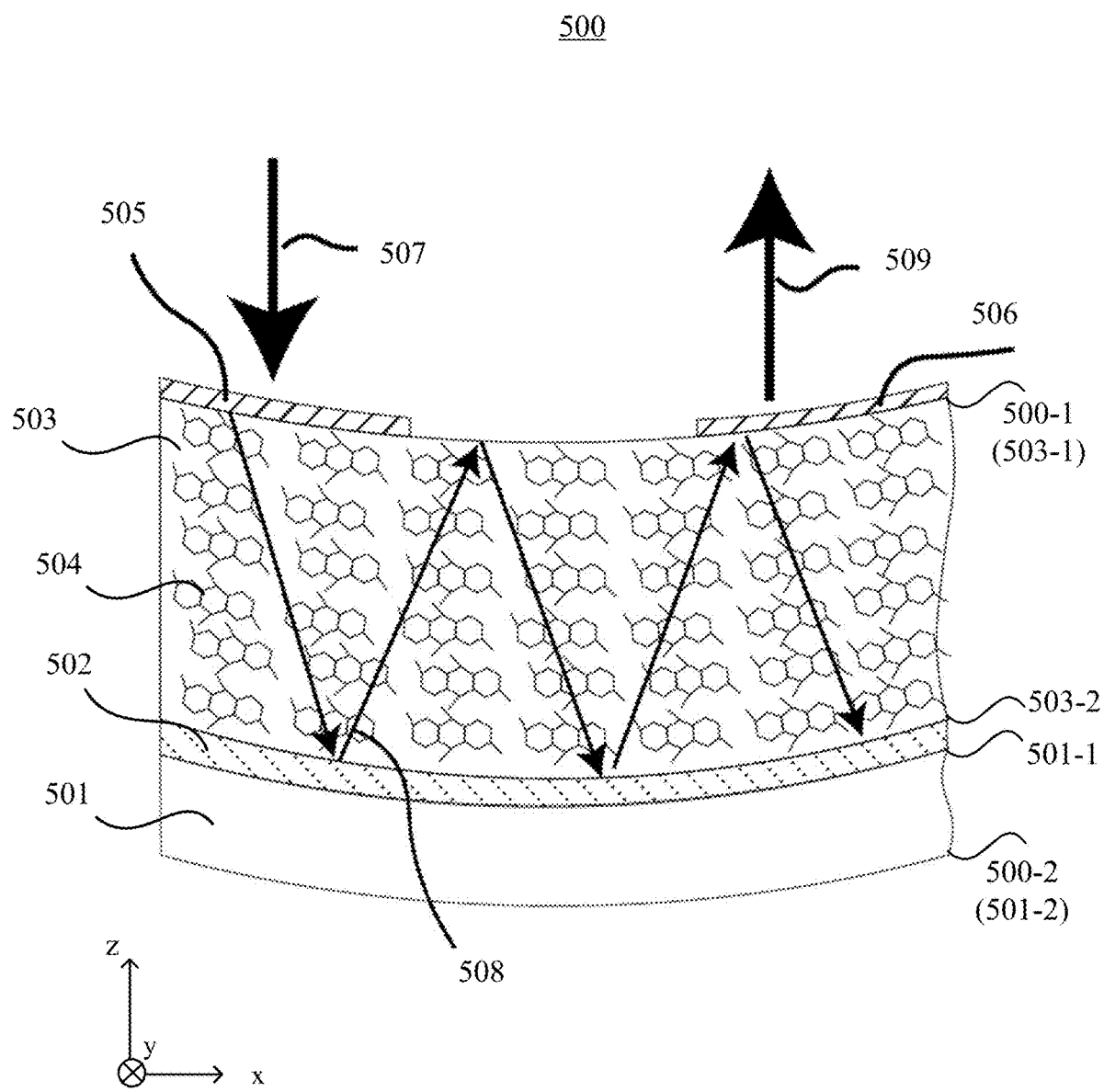
FIGS. 5A and 5B schematically illustrate cross-sectional views of optical waveguides with in-coupling and out-coupling elements, according to various embodiments of the present disclosure.

FIG. 5A schematically illustrates an x-z sectional view of an optical waveguide 500 with in-coupling and out-coupling elements, according to an embodiment of the present disclosure. The optical waveguide 500 shown in FIG. 5A may include structures or elements that are the same as or similar to those included in the optical device shown in FIGS. 1A-4C. Descriptions of the same or similar structures or elements included in the embodiment shown in FIG. 5A can refer to the above descriptions (including, e.g., those rendered in connection with the embodiment shown in FIG. 1A).

As shown in FIG. 5A, the optical waveguide 500 may be a curved optical waveguide. The optical waveguide 500 may include a substate 501, an alignment structure 502 disposed at (e.g., on) the substate 501, and a solid crystal film (or a solid crystal) 503 disposed at (e.g., on) the alignment structure 502. The solid crystal film 503 may be in contact with the alignment structure 502. Crystal molecules 504 in the solid crystal film 503 may be at least partially aligned by the alignment structure 502. For example, the crystal molecules 504 included in the solid crystal film 503 may be substantially uniformly aligned within the solid crystal film 503. In other words, the alignment structure 502 may include or define an alignment structure pattern for aligning at least a portion of the crystal molecules 504 disposed on the alignment structure 502. In some embodiments, the crystal molecules 504 may be aligned in a uniform predetermined alignment pattern, as shown in FIG. 5A. In some embodiments, the thickness of the optical waveguide 500 may be about 300 µm to about 1 mm, and the at least one lateral dimension of the optical waveguide 500 may be about 30 mm to about 100 mm.

The optical waveguide 500 may be configured to receive an input light 507 at one or more in-coupling elements 505 disposed at a side (e.g., an upper side) of the optical waveguide 500. The wavelength of the input light 507 may be in the visible spectrum or the near IR spectrum. The one or more in-coupling elements 505 may be configured to couple the input light 507 into the optical waveguide 500 as an in-coupled light 508. The optical waveguide 500 may guide the in-coupled light 508 to one or more out-coupling elements 506 disposed at the optical waveguide 500 via total internal reflection ("TIR"). The in-coupled light 508 may also be referred to as a totally internally reflected light 508. One or more out-coupling elements 506 may be disposed at a side (e.g., an upper side) away from the one or more in-coupling elements 505. The one or more out-coupling elements 506 may be configured to couple the in-coupled light 508 out of the optical waveguide 500 as an output light 509, which may be delivered to an eye of a user or other optical elements. In the embodiment shown in FIG. 5A, the one or more in-coupling elements 505 and the one or more out-coupling elements 506 are disposed at the same side or surface of the optical waveguide 500. In some embodiments, the one or more in-coupling elements 505 and the one or more out-coupling elements 506 may be disposed at different sides or surfaces of the optical waveguide 500.

The optical waveguide 500 may include a first surface (or side) 500-1 and an opposing second surface (or side) 500-2. The solid crystal film 503 may include a first surface (or side) 503-1 and an opposing second surface (or side) 503-2. The substrate 501 may include a first surface (or side) 501-1 and an opposing second surface (or side) 501-2. In some embodiments, the first surface (or side) 500-1 of the optical waveguide 500 may also be the first surface (side) 503-1 of the solid crystal film 503, and the second surface (or side) 500-2 of the optical waveguide 500 may also be the second surface (side) 501-2 of the substrate 501.

In some embodiments, the in-coupling element 505 may be disposed at the first surface 500-1 or the second surface 500-2 of the optical waveguide 500. For example, in some embodiments, the in-coupling element 505 may be an integral part of the first surface 500-1 or the second surface 500-2. In some embodiments, the in-coupling element 505 may be a separate element attached, bonded, affixed, or otherwise coupled to the first surface 500-1 or the second surface 500-2.

In some embodiments, the out-coupling element 506 may be disposed at the first surface 500-1 or the second surface 500-2 of the optical waveguide 500. For example, in some embodiments, the out-coupling element 506 may be an integral part of the first surface 500-1 or the second surface 500-2. In some embodiments, the out-coupling element 506 may be a separate element attached, bonded, affixed, or otherwise coupled to the first surface 500-1 or the second surface 500-2. In some embodiments, the in-coupling element 505 and the out-coupling element 506 may be disposed at the same or different surfaces of the optical waveguide 500. In some embodiments, although not shown in FIG. 5A, at least one of the in-coupling element 505 or the out-coupling element 506 may disposed at the second surface 500-2 of the optical waveguide 500.

In some embodiments, the in-coupling element 505 and the out-coupling element 506 may be disposed at a same surface or different surfaces of the solid crystal film 503. For example, although FIG. 5A shows that the in-coupling element 505 and the out-coupling element 506 are disposed on the first surface 503-1 of the solid crystal film 503, at least one of the in-coupling element 505 and the out-coupling element 506 may be disposed at the second surface 503-2 of the solid crystal film 503. In some embodiments, the in-coupling element 505 and the out-coupling element 506 may be disposed at the same or different surfaces of the substrate 501. For example, at least one of the in-coupling element 505 or the out-coupling element 506 may be disposed at the first surface 501-1 of the substrate 501 or the second surface 501-2 of the substrate 501. In some embodiments, when one of the in-coupling element 505 or the out-coupling element 506 is disposed at the second surface (side) 501-2 of the substrate 501, the other one of the in-coupling element 505 or the out-coupling element 506 may be disposed at the first surface (side) 503-1 of the solid crystal film 503. The in-coupling element 505 and the out-coupling element 506 may be disposed at various combinations of locations, including the first surface 503-1 of the solid crystal film 503, the second surface 503-2 of the solid crystal film 503, a first surface of the alignment structure 502 facing the solid crystal film 503, a second surface of the alignment structure 502 facing the substrate 501, the first surface 501-1 of the substrate, or the second surface 501-2 of the substrate 501.

In some embodiments, the in-coupling element 505 may include a one-dimensional ("1D") or a two-dimensional ("2D") diffraction grating, which may be referred to as an in-coupling diffraction grating. The 1D diffraction grating may diffract a light beam along one axis, and the 2D diffraction grating may diffract a light beam along two axes. In some embodiments, a 2D diffraction grating may be produced by orthogonally overlaying two 1D grating structures. A period of the in-coupling diffraction grating may be configured, such that the in-coupling diffraction grating may be configured to couple the input light 507 into the optical waveguide 500 at a suitable angle via diffraction, and the in-coupled light 508 may propagate within the optical waveguide 500 via TIR. In some embodiments, the out-coupling element 506 may include a 1D or 2D diffraction grating, which may be referred to as an out-coupling diffraction grating. A period of the out-coupling diffraction grating may be configured, such that the out-coupling diffraction grating may couple the light 508 propagating inside the optical waveguide 500 through TIR out of the optical waveguide 500 via diffraction. In some embodiments, at least one of the in-coupling diffraction grating or out-coupling diffraction grating may be polarization dependent. For example, at least one of the in-coupling diffraction grating or out-coupling diffraction grating may selectively diffract a light having a first polarization, and transmit a light having a different polarization with negligible or no diffraction.

In some embodiments, at least one of the in-coupling diffraction grating or the out-coupling diffraction grating may include 1D or 2D periodic structures (e.g., ridges) configured (e.g., etched) in the substrate 501 or the solid crystal film 503. In some embodiments, the 1D or 2D periodic ridges may be configured (e.g., etched) in an upper portion of the substrate 501 shown in FIG. 5A. In some embodiments, the 1D or 2D periodic ridges may be configured (e.g., etched) in an upper portion and/or a lower portion of the solid crystal film 503 shown in FIG. 5A. In some embodiments, at least one of the in-coupling diffraction grating or the out-coupling diffraction grating may include 1D or 2D periodic ridges configured (e.g., etched) in a separate polymer or glass disposed at the optical waveguide 500. In some embodiments, at least one of the in-coupling diffraction grating or the out-coupling diffraction grating may be formed from volume holograms recorded in a photosensitive material.

Figure 5B:
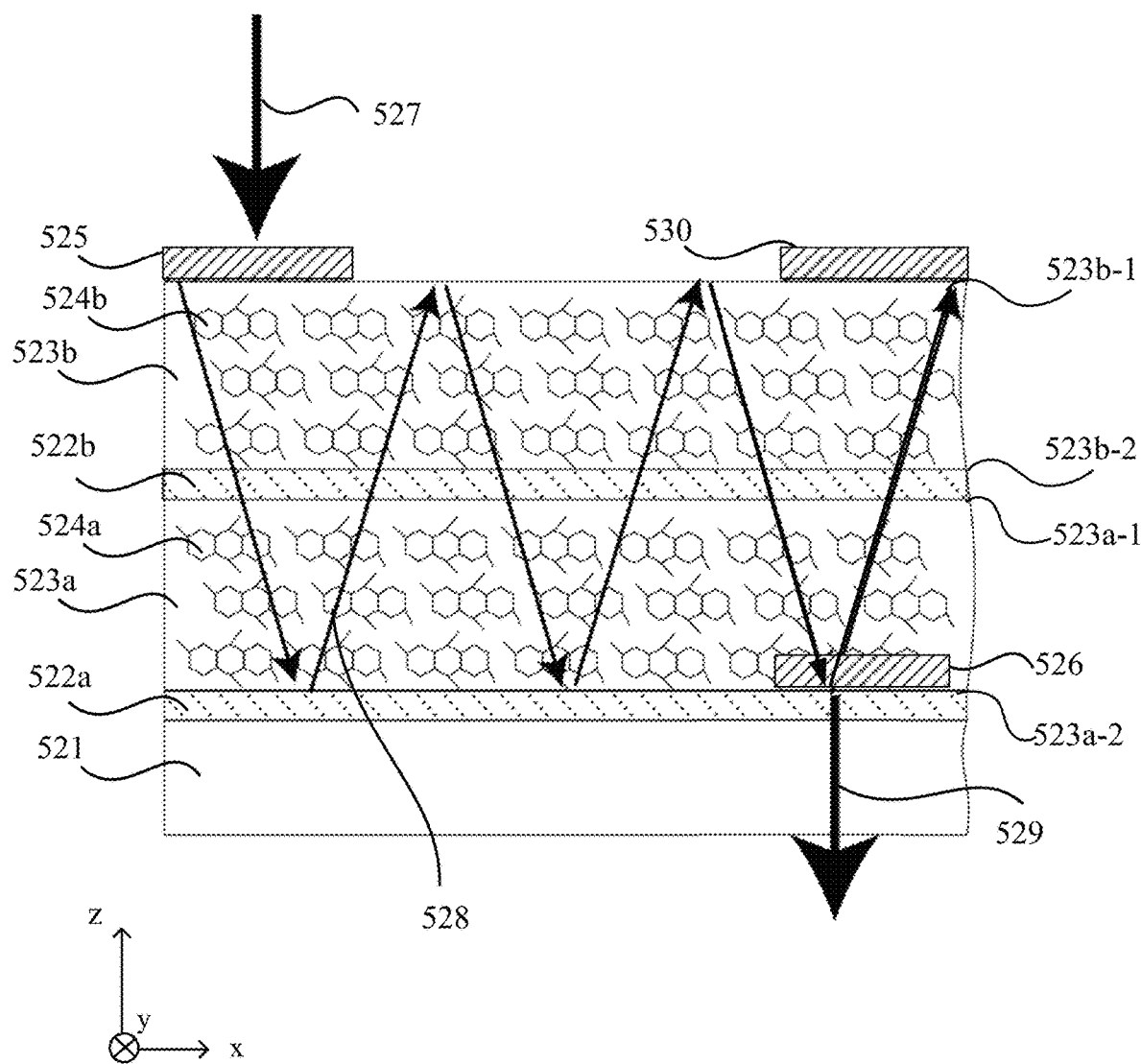

FIG. 5B schematically illustrates an x-z sectional view of an optical waveguide 520 with in-coupling and out-coupling elements, according to an embodiment of the present disclosure. The optical waveguide 520 shown in FIG. 5B may include structures or elements that are the same as or similar to those included in the optical devices shown in FIGS. 1A-4C (e.g., the optical device 260 shown in FIG. 2D). The optical waveguide 520 may include structures or elements that are the same as or similar to those included in the optical waveguide 500 shown in FIG. 5A. Descriptions of the same or similar structures or elements included in the embodiment shown in FIG. 5B can refer to the above descriptions.

As shown in FIG. 5B, the optical waveguide 520 may be a flat optical waveguide. The optical device 520 may include a stack of multiple continuous solid crystal films and multiple alignment structures alternately arranged. Crystal molecules included in a solid crystal film may be at least partially aligned by an alignment structure, on which the solid crystal film is disposed. For illustrative purposes, the optical device 520 shown in FIG. 5B may include a substrate 521, a first solid crystal film 523a and a second solid crystal film 523b, and a first alignment structure 522a and a second alignment structure 522b. The first alignment structure 522a may be disposed at (e.g., on) a surface (e.g., a top surface) of the substrate 521. The first solid crystal film 523a may be disposed at (e.g., on) a surface (e.g., a top surface) of the first alignment structure 522a. The second alignment structure 522b may be disposed at (e.g., on) a surface (e.g., a top surface) of the first solid crystal film 523a. The second solid crystal film 523*b* may be disposed at (e.g., on) a surface (e.g., a top surface) of the second alignment structure 522*b*.

The first alignment structure 522*a* may include or define a first alignment structure pattern for at least partially aligning at least a portion of crystal molecules 524*a* included in the first solid crystal film 523*a*. The crystal molecules 524*a* may be aligned in a first predetermined alignment pattern, which may or may not be the same as the first alignment structure pattern. The second alignment structure 522*b* may include or define a second alignment structure pattern for at least partially aligning at least a portion of crystal molecules 524*b* included in the second solid crystal film 523*b*. The crystal molecules 524*b* may be aligned in a second predetermined alignment pattern, which may or may not be the same as the second alignment structure pattern. The first alignment structure pattern may or may not be the same as the second alignment structure pattern. In other words, the first alignment structure may or may not be the same as the second alignment structure.

The crystal molecules 524*a* included in the first solid crystal film 523*a* may or may not have the same properties as the crystal molecules 524*b* included in the second solid crystal film 523*b*. In some embodiments, crystal molecules 524*a* may be the same type of crystal molecules as the crystal molecules 524*b*. In some embodiments, the crystal molecules 524*a* may be aligned in the first predetermined alignment pattern, and the crystal molecules 524*b* may be aligned in the second predetermined alignment pattern. The first predetermined alignment pattern may or may not be the same as the second predetermined alignment pattern. In the embodiment shown in FIG. 5B, crystal molecules 524*a* included in the first solid crystal film 523*a*, and crystal molecules 524*b* included in the second solid crystal film 523*b* are spatially uniformly aligned in a same predetermined alignment pattern (e.g., a same predetermined direction such as the x-axis direction shown in FIG. 5B).

The optical waveguide 520 may include one or more in-coupling elements 525 configured to couple an input light 527 into the optical waveguide 520. The in-coupled light 527 may propagate as a light 528 within the optical waveguide 520 via TIR. The optical waveguide 520 may include one or more out-coupling elements 526 configured to couple the light 528 out of the optical waveguide 520 as an output light 529. The in-coupling element 525 and the out-coupling element 526 may be disposed at various combinations of locations in the optical waveguide 520. For example, as shown in FIG. 5B, the in-coupling element 525 and the out-coupling element 526 may be disposed at a first side (surface) 523*b*-1 of the second solid crystal film 523*b* and a second side (surface) 523*a*-2 of the first solid crystal film 523*a*, respectively. In some embodiments, the in-coupling element 525 and the out-coupling element 526 may each include one or more 1D or 2D diffraction gratings.

In some embodiments, the optical waveguide 520 may also include a directing element 530 configured to redirect the light 528 propagating inside the optical waveguide 520 via TIR to the out-coupling element 526. The directing element 530 may be disposed at a suitable location (or portion) of the optical waveguide 520. For example, the directing element 530 may be disposed at a first side (surface) 523*b*-1 of the second solid crystal film 523*b*, and may face the out-coupling element 526 disposed at a second side (surface) 523*a*-2 of the first solid crystal film 523*a*. In some embodiments, the directing element 530 and the out-coupling element 526 may have a similar structure. The directing element 530 may include, for example, a 1D or 2D diffraction gratings. The period of the diffraction grating may be configured, such that the directing element 530 may direct the light 528 propagating inside the optical waveguide 520 via TIR toward the out-coupling element 526 at a predetermined incident angle. In some embodiments, the directing element 530 may be referred to as a folding grating. In some embodiments, multiple functions, e.g., redirecting, folding, and/or expanding a pupil of the optical waveguide 520 may be combined in a single diffraction grating, e.g. an out-coupling diffraction grating. In some embodiments, the above-mentioned gratings may be divided in a plurality of sections (or subgratings) to provide other functions, such as for tiling a field of view ("FOV"), delivering single-color images of different colors, etc.

In some embodiments, the disclosed optical device having spatial uniform orientations of axes of the crystal molecules in the solid crystal film, such as the optical devices shown in FIGS. 2A-4C, may function as a phase retarder. Referring to FIG. 2B as an example, to effectively change the phase of a transmitted light, a linearly polarized light incident onto the optical device 220 may align its polarization axis substantially along the alignment direction 225 (e.g., the x-axis direction) of the crystal molecules 224. The optical device 220 functioning as a phase retarder may alternatively or additionally be effectively configured to function as a polarization management component in an optical device or an optical system. For example, when the phase retarder 220 is configured to provide a half-wave birefringence for lights in a predetermined wavelength spectrum (e.g., visible spectrum), a linearly polarized input light having a first polarization direction may be converted into a linearly polarized output light having a second polarization direction perpendicular to the first polarization direction, or a circularly polarized input light may be converted into a circularly polarized output light having a reversed handedness. When the phase retarder 220 is configured to provide a quarter-wave birefringence for lights in a predetermined wavelength spectrum (e.g., visible spectrum), a linearly polarized input light may be converted into a circularly polarized output light or vice versa.

Figure 6A:
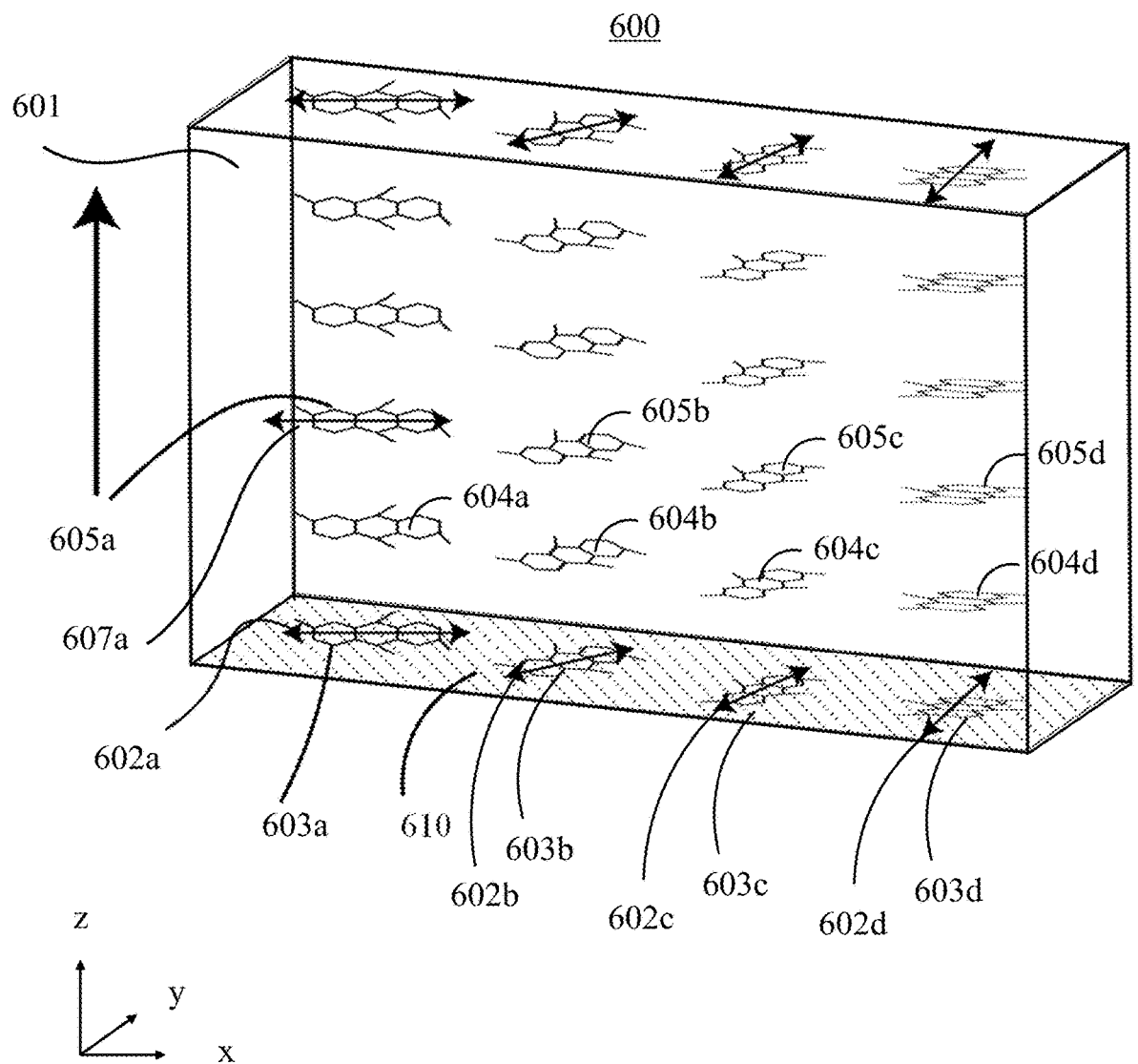
FIGS. 6A-6C schematically illustrate three-dimensional ("3D") diagrams of spatially varying orientations of axes of crystal molecules in solid crystal films, according to various embodiments of the present disclosure.
Figure 6B:
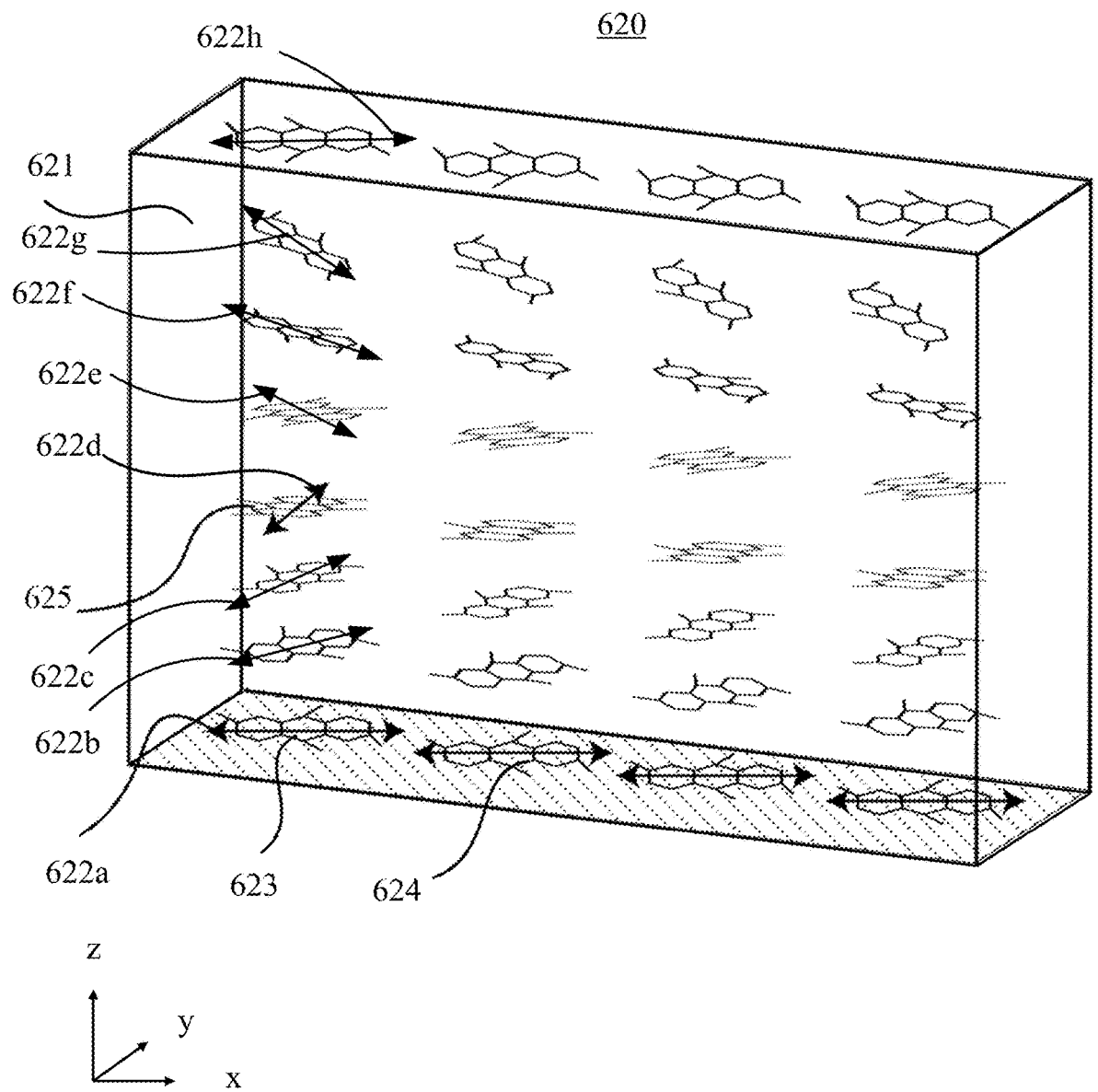
Figure 6C:
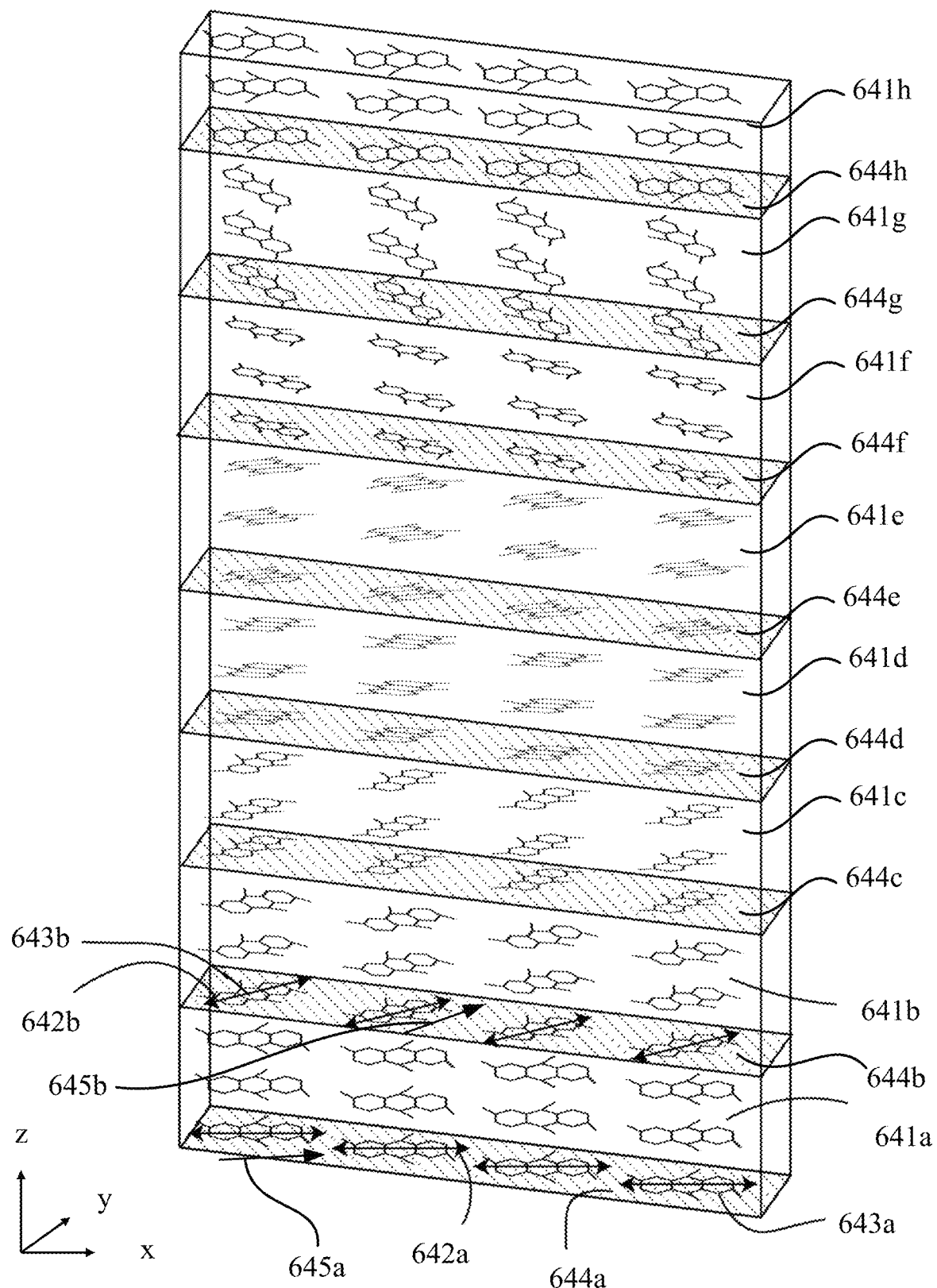

FIGS. 6A-6C illustrate 3D schematic views of spatially varying orientations of the axes of crystal molecules in respective solid crystal films, according to various embodiments of the present disclosure. When the orientations of the axes of the crystal molecules vary spatially, the orientation of the axis of the solid crystal may also vary spatially within the solid crystal film. The solid crystal films and alignment structures shown in FIGS. 6A-6C may have structures or components that may be the same as or similar to those described above (e.g., those described above in connection with the optical device 100 shown in FIG. 1A). Descriptions of the solid crystal films and alignment structures included in the embodiments shown in FIGS. 6A-6C can refer to the above descriptions (including, e.g., those rendered in connection with the embodiment shown in FIG. 1A).

As shown in FIG. 6A, an optical device 600 may include a solid crystal 601 (which may be in a form of a layer, a film, or a plate). For discussion purposes, the solid crystal 601 may be referred to as a solid crystal film 601. The solid crystal film 601 may be disposed on an alignment structure 610. In some embodiments, the solid crystal film 601 may be formed on the alignment structure 610 by a suitable crystal growth process. For illustrative purposes, the alignment structure 610 is shown as a thin layer. The alignment structure 610 may define or include an alignment structure pattern for at least partially aligning crystal molecules of the solid crystal film 601.

The solid crystal film 601 may include a plurality of crystal molecules. The crystal molecules be disposed on the alignment structure 610 in layers. For example, the embodiment shown in FIG. 6A shows 6 layers of crystal molecules. For illustrative purposes, only the first layer of crystal molecules 603a-603d (also referred to as a first plurality of crystal molecules 603), the second layer of crystal molecules 604a-604d (also referred to as a second plurality of crystal molecules 604), and the third layer of crystal molecules 605a-605d (also referred to as a third plurality of crystal molecules 605) are labeled.

The first plurality of crystal molecules 603 may be in contact with the alignment structure 610. The second plurality of crystal molecules 604 and the third plurality of crystal molecules 605 may be disposed or stacked over or on the first plurality of crystal molecules 603, and may not be in contact with the alignment structure 610. The alignment structure 610 may at least partially align the crystal molecules included in the solid crystal film 601. For example, the first plurality of crystal molecules 603 that are in contact with the alignment structure 610 may be aligned in the alignment structure pattern provided by the alignment structure 610.

As shown in FIG. 6A, the first plurality of crystal molecules 603a-603d may not be aligned in the same direction or orientation. In other words, the orientations of the axes of the crystal molecules are spatially varying. Reference number 602a-602d indicates an axis of a crystal molecule (along which the refractive index may be the largest). As shown in FIG. 6A, the axes 602a-602d of the first plurality of crystal molecules 603a-603d may not be aligned in the same direction or orientation. Crystal molecules in each layer in the z-axis direction (e.g., the first plurality of crystal molecules 603) may have spatially varying orientations and/or alignments in a plane (e.g., the x-y plane) parallel to a surface (e.g., top surface) of the alignment structure 604. This pattern may be at least partially defined by the alignment structure pattern of the alignment structure 610. As a result, an orientation of an axis of the solid crystal may also be spatially varying within the solid crystal 601.

In each layer of crystal molecules in the x-y plane, an orientation of an axis of a crystal molecule may be rotated by a predetermined rotation angle relative to an orientation of an axis of a neighboring crystal molecule. For example, each of the first plurality of crystal molecules 603a-603d may have its corresponding axis rotated by a predetermined rotation angle relative to a neighboring crystal molecule in the same layer (i.e., in the same x-y plane). For example, the orientation of the axis 602b of the crystal molecule 603b may be rotated by a first predetermined rotation angle relative to the orientation of the axis 602a of the crystal molecule 603a. The orientation of the axis 602c of the crystal molecule 603c may be rotated by a second predetermined rotation angle relative to the orientation of the axis 602b of the crystal molecule 603b. The orientation of the axis 602d of the crystal molecule 603d may be rotated by a third predetermined rotation angle relative to the orientation of the axis 602c of the crystal molecule 603c. The first predetermined rotation angle, the second predetermined rotation angle, and the third predetermined rotation angle may or may not be the same. In some embodiments, the first predetermined rotation angle, the second predetermined rotation angle, and the third predetermined rotation angle may be the same. In some embodiments, at least two of the first predetermined rotation angle, the second predetermined rotation angle, and the third predetermined rotation angle may be different.

The first plurality of crystal molecules 603 that are in contact with the alignment structure 610 may be aligned in the alignment structure pattern of the alignment structure 610. The second and the third plurality of crystal molecules 604 and 605 (and other crystal molecules in other layers) may or may not follow the same alignment pattern as the first plurality of crystal molecules 603. In the embodiment shown in FIG. 6A, the second and the third plurality of crystal molecules 604 and 605 (and other crystal molecules in other layers) follow the same alignment pattern as the first plurality of crystal molecules 603. That is, orientations of the axes of the crystal molecules disposed or stacked over the first plurality of crystal molecules 603 follow the same orientations of the axes of the first plurality of crystal molecules 603. In other words, in each layer of crystal molecules disposed over the first plurality of crystal molecules 603, the orientation of the axis of each crystal molecule is the same as the orientation of the axis of a corresponding crystal molecule located at a lower layer. For example, the orientation of the axis of the crystal molecule 604b is the same as the orientation of the axis of the crystal molecule 603b, and the orientation of the axis of the crystal molecule 605b is the same as the orientation of the axis of the crystal molecule 604b, and so on. As shown in FIG. 6A, the orientation of an axis 607a of the crystal molecule 605a in the third layer is the same as the orientation of the axis 602a of the crystal molecule 603a in the first layer. The crystal molecule 603a and the crystal molecule 605a are in the same column in the z-axis direction.

As shown in FIG. 6B, an optical device 620 may include a solid crystal film 621, and an alignment structure 624. The solid crystal film 621 may be disposed on the alignment structure 624. In some embodiments, the solid crystal film 621 may be a cholesteric crystal film. In some embodiments, the solid crystal film 621 may include chiral crystal molecules or crystal molecules doped with chiral dopants, and the optical device 620 may exhibit chirality, i.e., handedness.

The solid crystal film 621 may include a first plurality of crystal molecules 623 and a second plurality of (i.e., the remaining) crystal molecules 625 stacked or disposed over the first plurality of crystal molecules 623. The first plurality of crystal molecules 623 may be in contact with an alignment structure 624 and remaining (i.e., the second plurality of) crystal molecules 625 may not be in contact with the alignment structure 624. Crystal molecules 623 in contact with the alignment structure 624 may be spatially uniformly aligned within a surface (e.g., a top surface within the x-y plane) of the alignment structure 624. The second plurality of crystal molecules 625 may be stacked in a twisted helical structure in a direction (e.g., the z-axis direction) perpendicular to the surface of the alignment structure 624.

In FIG. 6B, the reference number 622a-622h indicates the orientation of an axis of a crystal molecule in each layer. In the embodiment shown in FIG. 6B, in each layer, the orientations of the axes of the crystal molecules are the same (e.g., spatially uniform in the layer). As shown in FIG. 6B, orientations of axes 622a of the crystal molecules 623 in contact with the alignment structure 624 may be spatially uniform. That is, the axes 622a of the first plurality of crystal molecules 623 are aligned in the same direction or orientation. The orientations of the axes of the second plurality of crystal molecules 625 disposed over the first plurality of crystal molecules 623 may have a helical twist in the direction (e.g., the z-axis direction) perpendicular to the surface of the alignment structure 624. As shown in FIG. 6B, the orientation of each axis 622b-622h may be rotated by a predetermined rotation angle relative to an orientation of axis in a lower layer. The predetermined rotation angles between two neighboring layers in the z-axis direction may be the same or may be different (or at least two rotation angles may be different). In some embodiments, the handedness of the twisted helical structure or the helical twist (e.g., the rotation directions of the axes of the crystal molecules) may be determined by the types of chiral crystal molecules or the chiral dopants. A pitch of the twisted helical structure or the helical twist may be determined by a helical twist power of chiral crystal molecules or a helical twist power and a concentration of the chiral dopants.

For illustrative purposes, FIG. 6B shows one cholesteric crystal film 621. In some embodiments, a plurality of cholesteric crystal films may be stacked, one over another, or side by side, where neighboring cholesteric crystal films may be separated from each other by an alignment structure disposed between two neighboring cholesteric crystal films. Orientations of axes of the crystal molecules in the respective cholesteric crystal films may have a helical twist in the direction (e.g., the z-axis direction) perpendicular to the surface of the alignment structures along which a portion of the crystal molecules are aligned. In some embodiments, the helical twists in neighboring cholesteric crystal films may have opposite handedness. In some embodiments, the helical twists in neighboring cholesteric crystal films may have the same handedness.

FIG. 6C illustrates a 3D schematic view of an optical device 640 including a stack of multiple solid crystal films 641a-641h separated by respective alignment structures 644a-644h. As shown in FIG. 6C, orientations of axes of crystal molecules in the solid crystal films 641a-641h may be rotated (e.g., gradually rotated) from one solid crystal film to another along a direction (e.g., the z-axis direction) perpendicular to a surface of an alignment structure (or a surface of a substrate where the stack 640 may be disposed at). In some embodiments, the optical device 640 may function as an optical rotator.

In a first solid crystal film 641a, axes 642a of crystal molecules 643a in contact with a first alignment structure 644a may be substantially oriented in a first direction or orientation 645a within the x-y plane, and axes of other crystal molecules disposed over the crystal molecules 643a in the first solid crystal film 641a may substantially follow the first orientation 645a. That is, the orientations of the axes of the crystal molecules in the first solid crystal film 641a may be spatially uniform. As a result, the orientation of the axis of the solid crystal 641a may be spatially non-varying (e.g., constant). In a second solid crystal film 641b, axes 642b of crystal molecules 643b in contact with a second alignment structure 644b may be substantially oriented in a second direction or orientation 645b within the x-y plane, and axes of other crystal molecules disposed over the crystal molecules 643b within the second solid crystal film 641b may substantially follow the same second orientation 645b. The second direction or orientation 645b may be the same as or different from the first direction or orientation 645a. For example, in some embodiments, the second direction or orientation 645b may be rotated by an angle of about 15° with respect to the first direction or orientation 645a. Orientations of axes of crystal molecules in the remaining solid crystal films 641c-641h may be determined by the alignment structures 644a-644h, respectively. The orientations of axes of crystal molecules in the remaining solid crystal films 641c-641h may be rotated (e.g., gradually rotated) from one solid crystal film to another along the direction (e.g., the z-axis direction) perpendicular to a surface of the first alignment structure 644a (or a surface of a substrate where the stack may be disposed). Each of the alignment structures 644a-644h in the stack may reset or realign the orientations of the crystal molecules disposed thereon in the respective solid crystal films 641a-641h, which may effectively rotate the axes of the solid crystal films 641a-641h along the z-axis direction.

A PBP optical element may have a spatially varying optic axis in a plane perpendicular to a direction of propagation of a light beam. Such a plane may also be referred to as a transverse plane or as an in-plane. LCs have been used to fabricate PBP optical elements by spatially varying LC directors in the transverse plane. Optical characteristics of the PBP optical elements based on LCs may depend on the refractive index and/or birefringence of LCs. For example, an angular and diffraction bandwidth of a polarization selective grating may increase as the birefringence of LCs increases. Currently available LCs may have a refractive index up to about 1.97 and a birefringence up to about 0.3. PBP optical elements based on materials having a higher refractive index and a larger birefringence are highly desirable to reduce the size and weight and to enhance the optical characteristics. The present disclosure provides PBP optical elements based on the disclosed solid crystal having a spatially varying orientation of axis in the transverse plane. That is, the orientation of the axis of the solid crystal may be configured vary spatially in the transverse plane, thereby forming a solid crystal based PBP optical element. In some embodiments, the PBP optical element fabricated based on the solid crystal may have a thickness of about 500 nm to about 5 μm.

The orientation of the axis of the solid crystal in the transverse plane may be referred to as an in-plane orientation of the axis of the solid crystal. In some embodiments, the spatially varying in-plane orientation of the axis of the solid crystal may be realized by configuring spatially varying in-plane orientations of the axes of the crystal molecules included in the solid crystal. In some embodiments, the in-plane orientations of the axes of the crystal molecules included in the solid crystal may be configured by aligning the crystal molecules in a predetermined in-plane alignment pattern. In some embodiments, the predetermined in-plane alignment pattern of the crystal molecules may be provided by an alignment structure on which the solid crystal is configured (e.g., grown), as described above.

Figure 7B:
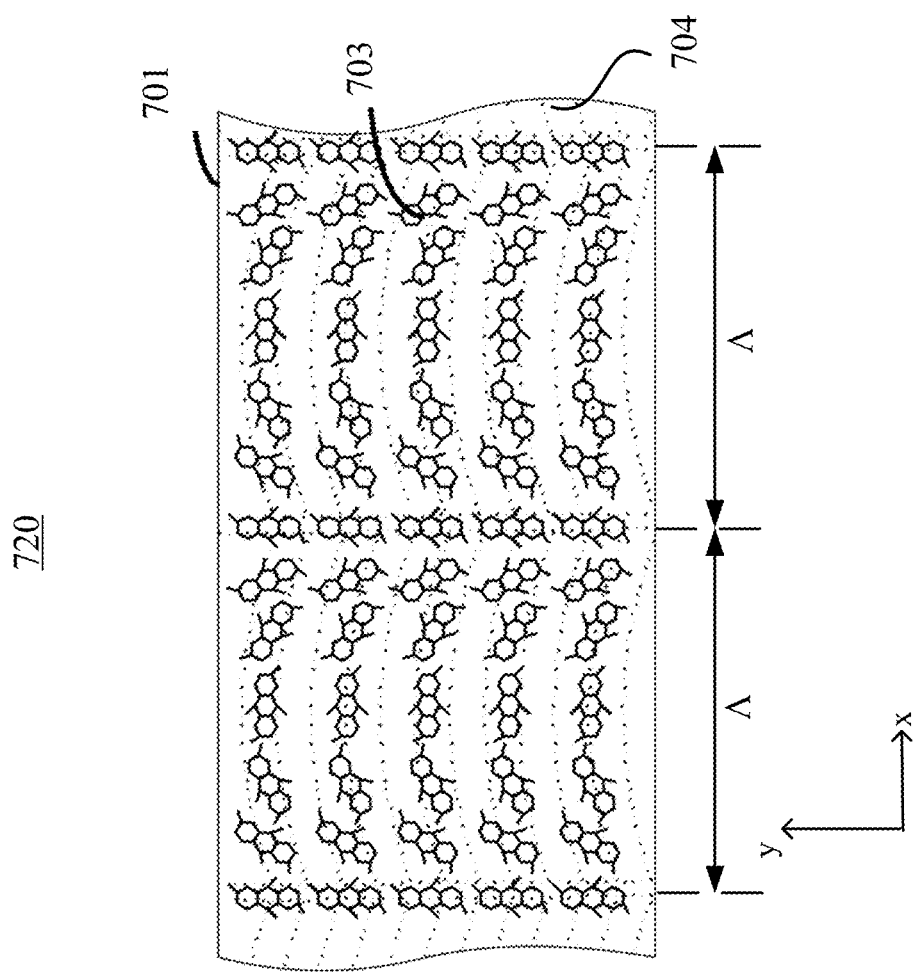
FIG. 7B schematically illustrates a cross-sectional view of orientations of axes of crystal molecules of the PBP optical device shown in FIG. 7A when the PBP optical device functions as a PBP grating, according to an embodiment of the present disclosure.
Figure 7A:
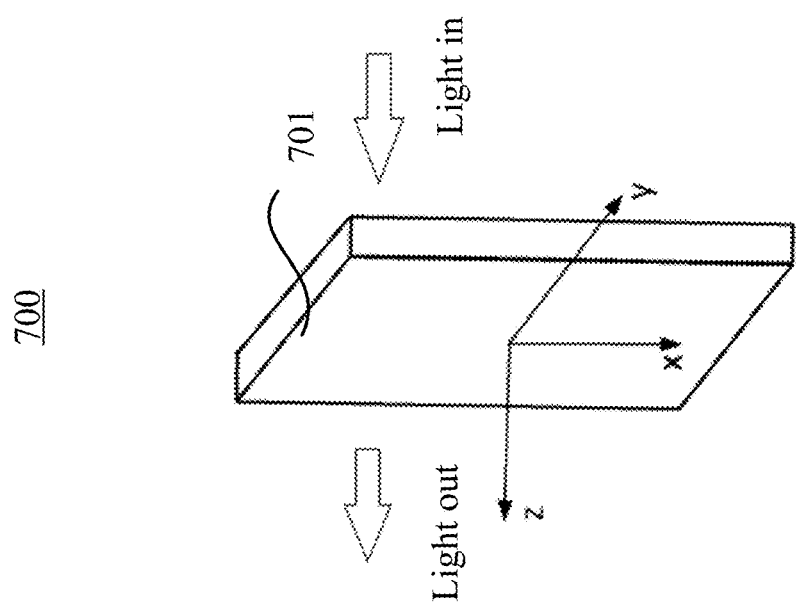
FIG. 7A schematically illustrates a diagram of a transmissive-type Pancharatnam Berry Phase ("PBP") optical device, according to an embodiment of the present disclosure.

FIG. 7A illustrates a diagram of a transmissive-type PBP optical element or device 700, which may include a disclosed solid crystal or solid crystal film 701, according to an embodiment of the present disclosure. The solid crystal (or solid crystal film) 701 may be an embodiment of any of the solid crystals described above and herein. In some embodiments, the PBP optical device 700 may also include one or more alignment structures, which are not shown in FIG. 7A. In some embodiments, the PBP optical device 700 may include one or more substrates, which are not shown in FIG. 7A. According to the in-plane alignment pattern of the crystal molecules (or in-plane orientations of axes of the crystal molecules) in the solid crystal film 701, the PBP optical device 700 may operate as a transmissive-type PBP optical device to provide one or more optical functions, such as functioning as a prism, a lens, a beam refractor, a lens array, a prism array, or a combination thereof.

FIG. 7B schematically illustrates an x-y sectional view of a portion of orientations 720 of crystal molecules 703 when the PBP optical device 700 in FIG. 7A functions as a PBP grating 700, according to an embodiment of the present disclosure. As shown in FIGS. 7A and 7B, the PBP grating 700 may include an alignment structure 704 configured to at least partially align crystal molecules 703 in the solid crystal film 701. For example, the crystal molecules 703 that are in contact with the alignment structure 704 may be aligned by the alignment structure 704, and the remaining crystal molecules 703 in the solid crystal film 701 may follow the alignment of neighboring crystal molecules 703 that haven been aligned. The crystal molecules 703 in the solid crystal film 701 may be periodically and linearly aligned along one or both in-plane directions, such that orientations of the axes of the crystal molecules 703 in the solid crystal film 701 may vary periodically and linearly along one or both in-plane directions.

For illustrative purposes, FIG. 7B shows that the orientations of the axes of the crystal molecules 703 may vary periodically and linearly along one in-plane direction (e.g., an x-axis direction in FIG. 7B). The in-plane orientations of the axes of the crystal molecules 703 may vary in a linearly repetitive pattern along the x-axis direction with a uniform pitch A. The pitch A of the PBP grating 700 may be half of the distance along the x-axis between repeated portions of the pattern. The pitch A may determine, in part, the optical properties of PBP grating 700. For example, a circularly polarized light incident along the optical axis (e.g., z-axis) of the PBP grating 700 may have a grating output including primary, conjugate, and leakage light corresponding to diffraction orders m=+1, −1, and 0, respectively. The pitch A may determine the diffraction angles of the diffracted light in the different diffraction orders. In some embodiments, the diffraction angle for a given wavelength of light may increase as the pitch A decreases.

In some embodiments, the PBP grating 700 may be a passive PBP grating having (or that can operate in) two optical states, a positive state and a negative state. The optical state of the PBP grating 700 may depend on the handedness of a circularly polarized input light and the handedness of the rotation of the crystal molecules in PBP grating 700. FIG. 7C and FIG. 7D schematically illustrate diagrams of a positive state and a negative state of the PBP grating 700, respectively, according to an embodiment of the present disclosure. In some embodiments, as shown in FIG. 7C, the PBP grating 700 may operate in a positive state in response to a right-handed circularly polarized ("RHCP") input light 705, and may diffract the RHCP input light 705 at a specific wavelength to a positive angle (e.g., +θ).

As shown in FIG. 7D, the PBP grating 700 may operate in a negative state in response to a left-handed circularly polarized ("LHCP") light input 707, and may diffract the LHCP input light 707 at a specific wavelength to a negative angle (e.g., −θ). In addition, the PBP grating 700 may reverse the handedness of a circularly polarized light transmitted through the PBP grating 700 in addition to diffracting the light. For example, in the configuration shown in FIG. 7C, the RHCP input light 705 may be converted to an LHCP output light 706 after passing through the PBP grating 700. In the configuration shown in FIG. 7D, the LHCP input light 707 may be converted to an RHCP output light 708 light after passing through the PBP grating 700. In some embodiments, the PBP grating 700 may operate in a positive state in response to an LHCP input light, and operate in a negative state in response to an RHCP input light. For an unpolarized input light at a specific wavelength, the PBP grating 700 may diffract an RHCP component and an LHCP component of the unpolarized input light a positive angle (e.g., +θ) and a negative angle (e.g., −θ), respectively. Thus, the PBP grating 700 may function as a circular polarization beam splitter.

In some embodiments, the PBP grating 700 may be switchable between the positive state and negative state when the handedness of a circularly polarized input light is switched by another optical device. For example, an active polarization switch may be coupled to the PBP grating 700. The PBP grating 700 may receive a light output from the active polarization switch. The active polarization switch may control (e.g., switch) the handedness of a circularly polarized light incident onto the PBP grating 700, thereby controlling the optical state of the PBP grating 700. The active polarization switch may maintain the handedness of a circularly polarized light or reverse the handedness of a circularly polarized light, in accordance with an operating state (e.g., a non-switching state or a switching state) of the active polarization switch. The switching speed of the active polarization switch may determine the switching speed of the PBP grating 700. In some embodiments, the active polarization switch may include a switchable half-wave plate ("SHWP").

In some embodiments, the PBP grating 700 may be operated in a neutral state when the solid crystal (or solid crystal film) 701 in the PBP grating 700 is configured to be at the amorphous state. In the neutral state, the PBP grating 700 may not diffract an input light, and may or may not affect the polarization of the light transmitted through the PBP grating 700. In some embodiments, the PBP grating 700 may be switchable between the positive or negative state and the neutral state, through switching the solid crystal 701 between the aligned crystal state and the amorphous state. In some embodiments, the solid crystal 701 may be switchable between the aligned crystal state and the amorphous state through various methods, for example, through a polarization based switching, a thermal based switching, or an external field based switching, etc. In some embodiments, the PBP grating 700 may function as an active PBP grating that is switchable between the positive or negative state and the neutral state.

Figure 8A:
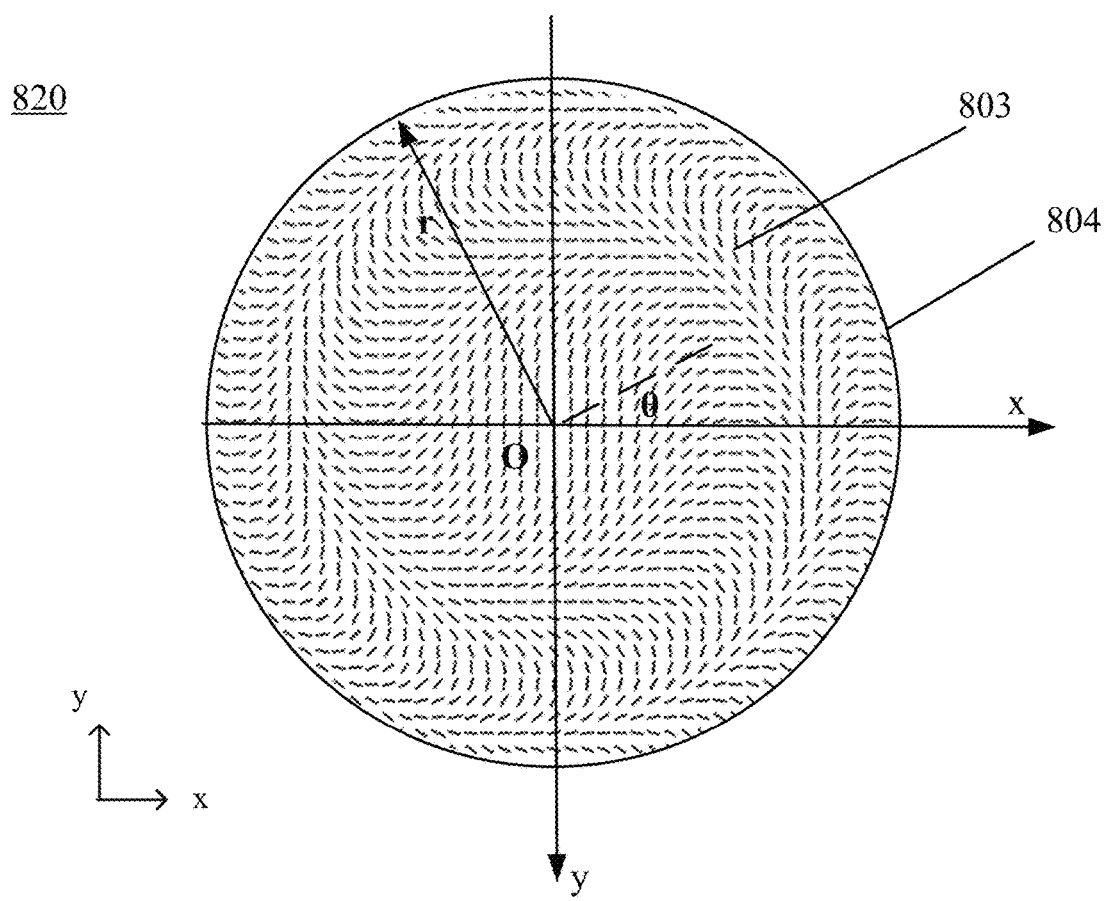
FIG. 8A schematically illustrates a cross-sectional view of orientations of axes of crystal molecules when the PBP optical device shown in FIG. 7A functions as a PBP lens, according to an embodiment of the present disclosure.
Figure 8B:
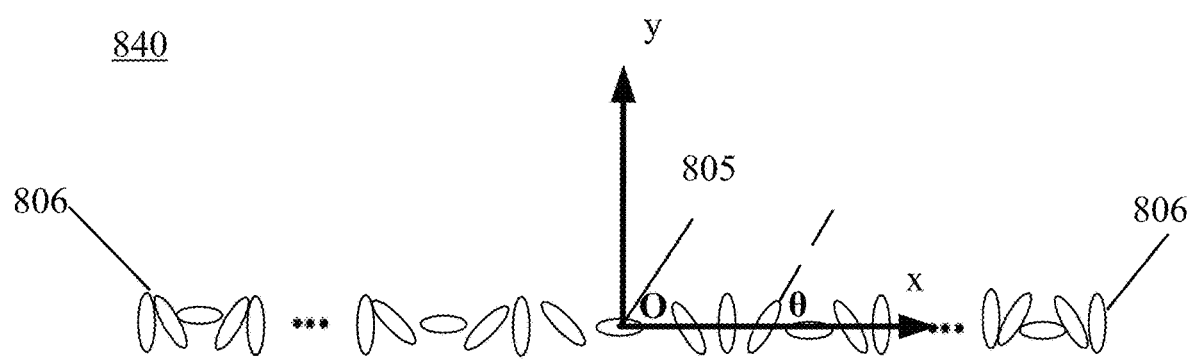
FIG. 8B illustrates a sectional view of a portion of orientations of crystal molecules taken along an x-axis in the PBP lens shown in FIG. 8A, according to an embodiment of the disclosure.

FIG. 8A schematically illustrates an x-y sectional view of a portion of orientations 820 of crystal molecules 803 when the PBP optical device 700 shown in FIG. 7A functions as a PBP lens 700, according to an embodiment of the present disclosure. FIG. 8B illustrates a section of a portion of orientations 820 of crystal molecules 803 taken along an x-axis in PBP lens 700 shown in FIG. 8A, according to an embodiment of the disclosure. To simplify the illustration, each crystal molecule 803 included in the solid crystal film 701 is represented by a small rod in FIG. 8A, where each rod is depicted as having a longitudinal direction (or a length direction) and a lateral direction (or a width direction). That is, each molecule 803 is depicted as having a longitudinal direction (or a length direction) and a lateral direction (or a width direction), and an axis of the molecule 803 is presumed to be in the longitudinal direction of the molecule 803, along the presumed axis of the highest refractive index for the molecule 803. The longitudinal direction (or the length direction) and the lateral direction (or the width direction) of the small rod may correspond to the longitudinal direction (or the length direction) and the lateral direction (or the width direction) of the molecule 803, respectively.

As shown in FIG. 7A and FIG. 8A, the PBP lens 700 may include an alignment structure 804 configured to at least partially align the crystal molecules 803 included in the solid crystal film 701. For example, the crystal molecules 803 that are in contact with the alignment structure 804 may be aligned by the alignment structure 804, and the remaining crystal molecules 803 (e.g., those disposed over the crystal molecules that are in contact with the alignment structure 804) included in the solid crystal film 701 may follow the alignment of neighboring crystal molecules 803 that haven been aligned. Orientations of the axes of the crystal molecules 803 included in the solid crystal film 701 may vary periodically along an in-plane radial direction (e.g., a radius direction).

The PBP lens 700 may generate a lens profile based on the in-plane orientations of the axes of the crystal molecules 803, in which the phase difference may be T=2θ, where θ is the angle between the orientation of the axis of the crystal molecule 803 and the x-axis direction. Referring to FIG. 8A and FIG. 8B, the orientations of the axes of the crystal molecules 803 may vary continuously from a center (O) 805 to an edge 806 of the PBP lens 700, with a variable pitch Λ. A pitch is defined as a distance between the crystal molecules 803, in which the orientation of the axis of the crystal molecule 803 is changed (via rotation) by about 180° from an initial state. The pitch ($\Lambda_0$) at the center 805 is the largest, and the pitch ($\Lambda_r$) at the edge 806 is the smallest, i.e., $\Lambda_0 > \Lambda_1 > \ldots > \Lambda_r$. In the x-y plane, for the PBP lens 700 with a lens radius (r) and a lens focus (+/−f), the θ may satisfy $$\theta = \frac{\pi r^2}{2 f \lambda},$$

where λ is the wavelength of an incident light. The continuous in-plane rotation of the axes of the crystal molecules 803 may accelerate by moving toward the edge 806 from the center (O) 805 of the PBP lens 700, such that the period of the obtained periodic structure (e.g., pitch) may decrease.

Figure 8D:
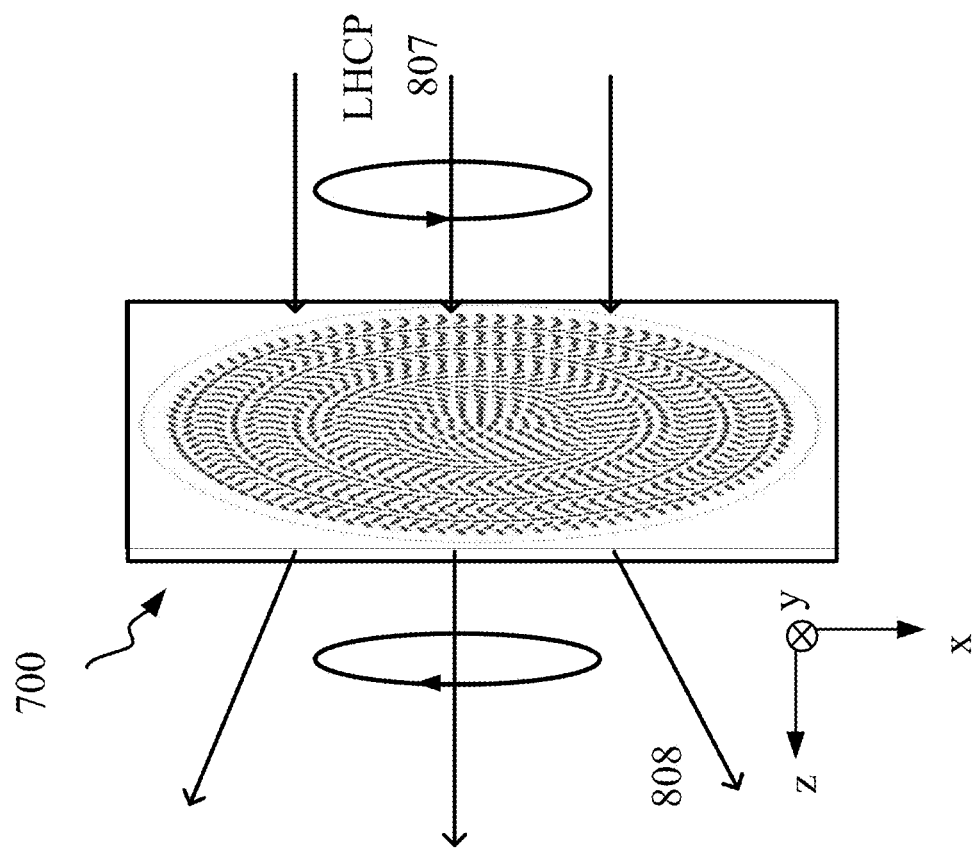
FIGS. 8C and 8D schematically illustrate diagrams of a focusing state and a defocusing state of the PBP lens shown in FIG. 8A, respectively, according to embodiments of the present disclosure.
Figure 8C:
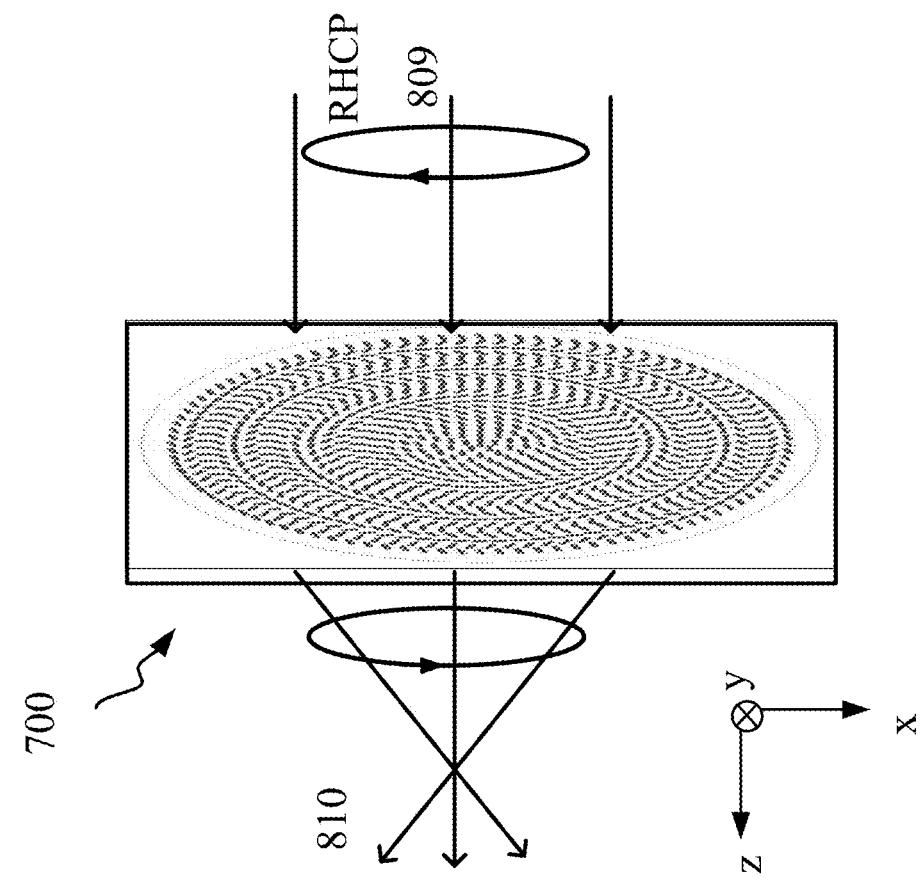

The PBP lens 700 may be a passive PBP lens 700 having two optical states: a focusing state and a defocusing state. The optical state of the PBP lens 700 may depend on the handedness of a circularly polarized light incident onto the passive PBP lens 700 and the handedness of the rotation of the crystal molecules in PBP lens 700. FIG. 8C and FIG. 8D schematically illustrate diagrams of a focusing state and a defocusing state of the PBP lens 700, respectively, according to an embodiment of the present disclosure. To simplify the illustration, the crystal molecules 803 included in the solid crystal film 701 are represented by small rods in FIG. 8C and FIG. 8D. In some embodiments, as shown in FIG. 8C, the PBP lens 700 may operate in a focusing state in response to an RHCP input light 809 and may have a positive focus of "f." As shown in FIG. 8D, the PBP lens 700 may operate in a defocusing state in response to an LHCP input light 807 and may have a negative focus of "−f." In addition, the PBP lens 700 may reverse the handedness of a circularly polarized light transmitted through the PBP lens 700 in addition to focusing and/or defocusing the light. For example, in the configuration shown in FIG. 8C, the RHCP input light 809 may be converted to an LHCP output light 810 after passing through the PBP lens 700. In the configuration shown in FIG. 8D, the LHCP light input 807 may be converted to an RHCP output light 808 light after passing through the PBP lens 700. In some embodiments, the PBP lens 700 may operate in a defocusing state in response to an LHCP input light, and operate in a focusing state in response to an RHCP output light.

Similar to the passive PBP grating, the PBP lens 700 may be switchable between the focusing state and defocusing state when the handedness of a circularly polarized incident light is switched by another optical device. For example, an active polarization switch may be coupled to the PBP lens 700. The PBP lens 700 may receive a light output from the active polarization switch. The active polarization switch may control (e.g., switch) the handedness of a circularly polarized light incident onto the PBP lens 700, thereby controlling the optical state of the PBP lens 700. The active polarization switch may maintain the handedness of a circularly polarized light or reverse the handedness of a circularly polarized light after transmitted through the active polarization switch, in accordance with an operating state (e.g., a non-switching state or a switching state) of the active polarization switch. The switching speed of the active polarization switch may determine the switching speed of the PBP lens 700. In some embodiments, the active polarization switch may include an SHWP.

In some embodiments, the PBP lens 700 may be operated in a neutral state when the solid crystal (or solid crystal film) 701 in the PBP lens 700 is configured to be at the amorphous state. In the neutral state, the PBP lens 700 may not focus or defocus an input light, and may or may not affect the polarization of the light transmitted through the PBP lens 700. In some embodiments, the PBP lens 700 may be switchable between the focusing or defocusing state and the neutral state through switching the solid crystal 701 between the aligned crystal state and the amorphous state. In some embodiments, the solid crystal 701 may be switchable between the aligned crystal state and the amorphous state through various methods, for example, through a polarization based switching, a thermal based switching, or an external field based switching, etc. In some embodiments, the PBP lens 700 may function as an active PBP lens that is switchable between the focusing or defocusing state and the neutral state.

Figure 9A:
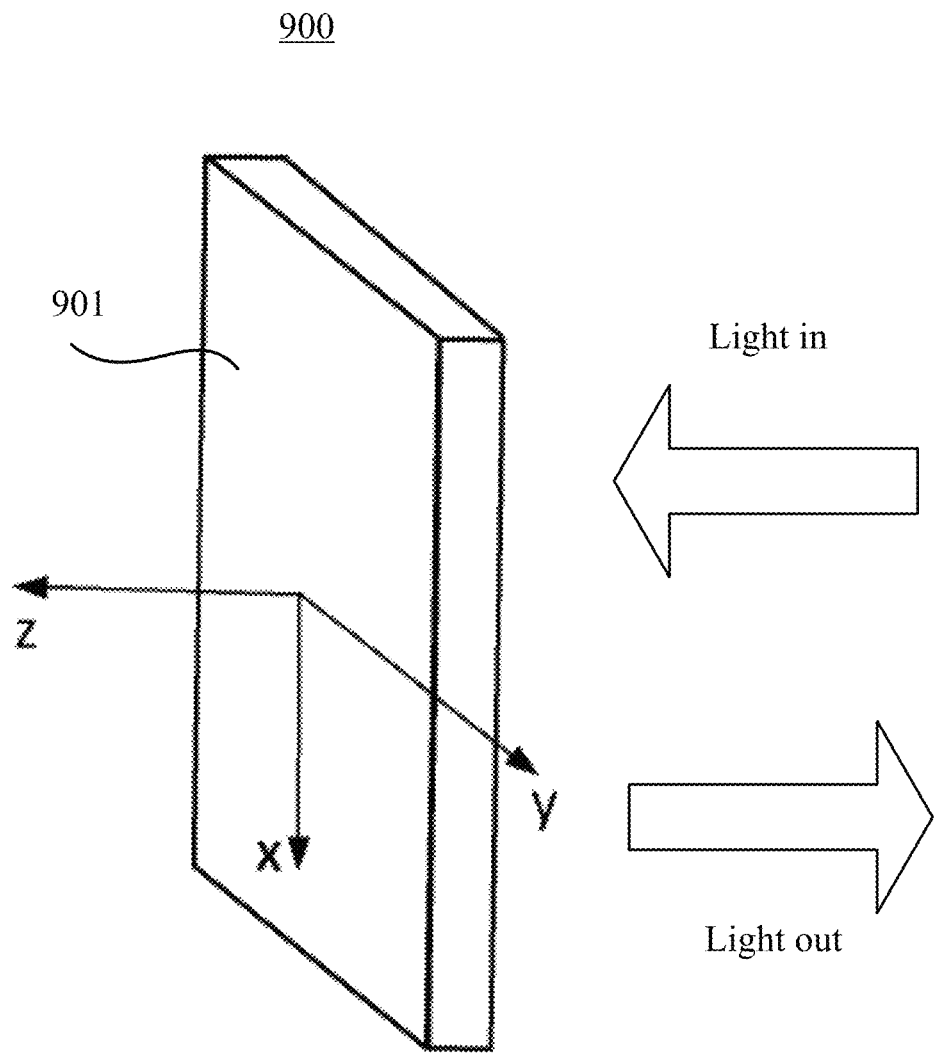
FIG. 9A schematically illustrates a diagram of a reflective-type PBP optical device, according to an embodiment of the present disclosure.

In addition to the transmissive-type PBP optical elements or devices shown in FIGS. 7A-7D and FIGS. 8A-8D, reflective-type PBP optical elements or devices may also be realized based on the disclosed solid crystals. FIG. 9A illustrates a diagram of a reflective-type PBP optical element or device 900, which may include a solid crystal or solid crystal film 901. The solid crystal film 901 may be an embodiment of any of the solid crystals or solid crystal films described above and herein. In some embodiments, the PBP optical device 900 may also include one or more alignment structures, which are not shown in FIG. 9A. In some embodiments, the PBP optical device 900 may also include one or more substrates, which are not shown in FIG. 9A. According to the in-plane alignment pattern of the crystal molecules (or in-plane orientations of axes of the crystal molecules) in the solid crystal film 901, the PBP optical device 900 may operate as a reflective-type PBP optical device having one or more optical functions.

Figure 9B:
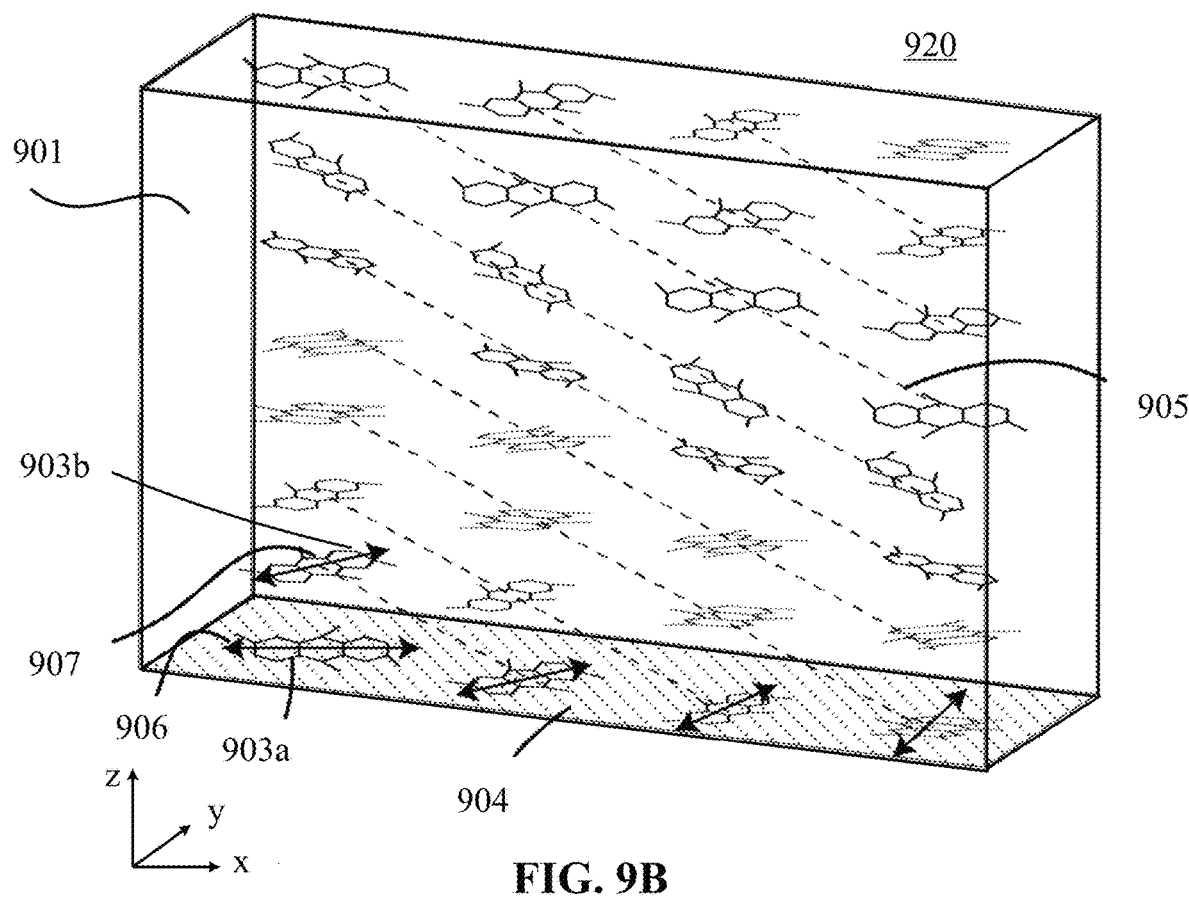
FIG. 9B schematically illustrates a 3D diagram of spatially varying orientations of axes of crystal molecules when the PBP optical device shown in FIG. 9A functions as a reflective polarization volume hologram ("PVH") grating, according to an embodiment of the present disclosure.
Figure 9C:
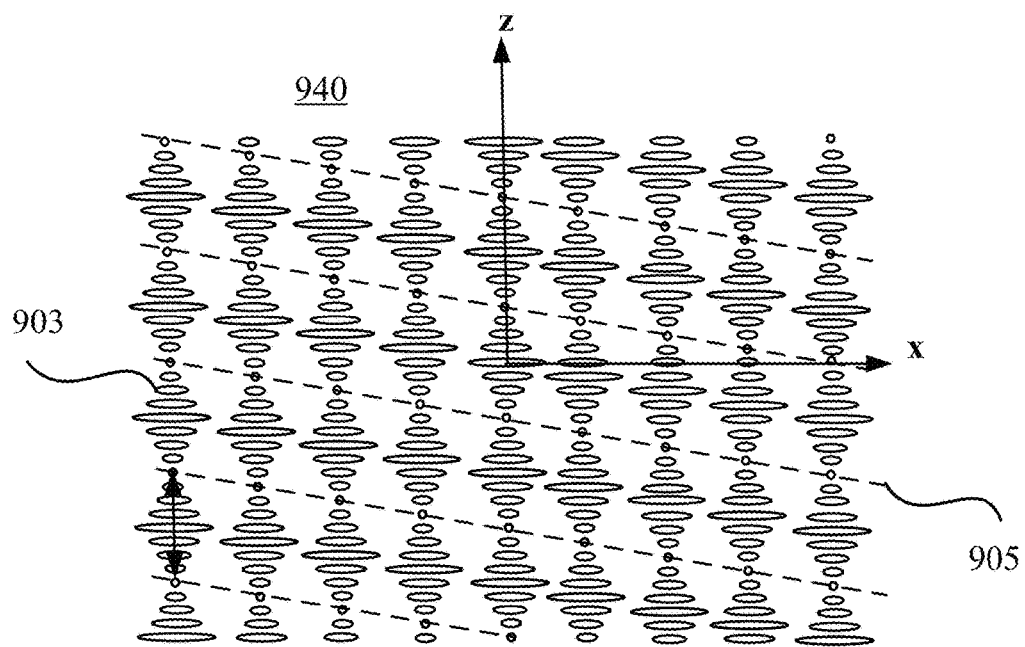
FIG. 9C schematically illustrates a cross-sectional view of orientations of axes of crystal molecules when the PBP optical device shown in FIG. 9A functions as a reflective PVH grating, according to an embodiment of the present disclosure.

FIG. 9B schematically illustrates a 3D diagram of a portion of orientations of axes of crystal molecules 903 (represented by 903a, 903b) included in a solid crystal film 901 of an optical device 920, and FIG. 9C schematically illustrates an x-z sectional view of orientations 940 of axes of crystal molecules 903 when the PBP optical device in FIG. 9A functions as a reflective PBP grating. For discussion purposes, each molecule 903 in FIG. 9B is depicted as having a longitudinal direction (or a length direction) and a lateral direction (or a width direction), an axis of the molecule 903 is presumed to be in the longitudinal direction of the molecule 903, along the presumed axis of a highest refractive index for the molecule 903. To simplify the illustration of the orientations of axes of crystal molecules 903 across the entire solid crystal film 901, each crystal molecules 903 included in the solid crystal film 901 are represented by small rods in FIG. 9C, where each rod is depicted as having a longitudinal direction (or a length direction) and a lateral direction (or a width direction). The longitudinal direction (or the length direction) and the lateral direction (or the width direction) of the small rod may correspond to the longitudinal direction (or the length direction) and the lateral direction (or the width direction) of the molecule 903, respectively.

The reflective PBP grating, due to its physical properties, may also be referred to as a reflective polarization volume grating ("PVG"). As shown in FIGS. 9B and 9C, in some embodiments, the solid crystal film 901 may be a cholesteric crystal film 901. In some embodiments, the solid crystal film 901 may include chiral crystal molecules or crystal molecules doped with chiral dopants, and the solid crystal may exhibit chirality, i.e., handedness. Axes 906 of crystal molecules 903a that are in contact with an alignment structure 904 may vary periodically and linearly along one of the in-plane directions (e.g., the x-axis in FIG. 9B). Axes 907 of the crystal molecule 903b stacked above the crystal molecules 903a in contact with the alignment structure 904 may twist in a helical fashion along a direction (e.g., the z-axis direction in FIG. 9B) perpendicular to a surface of the solid crystal film 901, e.g., a thickness direction of the solid crystal film 901. Such orientations of the axes of the crystal molecules 903 generated by the alignment structure 904 may result in periodic and slanted planes 905 of constant refractive index within the solid crystal film 901. In other words, the crystal molecules 903 from different layers of crystal molecules having the same orientations of the axes may form slanted periodic planes 905 of a constant refractive index within the solid crystal film 901.

Different from the transmissive PBP grating that diffracts an input light via modulating the phase of the input light, the reflective PVG 900 may diffract an input light through Bragg reflection (or slanted multiplayer reflection). The reflective PVG 900 may primarily diffract a circularly polarized light having a handedness that is the same as the handedness of the helical structure of the reflective PVG 900, and primarily transmit a light having other polarizations without changing the polarization of the transmitted light. For example, when a circularly polarized input light has a handedness that is opposite to the handedness of the helical structure of the reflective PVG 900, the input light may be primarily transmitted to the 0-th order, and the polarization of the transmitted light may be substantially retained (e.g., unaffected). The diffraction efficiency of the reflective PVG 900 may be a function of the thickness of the solid crystal film 901. For example, the diffraction efficiency of the reflective PVG 900 may increase monotonically with the thickness and then gradually saturate (e.g., remain substantially constant).

The optical elements or devices in accordance with embodiments of the present disclosure may be implemented in a variety of fields. Such implementations are within the scope of the present disclosure. In some embodiments, the disclosed optical elements or devices may be implemented as multifunctional optical components in near-eye displays ("NEDs") for augmented reality ("AR"), virtual reality ("VR"), and/or mixed reality ("MR"). For example, the disclosed optical elements or devices may be implemented as waveguide-based combiners, eye-tracking components, accommodation components for realizing multiple focuses or a variable focus, display resolution enhancement components, pupil steering elements, and polarization controlling components (e.g., a quarter-wave plate or a half-wave plate), etc., which may significantly reduce the weight and size, and enhance the optical performance of the NEDs.

Figure 10A:
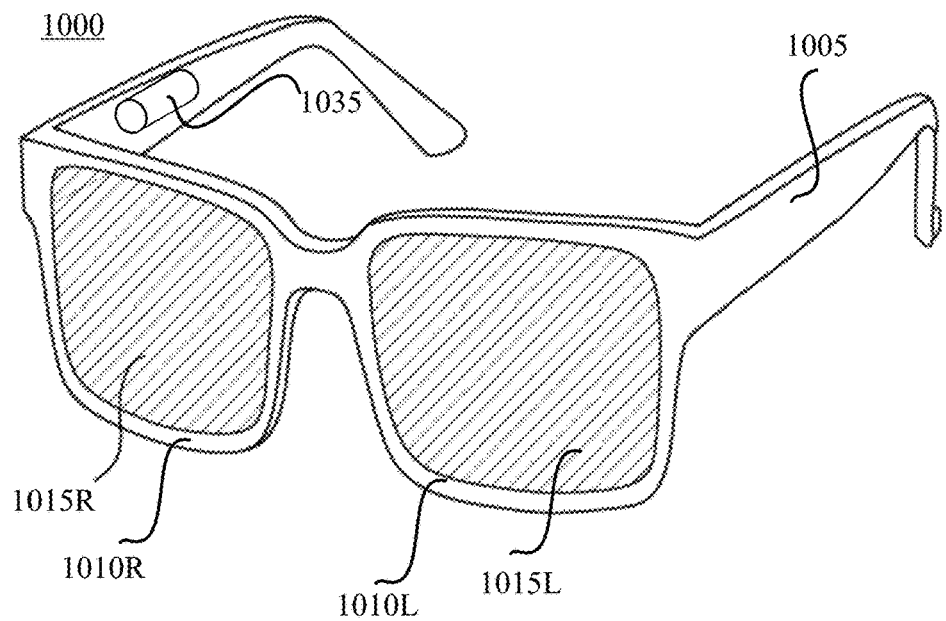
FIG. 10A schematically illustrates a diagram of a near-eye display ("NED"), according to an embodiment of the present disclosure.
Figure 10B:
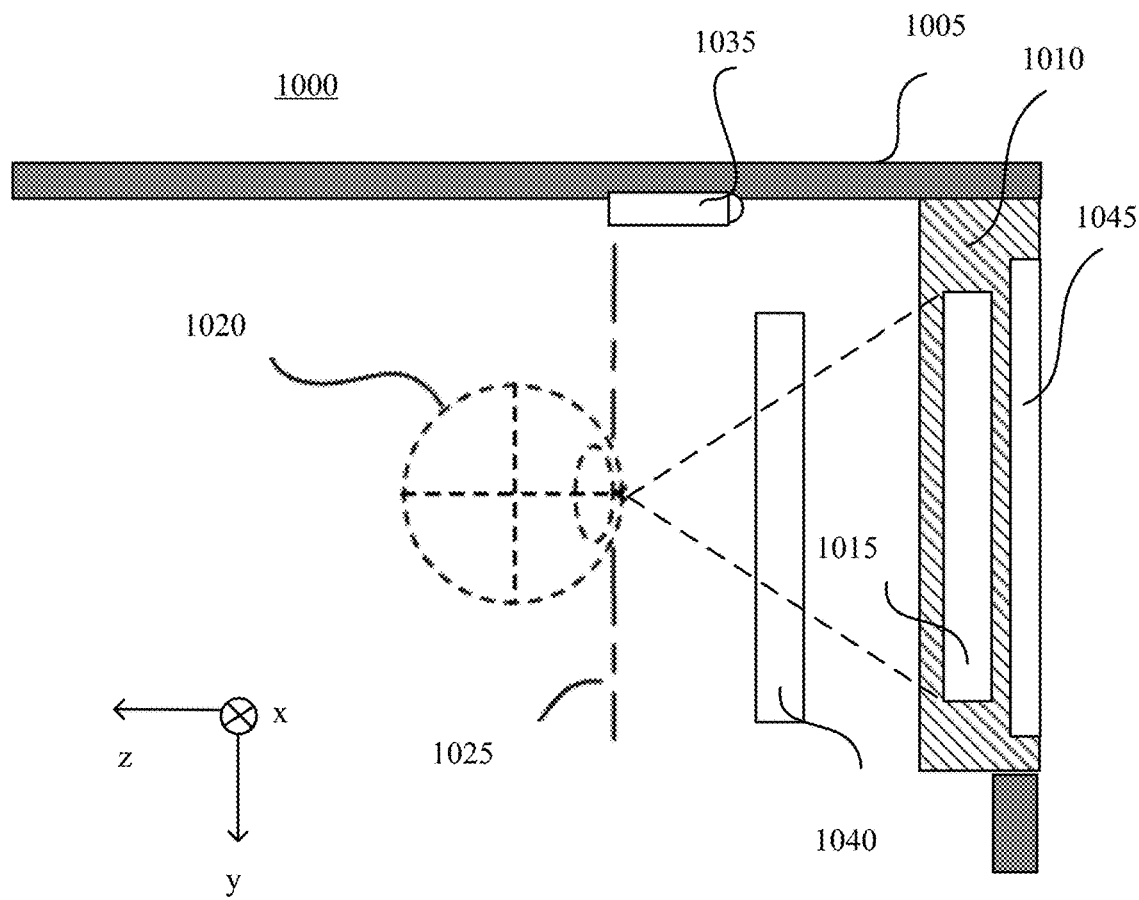
FIG. 10B schematically illustrates a top, cross-sectional view of a portion of the NED shown in FIG. 10A, according to an embodiment of the present disclosure.

FIG. 10A illustrates a diagram of an NED 1000 according to an embodiment of the present disclosure. FIG. 10B illustrates a cross-sectional top view of a half of the NED 1000 shown in FIG. 10A according to an embodiment of the present disclosure. The NED 1000 may include one or more of the disclosed optical elements or devices, such as the waveguide, PBP lens, PBP grating, or reflective PVH grating. As shown in FIG. 10A, the NED 1000 may include a frame 1005 configured to be worn by a user. The NED 1000 may include a left-eye display system 1010L and a right-eye display system 1010R, which are mounted to the frame 1005. Each of the left-eye display system 1010L and the right-eye display system 1010R may include one or more image display components configured to project computer-generated virtual images onto a left display window 1015L and a right display window 1015R in the user's FOV. An example of the left-eye display system 1010L and the right-eye display system 1010R may include a waveguide display system. For illustrative purposes, FIG. 10A shows that the display system may include a light source assembly 1035 coupled to (e.g., mounted on) the frame 1005. The NED 1000 may function as a VR device, an AR device, an MR device, or a combination thereof. In some embodiments, when the NED 1000 functions as an AR and/or an MR device, the right display window 1015R and the left display window 1015L may be fully or at least partially transparent from the perspective of the user, thereby enabling the user to view a surrounding real world environment. In some embodiments, when the NED 1000 functions as a VR device, the right display window 1015R and the left display window 1015L may be opaque, such that the user may be immersed in the VR imagery provided by the NED 1000.

FIG. 10B is a cross-sectional top view of the NED 1000 shown in FIG. 10A, according to an embodiment of the present disclosure. As shown in FIG. 10B, a display system 1010 (which may represent the right-eye display system 1010R or the left-eye display systems 1010L) may be a waveguide display system, which may include a waveguide display or a stacked waveguide display for one or more eye 1020 of the user. For example, the stacked waveguide display may be a polychromatic display (e.g., a red-green-blue ("RGB") display) including a stack of waveguide displays, the respective monochromatic light sources of which may be configured to emit lights of different colors. In some embodiments, the waveguide display system may include the light source assembly 1035 configured to generate an image light, and an output waveguide 1015 configured to output an expanded image light to the eye 1020 of the user. In some embodiments, the output waveguide 1015 may function as a waveguide-based combiner in the NED 1000 to overlay the virtual and real world images. The waveguide-based combiner may function as a display window (e.g., the left display window 1015L or the right display window 1015R). The output waveguide 1015 may include one or more in-coupling elements configured to couple a light from the light source assembly into the output waveguide. In some embodiments, the output waveguide 1015 may include one or more out-coupling (or decoupling) elements configured to couple the light out of the output waveguide toward the eye 1020 of the user. In some embodiments, the output waveguide 1015 may include one or more directing elements configured to direct the light output by the one or more coupling elements to the one or more decoupling elements.

In some embodiments, the NED 1000 may include a varifocal or multifocal block 1040. The display system 1010 and the varifocal or multifocal block 1040 together may provide the image light to an exit pupil 1025. The exit pupil 1025 may be a location where an eye 1020 of the user is positioned. For illustrative purposes, FIG. 10B shows a cross section view associated with a single eye 1020. A similar display system separate from the display system 1010, and a similar varifocal or multifocal block separate from the varifocal or multifocal block 1040, may be included in the other half of the NED 1000 (that is not shown) to direct the image light to another eye of the user.

In some embodiments, the NED 1000 may include an eye tracking system (not shown). The eye tracking system may include, e.g., one or more light sources configured to illuminate one or both eyes of the user, and one or more cameras configured to capture images of one or both eyes of the user based on the light emitted by the light sources and reflected by the one or both eyes. In some embodiments, the NED 1000 may include an adaptive dimming element 1045, which may dynamically adjust the transmittance for the real world objects viewed through the NED 1000, thereby switching the NED 1000 between a VR device and an AR device or between a VR device and an MR device. In some embodiments, along with switching between the AR and/or MR device and the VR device, the adaptive dimming element 1045 may be used in the AR and/or MR device to mitigate difference in brightness between real and virtual objects.

In some embodiments, the waveguide-based combiner 1015 may be realized by a disclosed optical device based on a solid crystal film having spatially uniform orientations of the axes of the crystal molecules within the solid crystal film, such as the waveguide 500 in FIG. 5A or the waveguide 520 in FIG. 5B. In some embodiments, the in-coupling element, the directing element, and/or the out-coupling (or decoupling) element disposed at the waveguide-based combiner 1015 may be realized by a disclosed optical device based on a solid crystal film having periodic and linear orientations of axes of the crystal molecules in an-plane direction of the solid crystal film, such as the PBP gratings 700 shown in FIG. 7A-7D, or the reflective PVG grating 900 shown in FIGS. 9A-9C. Compared to various gratings used in conventional NEDs, such as surface-relief gratings ("SRGs") and holographic gratings ("HGs"), the disclosed optical device functioning as the PBP grating may have a high efficiency over a large field of view and a broad wavelength spectrum (e.g., the band of visible wavelengths), and may provide advantages for waveguide-coupling NEDs used for VR, AR, and/or MR applications. In addition, the reflective PVG grating 900 shown in FIGS. 9A-9C may be configured to deflect a circularly polarized light having a specified handedness, and transmit a circularly polarized light having an orthogonal handedness. When reflective PVG grating 900 is used as a combiner that combines the displayed images and the real world light in the NED 1000 for AR and/or MR applications, the overall transmittance of the real world light may be increased. The waveguide combiner based on high refractive index solid crystal may be configured to increase the FOV of the waveguide based NEDs and reduce the weight of the display optics by reducing the number of combiner plates to one (from multiple) for an efficient RGB in and out-coupling. The in-coupling element, the directing element, and/or the out-coupling (or decoupling) element (e.g., gratings) based on high refractive index solid crystal may be configured to be compatible with high refractive index and high FOV waveguides for NEDs.

Further, the varifocal or multifocal block 1040 shown in FIG. 10B may be configured to adjust a distance of a light emitted from the waveguide display system, such that the light appears at predetermined focal distances from the eye(s) 1020 of the user. The varifocal or multifocal block 1040 may include one or more varifocal or multifocal structures arranged in an optical series. A varifocal or multifocal structure may be referred to as an optical device configured to dynamically adjust its focus in accordance with instructions from a controller. The varifocal or multifocal structure may include one or more single-focus lenses having a fixed optical power and/or one or more variable-focus or multi-focus lenses having an adjustable (or variable) optical power. The one or more multi-focus lenses may be realized by the disclosed optical devices based on a solid crystal film having non-periodic orientations of axes of the crystal molecules in in-plane radial directions of the solid crystal film, such as the PBP lens 700 shown in FIG. 8A-8D.

The above-mentioned applications of the disclosed optical devices in the NEDs are merely for illustrative purposes. In addition, the disclosed optical devices based on solid crystals may also be used to realize eye-tracking components, display resolution enhancement components, and pupil steering elements, etc., which is not limited by the present disclosure. The disclosed optical devices based on solid crystals may be light-weight, thin, compact, and customized. Thus, through using the disclosed optical devices as multifunctional optical components in the NEDs, the weight and size of NEDs may be significantly reduced while the optical performance and appearance may be enhanced, therefore opening up the possibilities to the futuristic smart glasses.

In addition, the disclosed solid crystal formed on one or more alignment structures may be implemented in electronic devices to improve electronic performances thereof. Conventional solid crystals, such as polycyclic hydrocarbons, have been used as organic semiconductors in various organic electronic devices, such as field-effect transistors ("FETs"), thin-film transistors ("TFTs"), photovoltaics, etc., in the field of flexible electronics. It has been demonstrated that changing the lattice constant of a conventional solid crystal (for example, compressing the conventional solid crystal) may enhance the charge carrier mobility and, thus, enhance the electronic transport properties of the organic electronic devices. The disclosed solid crystals formed (e.g., grown) on one or more alignment structures may be configured to have a controllable amount of strain, through adjusting the alignment structure so that a certain desirable crystal lattice may be achieved for the crystal. In some embodiments, the strain may vary across the solid crystal, e.g., the stain may vary in the same device based on the disclosed solid crystal. In some embodiments, the strain may vary across multiple solid crystals disposed at (e.g., on) the same substrate, e.g., the strain may vary across multiple devices including the respective solid crystals. In some embodiments, the strain may vary in a specific spatial pattern (such as a PBP type pattern), which may aid in novel electronic transport properties.

Figure 11A:
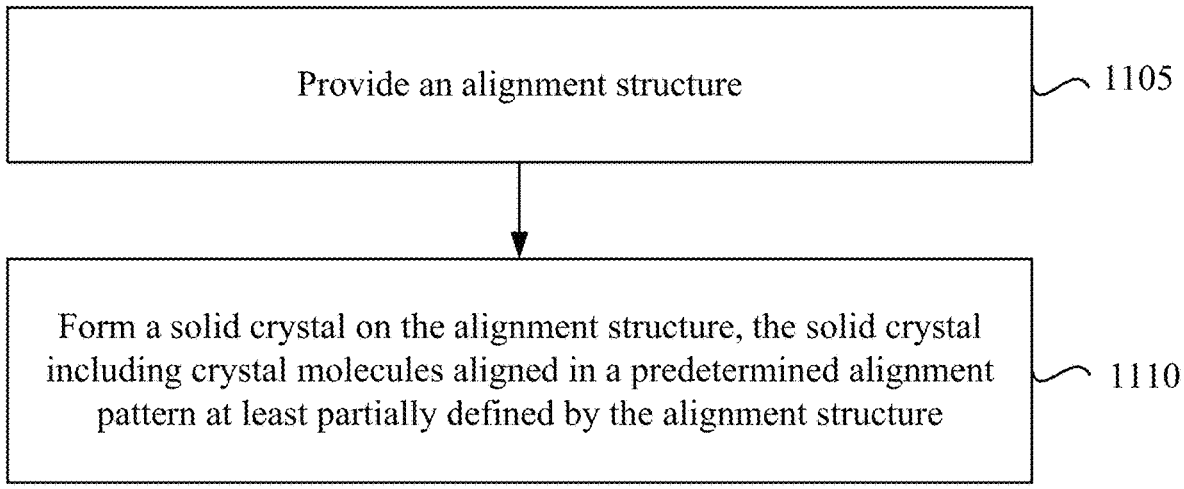

The present disclosure also provides various methods for fabricating the disclosed optical elements or devices, which are formed based on solid crystals. Such optical elements or devices may include the PBP optical elements or optical waveguides disclosed herein and described above. For example, FIG. 11A is a flowchart illustrating a method 400 for fabricating an optical device. The optical device may include a solid crystal. Method 1100 may include providing an alignment structure (step 1105). Various methods may be used to provide the alignment structure. For example, the alignment structure may be provided on a substrate. In some embodiments, the alignment structure may be formed (e.g., deposited, coated) as a separate element on a surface of the substrate. In some embodiments, the alignment structure may be integrally formed on or at least partially in the surface of the substrate through a suitable process (e.g., etching). In some embodiments, the alignment structure may be provided without using the substrate. For example, the alignment structure may be a pre-fabricated structure. The alignment structure may include or define an alignment structure pattern.

In some embodiments, providing the alignment structure may include at least one of: forming a photoalignment layer on a surface of a substrate by processing a photosensitive material by a light; forming a mechanically rubbed alignment layer on the surface of the substrate; forming an alignment layer with anisotropic nanoimprint on the surface of the substrate; forming an anisotropic relief directly on the surface of the substrate through wet or dry etching of the surface of the substrate; forming the alignment structure on the surface of the substrate based on a ferroelectric or ferromagnetic material deposited on the surface of the substrate; providing a crystalline layer or a crystalline substrate that defines an alignment pattern as the alignment structure; or forming the alignment structure on the surface of the substrate by crystallization in the presence of a magnetic or electric field.

Method 1100 may also include forming a solid crystal on the alignment structure, the solid crystal including crystal molecules aligned in a predetermined alignment pattern at least partially defined by the alignment structure (step 1110). Various methods may be used to form the solid crystal (or solid crystal film, layer, or plate) on the alignment structure. For example, in some embodiments, the solid crystal may be grown on the alignment structure based on a molten solid crystal material. Thus, forming the solid crystal on the alignment structure may include growing the solid crystal on the alignment structure. In some embodiments, forming the solid crystal on the alignment structure is performed using at least one of the following processes: a vapor deposition including at least one of an organic crystal molecule beam epitaxy, or a hot wall epitaxy of organic crystal molecules; a solvent assisted deposition via a thermal alignment, a mold alignment, or a surface alignment; a polymer assisted continuous casting; a temperature assisted zone annealing; a physical vapor transport (may also be referred to as physical vapor deposition); a spin coating; or a crystal growth process based on a molten crystal material.

Method 1100 may include other processes not shown in FIG. 11A. For example, in some embodiments, multiple alignment structures may be provided, and multiple solid crystals (or solid crystal layers) may be formed. The alignment structure may be a first alignment structure, the predetermined alignment pattern may be a first predetermined alignment pattern, the solid crystal may be a first solid crystal, and the crystal molecules may be first crystal molecules. Method 1100 may also include providing a second alignment structure on the first solid crystal; and forming a second solid crystal on the second alignment structure. The second solid crystal may include second crystal molecules aligned in a second predetermined alignment pattern, which is at least partially defined by the second alignment structure.

In some embodiments, the solid crystal formed by method 1100 may be optically anisotropic with a principal refractive index of at least about 1.5 and an optical anisotropy (e.g., birefringence) of at least about 0.1. The principal refractive index of the solid crystal may be a refractive index in a direction parallel to an axis of the solid crystal. The axis of the solid crystal may be an axis along which the solid crystal has a highest refractive index.

Figure 11B:
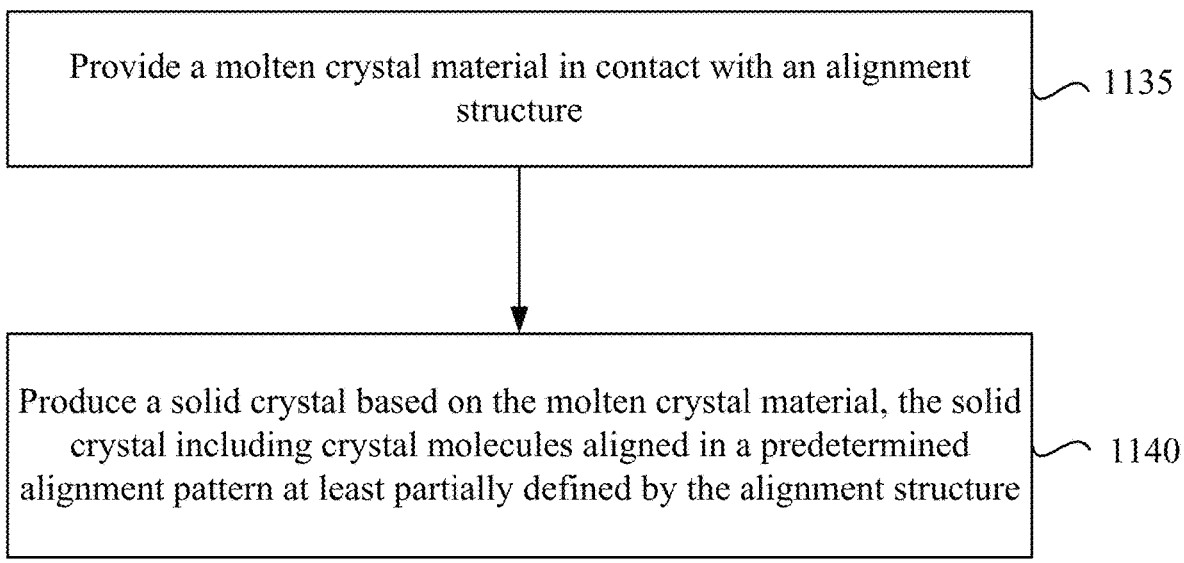

FIG. 11B is a flowchart illustrating a method 1130 for fabricating an optical device, which may include a solid crystal. Method 1130 may include providing a molten crystal material in contact with an alignment structure (step 1135). Various methods may be used to provide the molten crystal material and the alignment structure that are in contact with one another. In some embodiments, the molten crystal material may be coated onto the alignment structure. In some embodiments, the molten crystal material may be deposited onto the alignment structure. In some embodiments, the molten crystal material may be introduced into a container and the alignment structure may be provided at at least one wall (e.g., bottom wall, side walls) of the container. In some embodiments, the alignment structure may be dipped or inserted into the molten crystal material.

Method 1130 may also include producing a solid crystal based on the molten crystal material, the solid crystal including crystal molecules aligned in a predetermined alignment pattern at least partially defined by the alignment structure (step 1140). Various methods disclosed herein may be used to produce the solid crystal based on the molten crystal material.

Method 1130 may include other processes not shown in FIG. 11B. For example, in some embodiments, producing the solid crystal may include cooling the molten crystal material. In some embodiments, producing the solid crystal may include growing the solid crystal based on the molten crystal material by moving (e.g., pulling) a seed crystal away from a die. The die may include at least one capillary at least partially configured to allow the molten crystal material to flow therethrough during the growth of the solid crystal. The die may also include a surface having a predetermined shape and having the alignment structure. The solid crystal may grow along the surface of the die according to the alignment structure.

FIG. 11C is a flowchart illustrating a method 1150 for fabricating an optical device, which may include a solid crystal. Method 1150 may include moving a molten crystal material in a space between two substrates while maintaining contact between the molten crystal material and two surfaces of the two substrates, wherein each of the two surfaces includes an alignment structure disposed in contact with the molten crystal material (step 1155). Moving the molten crystal material may be achieved using various transportation or moving mechanisms. For example, in some embodiments, a mechanical mechanism such as a conveying belt or a robotic arm may be used to move the molten crystal material along the two substrates while maintaining contact of the molten crystal material with two surfaces of the two substrates that face each other. A thermal gradient may be maintained for the molten crystal material through a suitable temperature control device (e.g., a heating device and/or a controller). Method 1150 may also include growing, from the molten crystal material using a seed crystal, a solid crystal including crystal molecules aligned in a predetermined alignment pattern at least partially defined by the alignment structures (step 1160). Method 1150 may also include other additional or alternative steps, such as processing (e.g., by heating) a solid crystal material to produce the molten crystal material. In some embodiments, growing of the solid crystal may be achieved through other suitable methods. For example, growing of the solid crystal may be achieved through growing from organic material vapors such that there is an epitaxial growth of the vapor on the alignment structure(s). This method may also be applicable to cholesteric (or twisted) growth.

Figure 11D:
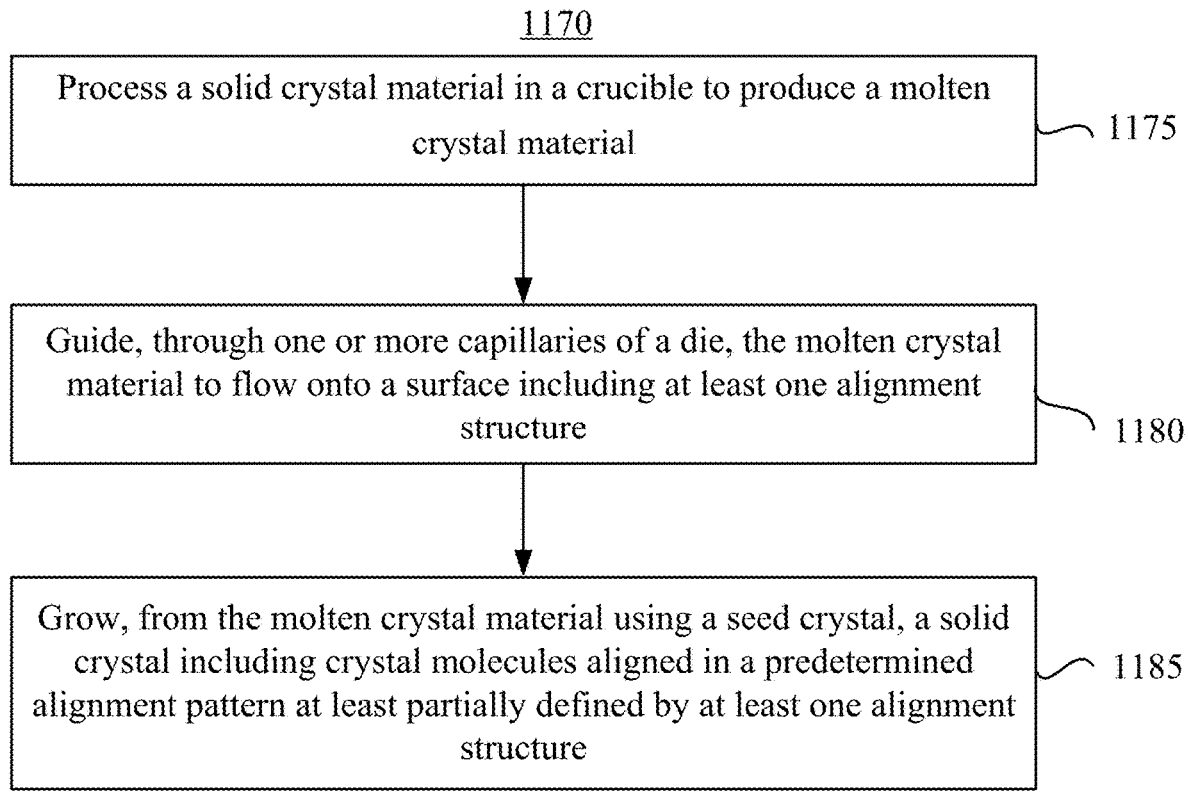

FIG. 11D is a flowchart illustrating a method 1170 for fabricating an optical device, which may include a solid crystal. Method 1170 may include processing a solid crystal material in a crucible to produce a molten crystal material (step 1175). Various suitable methods may be used to produce the molten crystal material. For example, the solid crystal material may be heated by a heating device to produce the molten crystal material. In some embodiments, the solid crystal material may be subject to a microwave or a high pressure to produce the molten crystal material. Method 1170 may also include guiding, through one or more capillaries of a die, the molten crystal material to flow onto a surface including at least one alignment structure (step 1180). Method 1170 may also include growing, from the molten crystal material using a seed crystal, a solid crystal including crystal molecules aligned in a predetermined alignment pattern at least partially defined by the at least one alignment structure (step 1185).

In some embodiments, the surface of the die may have a predetermined curved shape, and the grown solid crystal may have substantially the same curved shape as the surface of the die. In other words, a curved solid crystal and/or a curved optical device may be fabricated.

In some embodiments, growing the solid crystal may include moving the seed crystal disposed at a top portion of the die away from the die to allow the solid crystal to grow at a meniscus-crystal interface along the surface of the die. The disclosed methods may further include removing the grown solid crystal from the crucible. The disclosed methods may also include cooling the solid crystal removed from the crucible.

Figure 11E:
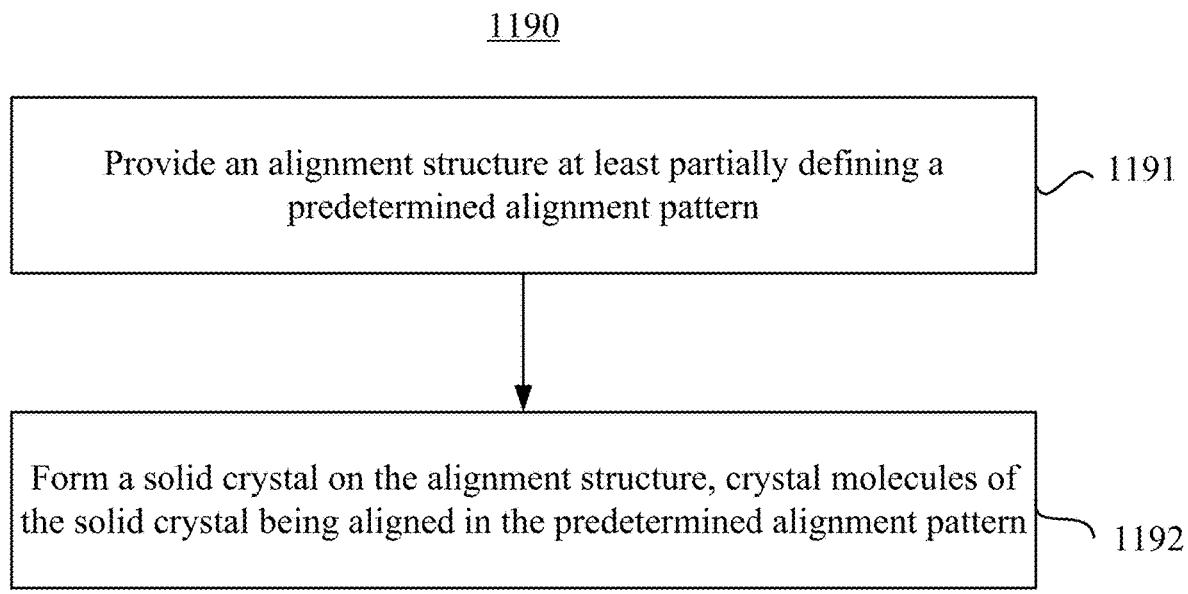

FIG. 11E is a flowchart illustrating a method 1190 for fabricating an optical device including a solid crystal. Method 1190 may include providing an alignment structure at least partially defining a predetermined alignment pattern (step 1191). Method 1190 may also include forming a solid crystal on the alignment structure, crystal molecules of the solid crystal being aligned in the predetermined alignment pattern (step 1192).

Figure 12A:
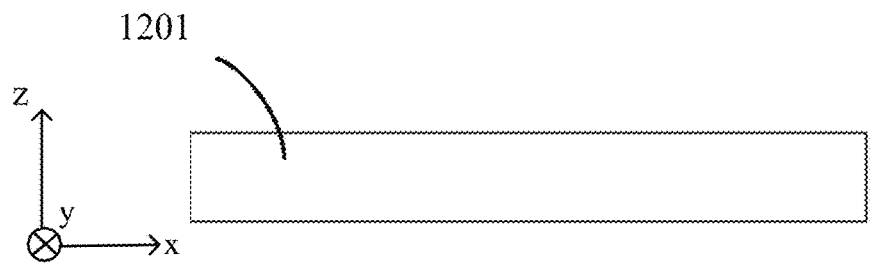
FIGS. 12A-12C schematically illustrate processes for fabricating an optical device including a solid crystal, according to an embodiment of the present disclosure.
Figure 12B:
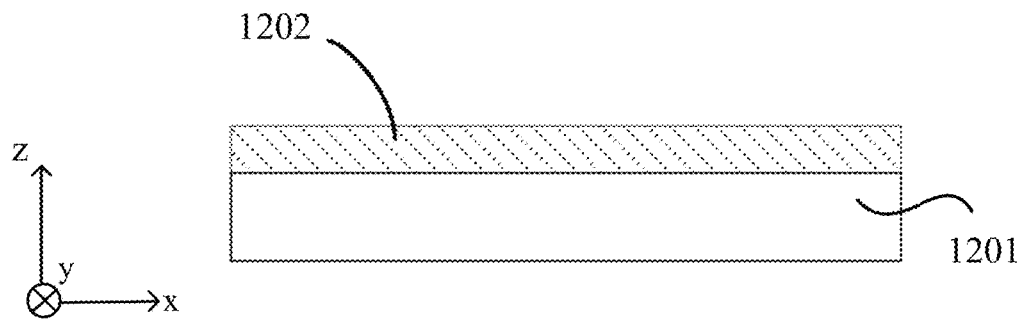
Figure 12C:
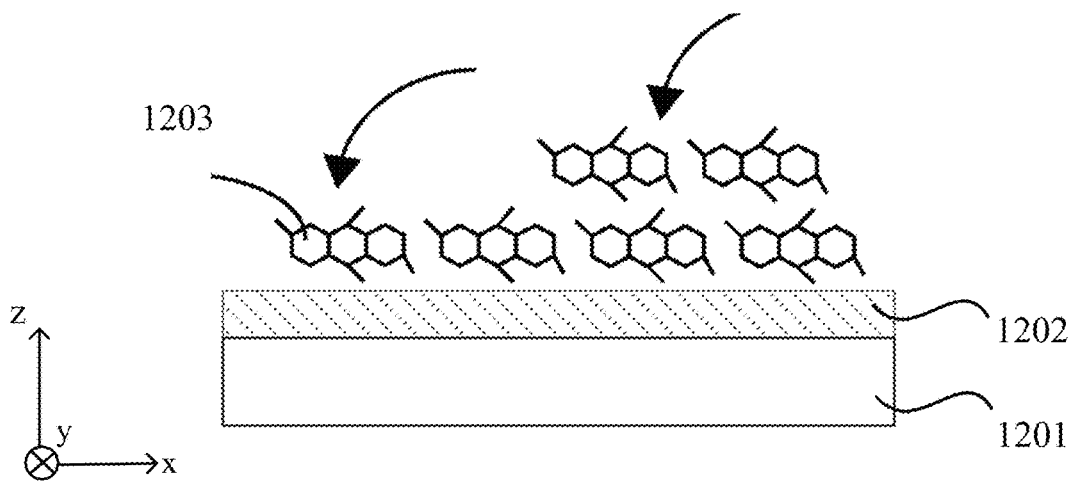

FIGS. 12A-12C illustrate processes for fabricating an optical device including a solid crystal, according to an embodiment of the present disclosure. As shown in FIG. 12A, a substrate 1201 may be provided. As shown in FIG. 12B, an alignment structure 1202 may be disposed at (e.g., on) a surface of the substrate 1201. In some embodiments, the alignment structure 1202 may be formed as a separate element on the substrate 1201. In some embodiments, the alignment structure 1202 may be formed as an integral part of the substrate 1201. For example, the alignment structure 1202 may be etched on or at least partially in the surface of the substrate 1201. In some embodiments, the process shown in FIG. 12A may be omitted, and a pre-fabricated alignment structure 1202 may be directly provided without a substrate.

As shown in FIG. 12C, solid (or molten) crystal molecules 1203 may be disposed (e.g., deposited, coated, formed, grown, etc.) on the alignment structure 1202. In some embodiments, the solid crystal molecules 1203 may be grown on the alignment structure 1202 based on a molten crystal material. In some embodiments, the process shown in FIG. 12C may be performed in a crucible that contains the molten crystal material. In some embodiments, the alignment structure may be provided at a die. The alignment structure 1202 may include or define an alignment structure pattern. The alignment structure 1202 may at least partially align the crystal molecules 1203 in a predetermined alignment pattern. The alignment structure pattern may or may not be the same as the predetermined alignment pattern. In some embodiments, a first plurality of crystal molecules in contact with the alignment structure 1202 may be aligned in the alignment structure pattern. Other crystal molecules disposed (e.g., coated, grown, etc.) over the first plurality of crystal molecules may follow the alignments and/or orientations of the first plurality of crystal molecules. In some embodiments, other crystal molecules disposed over the first plurality of crystal molecules may be twisted or rotated relative to the corresponding first plurality of crystal molecules. In some embodiments, the crystal molecules 1203 may be uniformly aligned. In some embodiments, the crystal molecules 1203 may be non-uniformly aligned. For example, the orientations of the axes of the crystal molecules 1203 may not be aligned in a same orientation or direction. Instead, the orientations of the axes of the crystal molecules 1203 may be spatially varied.

Figure 13A:
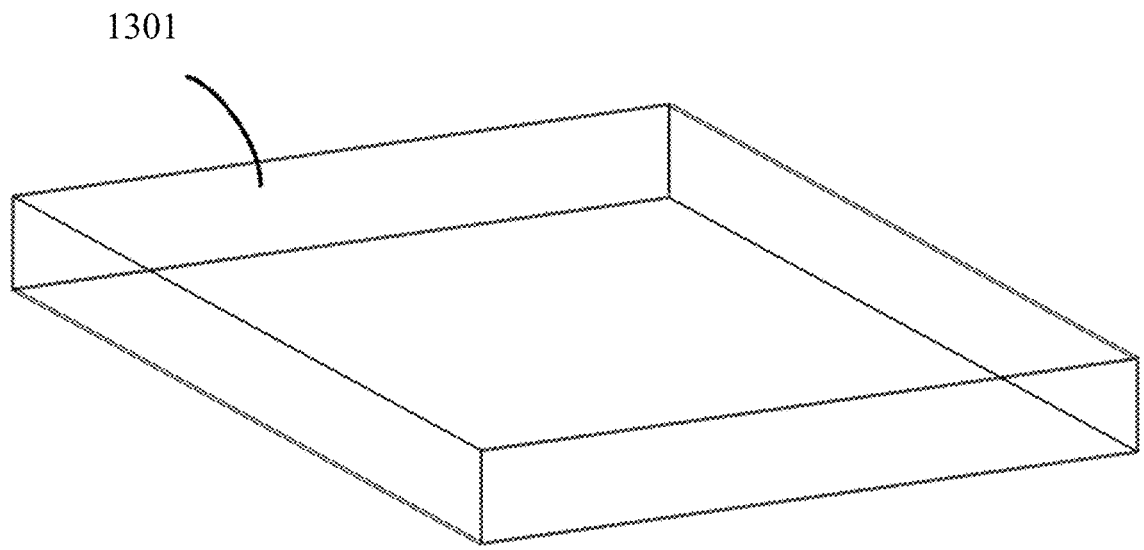
FIGS. 13A-13D schematically illustrate processes for fabricating an optical device including a solid crystal, according to an embodiment of the present disclosure.
Figure 13B:
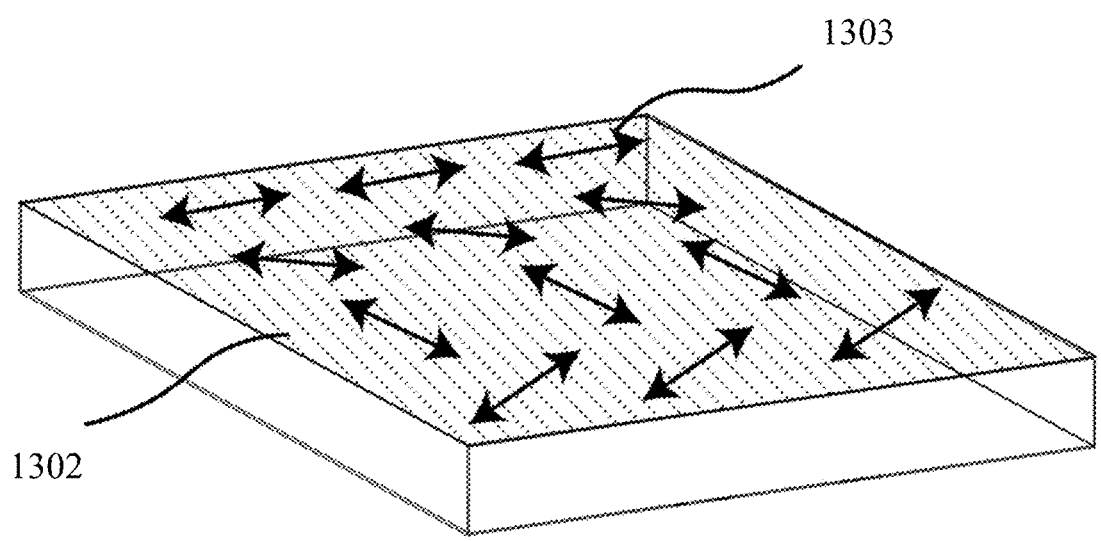

FIGS. 13A-13D illustrate processes for fabricating an optical device including a solid crystal (or a solid crystal layer), according to an embodiment of the present disclosure. As shown in FIG. 13A, a substrate 1301 may be provided. As shown in FIG. 13B, an alignment structure 1302 may be provided. The alignment structure 1302 may be configured to provide an in-plane alignment structure pattern, which may have a spatially uniform orientation pattern along a surface of the alignment structure 1302 or a spatially varying (or non-uniform) orientation pattern in which the orientation varies in at least one direction along a surface of the alignment structure 1302. In some embodiments, the spatially varying orientation pattern may include periodic or non-periodic orientation changes in a linear direction, periodic or non-periodic orientation changes in a radial direction, periodic or non-periodic orientation changes in a circumferential (e.g., azimuthal) direction, or a combination thereof. For illustrative purposes, FIG. 13B shows a portion of an in-plane alignment structure pattern having linear periodic orientations that are indicated by the arrows 1303. Although not shown, the alignment structure 1302 may also be configured to provide or define other in-plane alignment structure patterns.

Figure 13C:
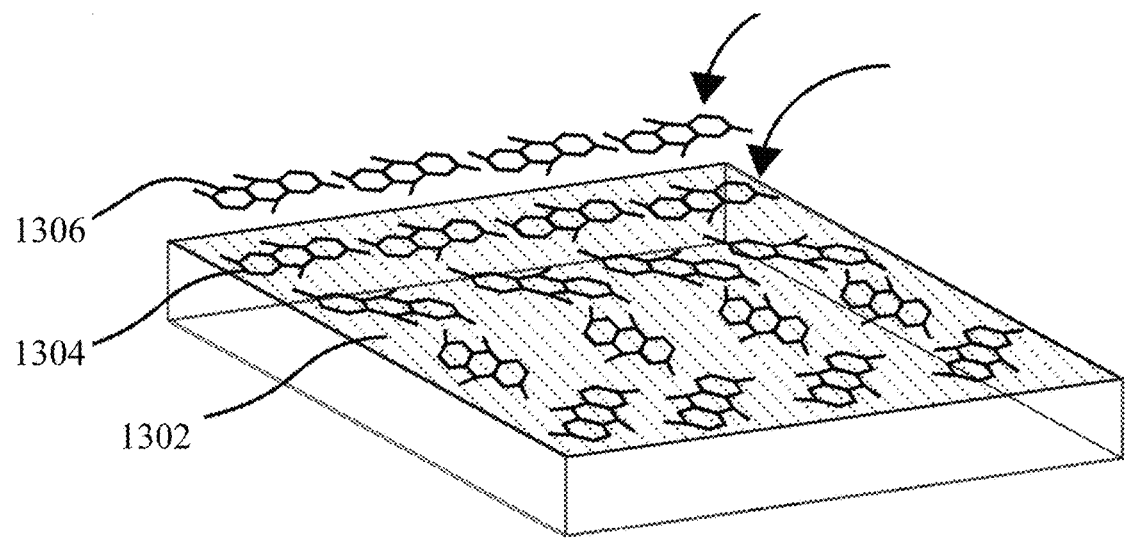
Figure 13D:
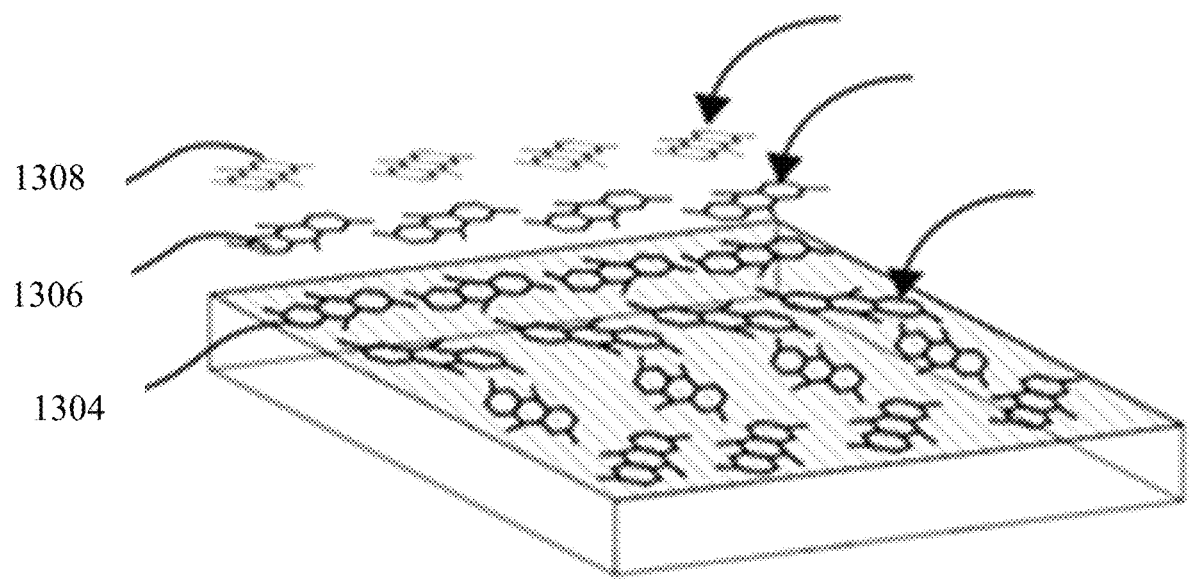

As shown in FIG. 13C, crystal molecules may be disposed (e.g., formed, deposited, grown, coated, etc.) onto the alignment structure 1302. A first plurality (or a first layer) of crystal molecules 1304 may be disposed on the alignment structure 1302. The first plurality of crystal molecules 1304 may be aligned by the alignment structure 1302 in the alignment structure pattern. A second plurality (or a second layer) of crystal molecules 1306 may be disposed over the first plurality of crystal molecules 1304. The second plurality of crystal molecules 1306 may or may not follow the same alignment pattern as the first plurality of crystal molecules 1304. In some embodiments, the second plurality of crystal molecules 1306 may follow the same alignment pattern as the first plurality of crystal molecules 1304, as shown in FIG. 13C. In some embodiments, the second plurality of crystal molecules 1306 may have a twist (or rotation) relative to the corresponding first plurality of crystal molecules 1304. As shown in FIG. 13D, a third plurality of crystal molecules 1308 may be disposed over the second plurality of crystal molecules 1304. The third plurality of crystal molecules 1308 may or may not follow the same alignment pattern as the second plurality of crystal molecules 1306. Additional layers of crystal molecules may be formed over the third plurality of crystal molecules 1308. In some embodiments, one or more additional alignment structures may be disposed between different layers of crystal molecules.

In some embodiments, the solid crystal may be fabricated using vapor deposition methods. For example, vapor deposition of organic crystal molecules may include one or more of organic molecule beam epitaxy and hot wall epitaxy. A surface of a substrate may be modified to control molecular orientation therefore crystal orientation. For example, an alignment structure may be formed on the surface of the substrate to provide an alignment structure pattern for aligning the crystal molecules. Hexagonal boron nitride may be coated with chemical vapor deposition ("CVD") to create a Van der Waal surface to allow for free standing thin film of organic solid crystals. Organic molecular beam epitaxy may use ultra-high vacuum conditions. Hot wall epitaxy may use high vacuum conditions such as about $10^{-6}$ Mbar.

In some embodiments, the solid crystal may be fabricated using a solvent-assisted deposition method. For organic crystallization, this method may be combined with thermal, mold, and/or surface alignment to achieve a large size crystal with high purity. For example, the solid crystal may be formed based on a temperature and/or solvent assisted single crystal formation process. In such a process, the organic molecules may be dissolved in a solvent. A substrate may be placed in the solution with a uniformly controlled temperature. Recrystallization may be performed on the locally cooled substrate. Oxidized silicon, thermal couple may be used to control the temperature. In some embodiments, solid crystals may be formed based on a mold and/or temperature assisted crystallization process. In this process, organic molecules may self-assemble in a confined space during a drying process under a high temperature. The process may use a silicon oxide surface with trichloro (octadecyl)silane polyurethane acrylate mold. In some embodiments, solid crystals may be formed based on a polymer assisted continuous casting with doctor-blading process. Polymer may be used to increase viscosity of organic molecular solution to avoid slipping of the film. A moving stage with speed-controlled doctor blade may be used. In some embodiments, solid crystals may be formed based on a surface alignment and/or solvent assisted patterning process. A surface of a substrate may be patterned to induce molecular alignment. A vapor solvent may be used to mobilize the molecules toward configurations with a lower energy state. A controlled exchange and/or removal of solvent may be performed to solidify molecules.

In some embodiments, solid crystals may be formed based on a zone annealing method. For example, a temperature assisted crystallization process may be used. A sharp temperature gradient may be created with a high temperature above the melting temperature. The direction and/or purity of the crystallization may be controlled visa moving speed of organic thin film (which may be coated on the substrate) across the thermal gradient. A moving stage with a sharp thermal gradient may be used in this process.

Figure 15A:
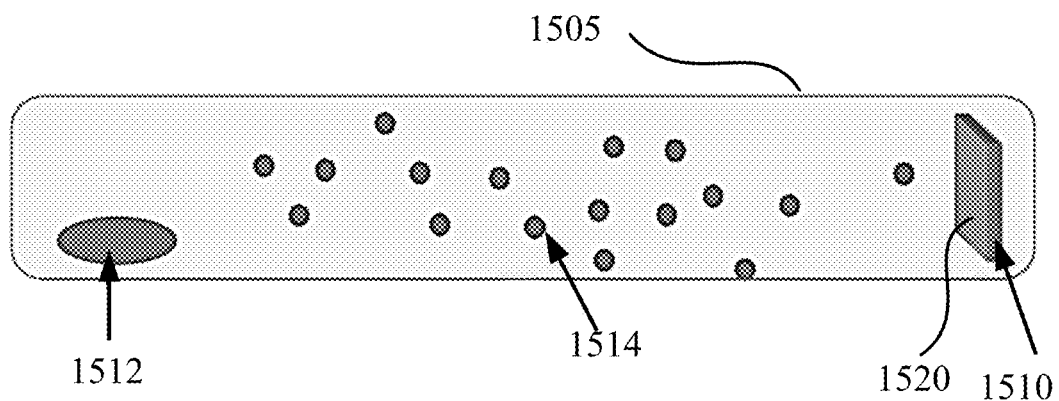
FIG. 15A schematically illustrates a method of patterning organic solid crystals on a substrate with an alignment structure based on physical vapor transport ("PVT"), according to an embodiment of the present disclosure.

FIG. 15A schematically illustrates a method of forming or fabricating a solid crystal (or solid crystal layer) on a substrate using physical vapor transport ("PVT"). As shown in FIG. 15A, in the PVT process, a source material (may also be referred to as a target material) 1512 and a substrate 1510 provided with an alignment structure 1520 may be provided in a PVT chamber 1505. The alignment structure 1520 may be disposed at a surface of the substrate 1510, and may be configured to at least partially define a predetermined alignment pattern of the solid crystal layer. For example, the alignment structure 1520 may have an alignment structure pattern that may align at least crystal molecules of the solid crystal layer that are in contact with the alignment structure 1520. The source material 1512 may include an organic solid crystal. The source material 1512 may be sublimed under heat and/or vacuum to generate an organic solid crystal vapor 1514 (also referred to as vapor crystal molecules 1514). For example, the source material 1512 may be heated to a predetermined temperature or may be subjected to a predetermined vacuum to generate the organic solid crystal vapor 1514. The organic solid crystal vapor 1514 may be transported within and along the PVT chamber 1505 and may be deposited on a surface of the alignment structure 1520 disposed at the substrate 1510. Molecules of the organic solid crystal vapor 1514 deposited on the alignment structure 1520 may be oriented (or aligned) at least partially by the alignment structure 1520 in the predetermined alignment pattern. The organic solid crystal vapor 1514 may be solidified and crystallized to form a solid crystal layer with solid crystal molecules aligned in the predetermined alignment pattern.

Figure 15B:
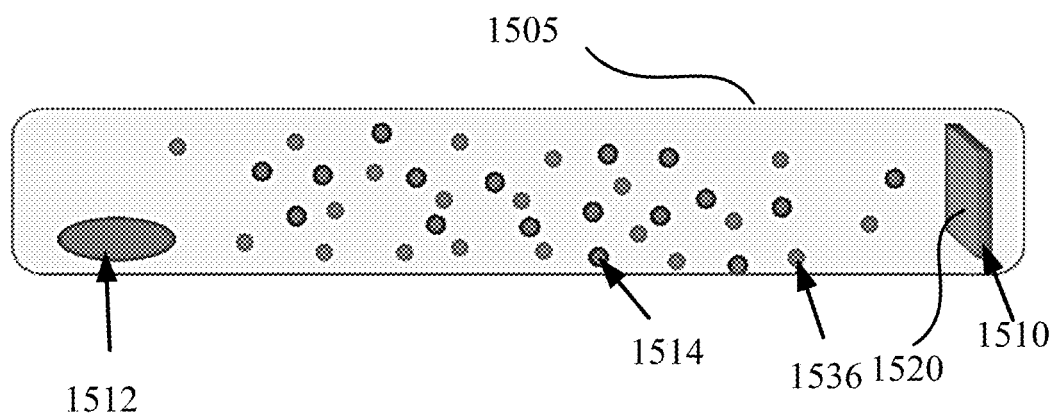
FIG. 15B schematically illustrates a method for patterning organic solid crystals on a substrate with an alignment structure based on the PVT, according to another embodiment of the present disclosure.

FIG. 15B schematically illustrates a method for forming or fabricating a solid crystal (or solid crystal layer) on a substrate based on the PVT, according to another embodiment of the present disclosure. The processes shown in FIG. 15B may be similar to those shown in FIG. 15A, except that a non-solvent vapor (e.g., an inert gas) may be supplied into or generated in the PVT chamber 1505 during the PVT process of forming the solid crystal layer. For example, a non-solvent vapor (e.g., an inert gas) 1536 may be supplied into the PVT chamber 1505 through an inlet (not shown). The amount of the non-solvent vapor 1536 supplied into or generated in the PVT chamber 1505 may be controlled, e.g., by a flow control device (not shown, which may be controlled by a controller, also not shown), to control the concentration of the organic solid crystal vapor 1514 in the PVT chamber 1505, the transportation speed of the solid crystal vapor 1515, and solidification kinetics of the solid crystal vapor 1514 generated from the source material 1512, thereby controlling the nucleation and crystal growth rate of the solid crystal molecules that form the solid crystal layer at the alignment structure 1520.

Figure 15C:
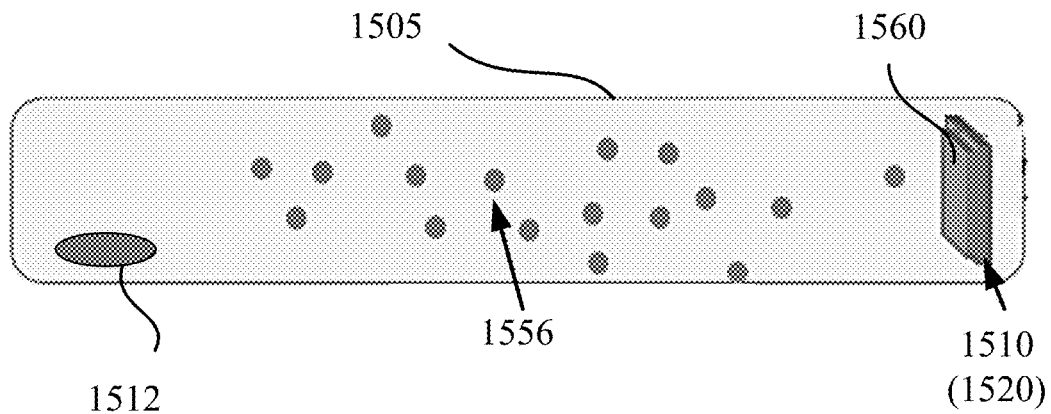
FIG. 15C schematically illustrates a method for patterning organic solid crystals on a substrate with an alignment structure based on the PVT, according to another embodiment of the present disclosure.

FIG. 15C schematically illustrates a method for forming or fabricating a solid crystal (or solid crystal layer) on a substrate based on the PVT, according to another embodiment of the present disclosure. In the embodiment shown in FIG. 15C, after the source material 1512 placed in the PVT chamber 1505 are sublimed under heat and/or vacuum to generate a solid crystal vapor (e.g., the solid crystal vapor 1514 shown in FIG. 15A, which is not separately labeled for the simplicity of illustration), the solid crystal vapor may be transported within and along the PVT chamber 1505, and may be deposited onto the alignment structure 1520 provided at the substrate 1510 to form a solid crystal 1560 (or a solid crystal layer 1560) on the substrate 1510. During the PVT process, a solvent vapor 1556 may be supplied into or generated in the PVT chamber 1505. The solvent vapor 1556 may be configured to selectively remove defects, such as amorphous domains or boundary between polycrystalline domains, in the solid crystal layer 1560 formed on the substrate 1510. In some embodiments, the amount of the solvent vapor 1556 supplied into the PVT chamber 1505 may be controlled by a flow control device (not shown). In some embodiments, the processes shown in FIG. 15A, FIG. 15B, and/or FIG. 15C may be alternatingly and/or repeatedly performed to reach a predetermined crystallinity and/or thickness of the solid crystal layer formed at the substrate 1510.

Figure 16:
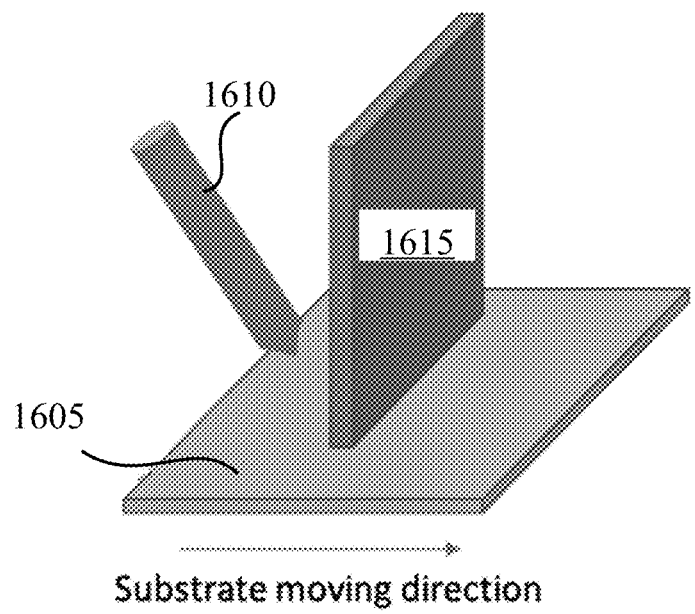
FIG. 16 schematically illustrates a method for forming a patterned solid crystal (solid crystal layer), according to an embodiment of the present disclosure.

FIG. 16 schematically illustrates a method for forming a solid crystal (or solid crystal layer), according to an embodiment of the present disclosure. As shown in FIG. 16, the solid crystal layer may be formed on a substrate provided with an alignment structure using a solvent assisted coating method (e.g. spin coating, blade coating, inkjet printing coating) followed by a continuous crystallization process. For example, a solid crystal material (e.g., an organic solid crystal material) may be dissolved in a solvent to form a solution of the solid crystal material (also referred to as a solid crystal solution). The solid crystal solution may be dispensed on a substrate 1605 provided with an alignment structure (not shown in FIG. 16) by a suitable method, e.g., spin coating, blade coating, inkjet printing coating, etc. For example, as shown in FIG. 16, the solid crystal solution may be dispensed on the substrate 1605 via a nozzle 1610 (e.g., a nozzle of an inkjet printer). The solid crystal solution dispensed on the substrate 1605 may be coated as a solid crystal solution layer on the substrate 1605 via a blade 1615. In some embodiments, the nozzle 1610 and/or the blade 1615 may be stationary, and the substrate 1605 may move in one or more directions (such as the direction shown in FIG. 16) relative to the blade 1615 during the coating process, such that the blade 1615 may move across the surface of the substrate 1605 to reshape the solid crystal solution dispensed by the nozzle 1610 into a uniform layer of the solid crystal solution.

The layer of the solid crystal solution (or the solid crystal solution layer) may be processed to evaporate the solvent using any suitable methods. When the solvent in the coated solid crystal solution layer is evaporated, crystal molecules in the solid crystal solution layer may be allowed to be at least partially aligned by the alignment structure in predetermined orientations (e.g., in-plane orientations) according to the predetermined alignment pattern at least partially defined by the alignment structure. When the solvent is evaporated, the crystal molecules in the solid crystal solution formed on the alignment structure may be solidified due to a solid-state close packing. The crystal molecules may be crystallized to form a solid crystal layer (e.g., through a continuous crystallization process) with desirable molecular orientations, i.e., with crystal molecules arranged in the predetermined alignment pattern at least partially defined by the alignment structure. In some embodiments, the solid crystal layer may be an organic solid crystal layer. In some embodiments, to make the solid crystal solution compatible with the solvent coating process and to better control the coating performance, polymers may be added into the solid crystal material or the solid crystal solution to adjust a viscosity of the solid crystal solution. Examples of polymers may include an crystalline polymer, an amorphous polymer, a hybrid polymer (a block copolymer), or a liquid crystal polymer, etc. In some embodiments, a surfactant (e.g. lipids, fatty acid) may also be added to the solid crystal solution to improve the coating performance.

In some embodiments, the solid crystal layer may be fabricated based on polymeric mesogens. The polymeric mesogens may be used as an organic solid crystal material for forming the solid crystal layer having a predetermined alignment pattern. The polymeric mesogens may include backbone or side groups made of mesogens that transition to a nematic phase or a twisted nematic phase when heated to a predetermined elevated temperature or when dissolved in a predetermined solvent. The polymeric mesogens may be dispensed on an alignment structure provided at a substrate, using any suitable methods, such as the solvent-assisted coating method, etc. The polymeric mesogens may be heated to the predetermined elevated temperature or dissolved in the predetermined solvent (to form a polymeric mesogens solution) to transition to the nematic phase or twisted nematic phase, at which state the polymeric mesogens may be at least partially aligned in the predetermined alignment pattern that is at least partially defined by the alignment structure. After the polymeric mesogens are aligned by the alignment structure, the polymeric mesogens may be cooled down (e.g., a temperature of the polymeric mesogens may be reduced to a predetermined low temperature) or the polymeric mesogens solution may be processed to evaporate the solvent. When the solvent is evaporated or the temperature is decreased, the polymeric mesogens may be solidified due to solid-state close packing. During the solidification process, the orientations of the polymeric mesogens (or the predetermined alignment pattern of the polymeric mesogens) may be maintained due to polymer backbone conformation. The polymeric mesogens may be crystallized (e.g., through a continuous crystallization process) to form a solid crystal layer with predetermined molecular orientations (or a predetermined alignment pattern).

In some embodiments, the polymeric mesogens may function as a bulk alignment structure to provide a predetermined alignment pattern for molecules of a solid crystal layer when the solid crystal layer is formed on a substrate. Thus, an alignment structure provided at the substrate may be omitted. In some embodiments, the polymeric mesogens may be mixed with a solid crystal material to form a mixture on a substrate. The solid crystal material and the polymeric mesogens may have a similar chemistry. For example, the solid crystal material and the polymeric mesogens may transition to a nematic phase or a twisted nematic phase when heated to a predetermined elevated temperature or dissolved in a predetermined solvent. In some embodiments, the mixture of the polymeric mesogens and the solid crystal material dispensed on the substrate may be heated to the predetermined elevated temperature or dissolved in the predetermined solvent to transition to the nematic phase or twisted nematic phase. In some embodiments, the mixture may be subjected to a light irradiation to induce a predetermined alignment pattern in the polymeric mesogens. The polymeric mesogens arranged in the predetermined alignment pattern may align the solid crystal molecules of the solid crystal material in the mixture. After the solid crystal molecules of the solid crystal material are aligned, the mixture may be cooled (i.e., the temperature of the mixture may be reduced to a predetermined low temperature) or the solvent may be evaporated to solidify the polymeric mesogens due to the solid-state close packing. During the solidification process, the orientations of the solid crystal molecules of the solid crystal material (i.e., the predetermined alignment pattern of the crystal molecules) may be maintained. The solid crystal material may be crystallized along with the polymeric mesogens mixed therein to form the solid crystal layer having crystal molecules aligned in the predetermined alignment pattern.

In some embodiments, the solid crystal layer may be fabricated based on reactive mesogens (e.g., non-polymer based mesogens with acrylate or epoxy group) that transition to a nematic phase or a twisted nematic phase when heated to a predetermined elevated temperature or dissolved in a predetermined solvent. The reactive mesogens may be dispensed on an alignment structure that is configured to provide a predetermined alignment pattern. The alignment structure may be provided at a substrate. The reactive mesogens may be at least partially aligned by the alignment structure when the reactive mesogens are heated to a predetermined elevated temperature or dissolved in a solvent to transition to the nematic phase or twisted nematic phase. The aligned reactive mesogens may be further polymerized (e.g., photo-polymerized or thermally polymerized) to form polymeric mesogens with at least partially stabilized molecular orientations. The polymeric mesogens may be cooled down (e.g., to a predetermined low temperature) or the solution including the polymeric mesogens and the solvent may be processed to evaporate the solvent. When the solvent is evaporated or the temperature of the polymeric mesogens is decreased, the polymeric mesogens may solidify due to solid-state close packing. During the solidification process, the molecular orientations may be maintained due to polymer backbone conformation. The polymeric mesogens may be crystallized with desirable predetermined orientations (e.g., a predetermined alignment pattern).

In some embodiments, the reactive mesogens may be mixed with a liquid crystal material (or liquid crystals). The liquid crystals may be in a nematic phase or a twisted nematic phase at about a room temperature. A mixture of the reactive mesogens and the liquid crystals may be dispensed on an alignment structure. The liquid crystals may be at least partially aligned by the alignment structure. The reactive mesogens may be aligned by the aligned liquid crystals and the alignment structure. That is, the alignments (or the orientations) of the reactive mesogens may be strengthened by the liquid crystals. The aligned reactive mesogens may be further polymerized (e.g., photo-polymerized or thermally polymerized) to form polymeric mesogens to partially stabilize the orientations of the polymeric mesogens. After the reactive mesogens are polymerized, the liquid crystals may be removed (e.g., washed away) with a solvent or removed by subliming the liquid crystals with heat to a predetermined elevated temperature (e.g., to evaporate the liquid crystals). In some embodiments, the solid crystal layer may be formed based on the polymeric mesogens. For example, the solid crystal layer may be grown from a solid crystal material using the polymeric mesogens as a template (e.g., as an alignment structure for patterning the solid crystal molecules) through various processes, such as vapor deposition, blade coating, inkjet printing, and other processes disclosed herein. The solid crystal layer grown on the polymeric mesogens may have a predetermined alignment pattern provided by the polymeric mesogens.

In some embodiments, a liquid crystal material (or compound) may be mixed with the solid crystal material to form a mixture. The mixture may be heated to a predetermined elevated temperature or may be dissolved in a predetermined solvent to make a homogeneous mixture. The homogeneous mixture may be dispensed on an alignment structure. The mixture may be cooled down to a predetermined low temperature or the mixture may be processed to evaporate the solvent. When the temperature is decreased or the solvent is evaporated, the liquid crystal material and the solid crystal material may be at least partially phase separated. The liquid crystal material may be at a nematic phase or a twisted nematic phase, and may be at least partially aligned by the alignment structure. The solid crystal material may be solidified and crystallized to form a solid crystal layer using a suitable process. During the crystallization, the solid crystal molecules may be at least partially aligned by an alignment regulating force of the liquid crystal material (or compound) that has been aligned by the alignment structure. During the crystallization, the liquid crystal material may fill strongly strained areas.

Figure 17:
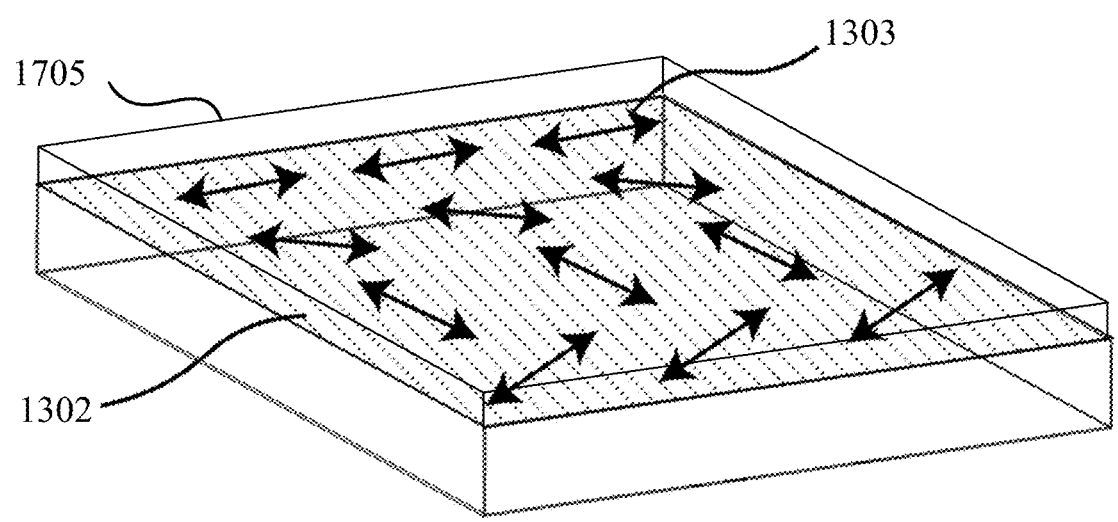
FIG. 17 schematically illustrates an alignment structure, according to an embodiment of the present disclosure.

FIG. 17 schematically illustrates an alignment structure, according to an embodiment of the present disclosure. FIG. 17 is based on the embodiment shown in FIGS. 13B-13D. As described above in connection with FIGS. 13B-13D, the alignment structure 1302 may be formed by physical vapor deposition or ion vapor deposition. As shown in FIG. 17, a buffer crystalline layer 1705 may be disposed at (e.g., on) the alignment structure 1302. The buffer crystalline layer 1705 may have a first surface in contact with the alignment structure 1302 and a second surface in contact with a solid crystal layer formed thereon in subsequent processes. The buffer crystalline layer 1705 may be configured to reduce a strain between the solid crystal layer and the alignment structure 1302 while maintaining the molecular and crystal orientations in the solid crystal layer. In some embodiments, the buffer crystalline layer 1705 may include at least one of liquid crystals, a liquid crystal polymer, a solid crystal with a nematic or twisted nematic phase at an elevated temperature, polycyclic aromatic hydrocarbons (e.g. polyethylene aphathalate), a crystalline fluorine-containing polymer (e.g., tetrafluoroethylene and the like), or a polyolefin (e.g., polyethylene).

Figure 18A:
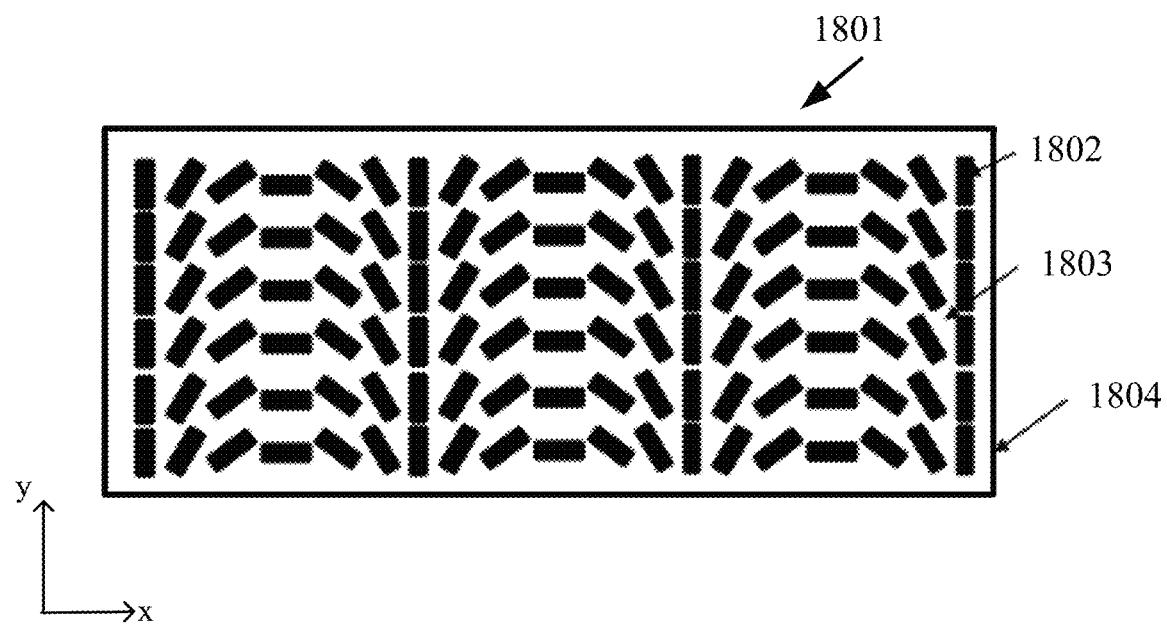
FIG. 18A schematically illustrates a top view of microstructures disposed on a substrate, according to an embodiment of the present disclosure.

FIG. 18A schematically illustrates a top view of an alignment structure disposed on a substrate, according to an embodiment of the present disclosure. The alignment structure may include a plurality of microstructures having any suitable sizes, such as micro-scale and/or nano-scale structures. As shown in FIG. 18A, an alignment structure 1801 provided on a substrate 1804 may include a plurality of microstructures 1802. In some embodiments, the alignment structure 1801 may be integrally formed inside the substrate 1804. In some embodiments, the alignment structure 1801 may be separately formed onto a surface of the substrate 1804. In some embodiments, as shown in FIG. 18A, the plurality of microstructures 1802 may define, form, or include a plurality of grooves arranged in an array. For illustrative and discussion purposes, the grooves and the microstructures are both represented by the black rectangles in FIG. 18A. Thus, the reference number 1802 may refer to both the microstructures and the grooves.

An orientation of a longitudinal direction (or a length direction) of the groove 1802 may be referred to as an orientation of the groove 1802. In some embodiments, the orientations of the grooves 1802 in the array may be spatially uniform along a surface of the array (or along the surface of the substrate 1804). That is, the alignment structure 1801 may be configured to provide a uniform alignment structure pattern. In some embodiments, the orientations of the grooves 1802 in the array may not be spatially uniform, but may be spatially varying. The spatial variations of the orientations of the grooves 1802 may have a pattern with a pitch (the pitch may be a distance over which the orientations of the grooves change by 180°) in at least one in-plane direction. In some embodiments, the pitch may be uniform (or the same) in at least one in-plane direction along a surface of the array. In some embodiments, the pitch may be a varying pitch (or a non-uniform pitch) in at least one in-plane direction along a surface of the array. That is, the alignments structure 1801 may be configured to provide a spatially varying (or non-uniform) alignment structure pattern. For example, the grooves 1802 in the array may have uniform (or constant) orientations, periodically varying orientations, non-periodically varying orientations, or a combination thereof. The orientations of the grooves 182 may periodically or non-periodically vary in a linear direction, in a radial direction, in a circumferential (e.g., azimuthal) direction, or a combination thereof.

For illustrative purposes, FIG. 18A shows the orientations of the grooves 1802 in the array periodically varying with a uniform pitch in an x-axis direction. The size of a solid crystal layer to be formed on the array of the grooves 1802 in subsequent processes may be defined by boundaries of the array of grooves 1802. The grooves 1802 may be configured to at least partially align crystal molecules of the solid crystal layer in the spatially uniform or spatially varying alignment structure pattern. That is, the orientation of the axis of the organic solid crystal layer may be at least partially determined by the orientations of the grooves 1802 in the array. Depending on the orientations of the grooves 1802 in the array (or the alignment pattern provided by the grooves 1802), the axis of the solid crystal layer formed on the grooves 1802 may be configured to have a constant orientation, a periodically varying orientation, a non-periodically varying orientation, or a combination thereof, within the organic solid crystal layer. The periodically or non-periodically varying orientation may be in a linear direction, a radial direction, a circumferential (e.g., azimuthal) direction, or a combination thereof. The solid crystal layer may be formed on the alignment structure 1801 through suitable processes, such as physical vapor deposition, solvent coating (e.g. spin coating, blade coating, inkjet printing) followed by thermal annealing to reduce defects. In some embodiments, the microstructures 1802 of the alignment structure 1801 may be fabricated using e-beam or lithography and etching an organic material or an organic-inorganic hybrid material. In some embodiments, the microstructures 1802 of the alignment structure 1801 may be fabricated using nanoimprinting lithography of an organic material or an organic-inorganic hybrid material. An area of the alignment structure 1801 outside the microstructures 1802 may be referred to as an unpatterned area 1803.

Figure 18B:
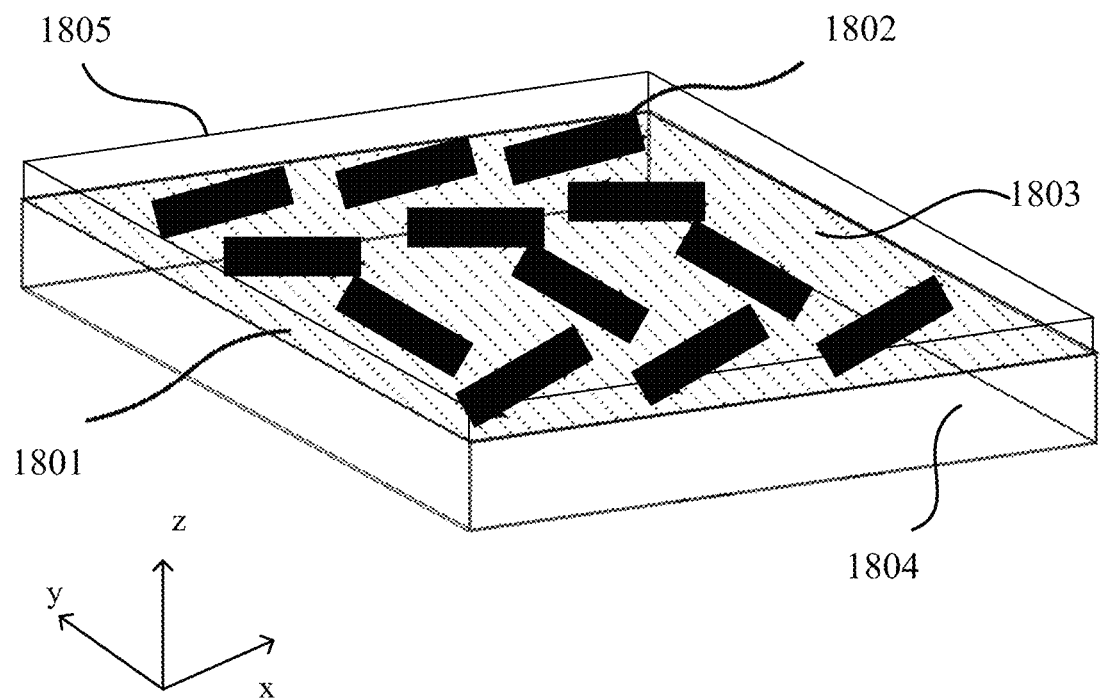
FIG. 18B schematically illustrates a surface modification layer disposed at microstructures and between the microstructures and the solid crystal layer, according to an embodiment of the present disclosure.

FIG. 18B schematically illustrates a surface modification layer 1805 disposed at (e.g., on) the microstructures 1802, and between the microstructures 1802 and the solid crystal layer formed in the subsequent processes. In some embodiments, the surface modification layer 1805 may include an anisotropic layer (e.g., a photo-alignment material layer, a liquid crystal layer, a crystalline fluorine-containing polymer, or a semi-crystalline polyolefin layer, etc.). In some embodiments, molecules of the anisotropic layer may have uniform orientations that are the same as the uniform orientations of the microstructures 1802 (e.g., grooves). In some embodiments, orientations of the molecules of the anisotropic layer may spatially vary in a same manner as the orientations of the microstructures 1802 (e.g., grooves). In some embodiments, the surface modification layer 1805 may include an isotropic layer, e.g., an amorphous layer including $SiO_2$, $MgF_2$, silicone, siloxane, silane with fluorinated groups, a fluorinated polymer ("PFPE"), or a crystalline buffer layer including polyolefin, polyurethane, polyimide, polyester, silane with crystalline alkyl groups. In some embodiments, the surface modification layer 1805 may include an anisotropic layer and an isotropic layer. In some embodiments, the surface modification layer 1805 may include one or more anisotropic layers and/or one or more isotropic layers. In some embodiments, the depth of the microstructures 1802 (e.g., grooves) may be substantially small, and the surface modification layer 1805 may be disposed on the microstructures 1802 (e.g., grooves), and may not be disposed on the unpatterned area 1803.

In some embodiments, a solid crystal layer with desirable in-plane orientations may be fabricated based on a solid crystal material (e.g., an organic solid crystal material) with nanoimprinting lithography. In some embodiments, the solid crystal material may be heated to a temperature above a predetermined melting temperature of the solid crystal material. The solid crystal material may be melted to become a molten crystal material. The molten crystal material may be laminated with a nanoimprint mold or template. The nanoimprint mold may include a plurality of nanostructures. In some embodiments, a layer of the molten crystal material may be formed on the nanoimprint mold or template. In some embodiments, the molten crystal material may at least partially fill the nanostructures formed in the nanoimprint mold. The nanoimprint mold may have predefined topological patterns (e.g., nanostructures) configured to provide a predetermined alignment pattern. The nanoimprint mold may at least partially align crystal molecules of the molten crystal material, e.g., at least the crystal molecules in contact with the nanoimprint mold, in uniform orientations, periodically or non-periodically varying orientations, or a combination thereof. The periodically or non-periodically varying orientations may be in a linear direction, a radial direction, a circumferential (e.g., azimuthal) direction, or a combination thereof.

The molten crystal material laminated with the nanoimprint mold may be cooled to solidify and crystallize to form a solid crystal layer with molecules aligned in predetermined in-plane orientations. After cooling and crystallization, the solid crystal layer may be removed (e.g., delaminated) from the nanoimprint mold. In some embodiments, the solid crystal material may be an eutectic composition with a reduced melting temperature. In some embodiments, the solid crystal material may be mixed with a solvent to form a mixture. The mixture may be laminated with a soft nanoimprint mold (e.g., silicone) configured to allow the solvent to evaporate therethrough. The solvent may be evaporated. The solid crystal material may be crystallized to form a solid crystal layer with crystal molecules aligned in predetermined in-plane orientations provided by the soft nanoimprint mold. The solid crystal layer may be removed (e.g., delaminated) from the soft nanoimprint mold. In some embodiments, a mother nanoimprint mold may be fabricated by patterning a material with e-beam or photolithography, and then etched to form microstructures for providing the alignment structure pattern. Materials of a mother nanoimprint mold may include, e.g., silicone, silicon dioxide, quartz, or fused silica. In some embodiments, a daughter nanoimprint mold may be obtained through replicating the mother nanoimprint mold using nanoimprinting lithography. The daughter nanoimprint mold may be used as a mold in the fabrication of the solid crystal layer. Materials of a daughter nanoimprint mold may include polymers, such as silicone, siloxane, PFPE, or polyolefin. In some embodiments, the solid crystal layer may be fabricated through patterning an intact piece of a solid crystal using e-beam or photolithography, and etching the patterned intact piece of the organic solid crystal. The intact piece of the solid crystal may be fabricated by any suitable methods, such as physical vapor deposition, solvent coating and thermal annealing, gel spinning, melt spinning, or electro-deposition.

Figure 20:
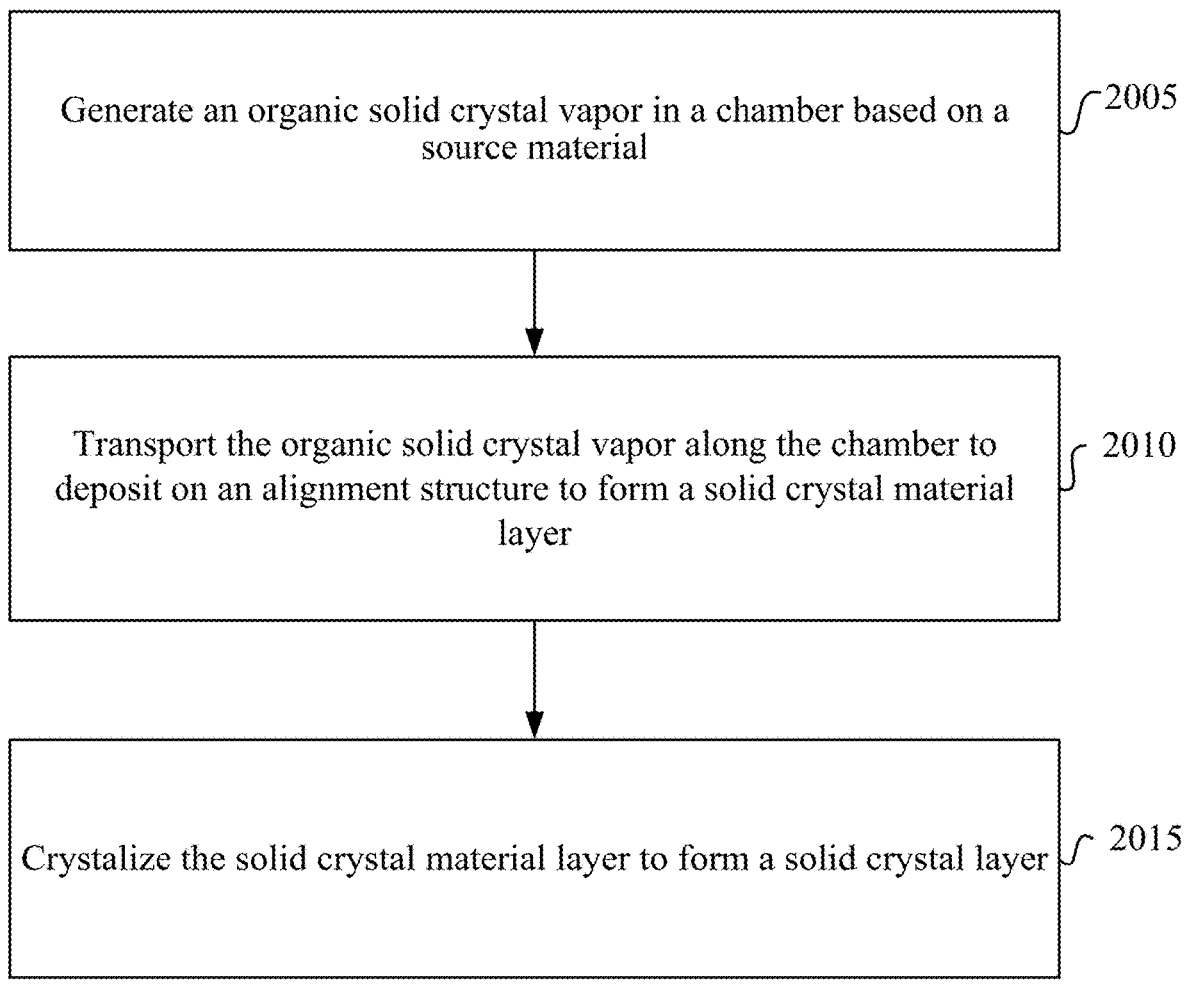

FIG. 20 is a flowchart illustrating a method 2000 for fabricating a solid crystal layer with a predetermined alignment pattern (or a patterned solid crystal layer). Method 2000 may include generating a solid crystal vapor in a chamber based on a source material (step 2005). In some embodiments, the process may be a physical vapor transport process, and the chamber may be a physical vapor transport chamber. In some embodiments, the source material may be an organic solid crystal material, and the solid crystal vapor may be an organic solid crystal vapor. Descriptions of an example physical vapor transport process may refer to the descriptions rendered above in connection with FIG. 15A. Method 2000 may also include transporting the solid crystal vapor along the chamber to deposit onto an alignment structure to form a solid crystal material layer (step 2010). The alignment structure may be configured to at least partially define a predetermined alignment pattern for the solid crystal layer to be formed thereon. Descriptions of an example process may refer to the descriptions rendered above in connection with FIG. 15A. Method 2000 may also include crystallizing the solid crystal material layer to form a solid crystal layer (step 2015). The solid crystal layer may include the predetermined alignment pattern.

In some embodiments, method 2000 may include controlling an amount of at least one of a non-solvent vapor or a solvent vapor in the chamber (e.g., the physical vapor transport chamber). For example, during the process in which the solid crystal vapor is transported to the surface of the alignment structure, the amount of the non-solvent vapor introduced into or generated in the physical vapor transport chamber may be dynamically or statically adjusted (or controlled) to control the concentration of the solid crystal vapor in the physical vapor transport chamber, the transportation speed of the solid crystal vapor, and the solidification kinetics, thereby controlling the nucleation and crystal growth rate of the solid crystal layer. In some embodiments, a solvent vapor may be introduced into or generated in the physical vapor transport chamber to selectively remove defects such as amorphous domains or boundary between polycrystalline domains. In some embodiments, method 2000 may include removing at least one of the solvent vapor or the non-solvent vapor from the solid crystal material layer before, after, or during the crystallization process to form the solid crystal or the solid crystal layer. In some embodiments, method 2000 may include repeatedly or alternatingly perform one or more of the above processes to reach a predetermined crystallinity and thickness of the solid crystal material layer formed on the alignment structure.

Figure 21:
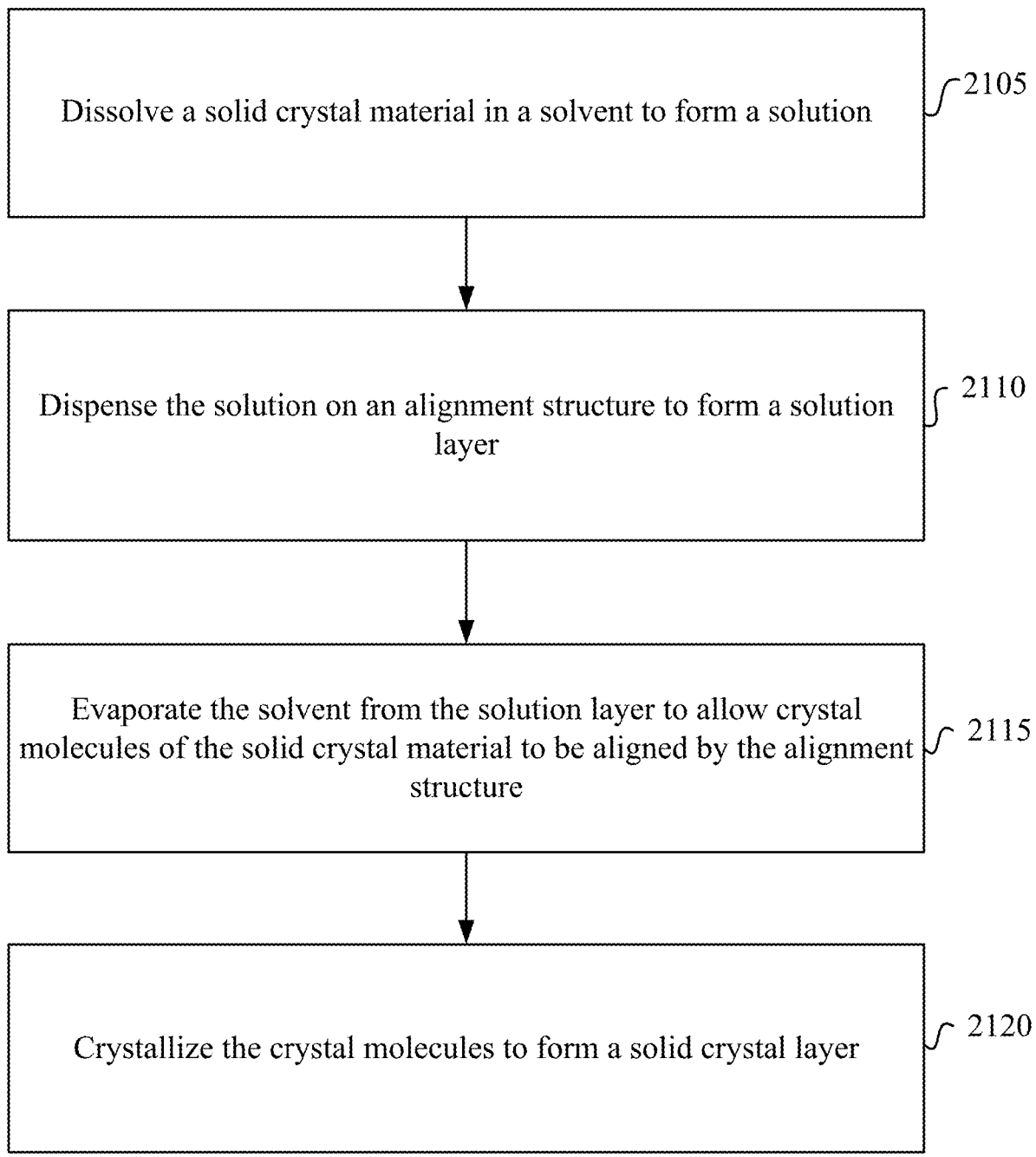

FIG. 21 is a flowchart illustrating a method 2100 for fabricating a solid crystal layer having a predetermined alignment pattern (or for patterning a solid crystal layer), such as an organic solid crystal layer. Method 2100 may include dissolving a solid crystal material in a solvent to form a solution (step 2105). In some embodiments, the solid crystal material may be an organic solid crystal material. Method 2100 may also include dispensing the solution on an alignment structure to form a solution layer (step 2110). Dispensing the solution may include coating (e.g., spin coating, blade coating, or inkjet printing coating) the solution on the alignment structure. The alignment structure may at least partially define a predetermined alignment pattern. Method 2100 may also include evaporating the solvent from the solution layer to allow crystal molecules of the solid crystal material to be aligned by the alignment structure (step 2115). Method 2100 may further include crystallizing the crystal molecules to form a solid crystal layer (step 2120). For example, when the solvent is evaporated, the crystal molecules may be solidified. In some embodiments, the crystal molecules may be crystallized through a continuous crystallization process. In some embodiments, the solid crystal layer may be an organic solid crystal layer. In some embodiments, method 2100 may include other steps. For example, method 2100 may include adding polymers to the solid crystal material or the solution to adjust the viscosity of the solution. In some embodiments, method 2100 may also include adding a surfactant to the solution to improve the coating performance.

Figure 22:
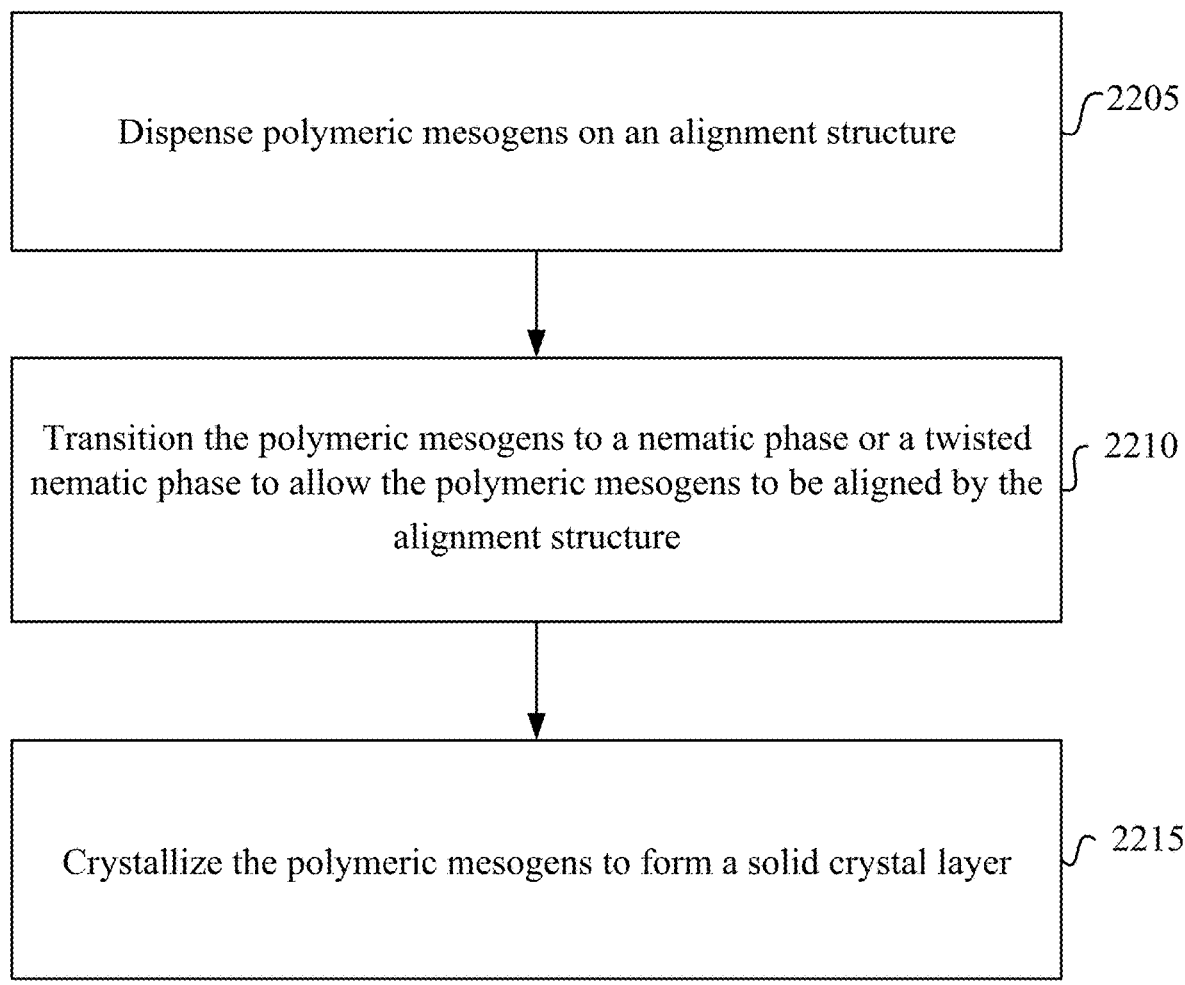

FIG. 22 is a flowchart illustrating a method 2200 for fabricating a solid crystal layer having a predetermined alignment pattern (or for patterning a solid crystal layer), such as an organic solid crystal layer. Method 2200 may include dispensing polymeric mesogens on an alignment structure (step 2205). The alignment structure may at least partially define a predetermined alignment pattern. The polymeric mesogens may be used as an organic solid crystal material for forming an organic solid crystal layer. For example, the polymeric mesogens may be coated onto the alignment structure. Method 2200 may also include transitioning the polymeric mesogens to a nematic phase or a twisted nematic phase to allow the polymeric mesogens to be aligned by the alignment structure (step 2210). For example, the polymeric mesogens may be heated to a predetermined elevated temperature or may be dissolved in a predetermined solution to transition to the nematic phase or the twisted nematic phase, at which state the polymeric mesogens may be at least partially aligned in a predetermined alignment pattern that is at least partially defined by the alignment structure. Method 2200 may also include crystallizing the polymeric mesogens to form a solid crystal layer (step 2215). In some embodiments, method 2200 may include cooling down the polymeric mesogens (e.g., reducing the temperature to a predetermined low temperature) or evaporating the solvent in which the polymeric mesogens are dissolved. When the solvent is evaporated or when the temperature is reduced, the polymeric mesogens may be solidified. Orientations of the polymeric mesogens may be maintained during the solidification process. In some embodiments, the polymeric mesogens may be crystallized through a continuous crystallization process to form a solid crystal layer with a predetermined alignment pattern.

Figure 23:
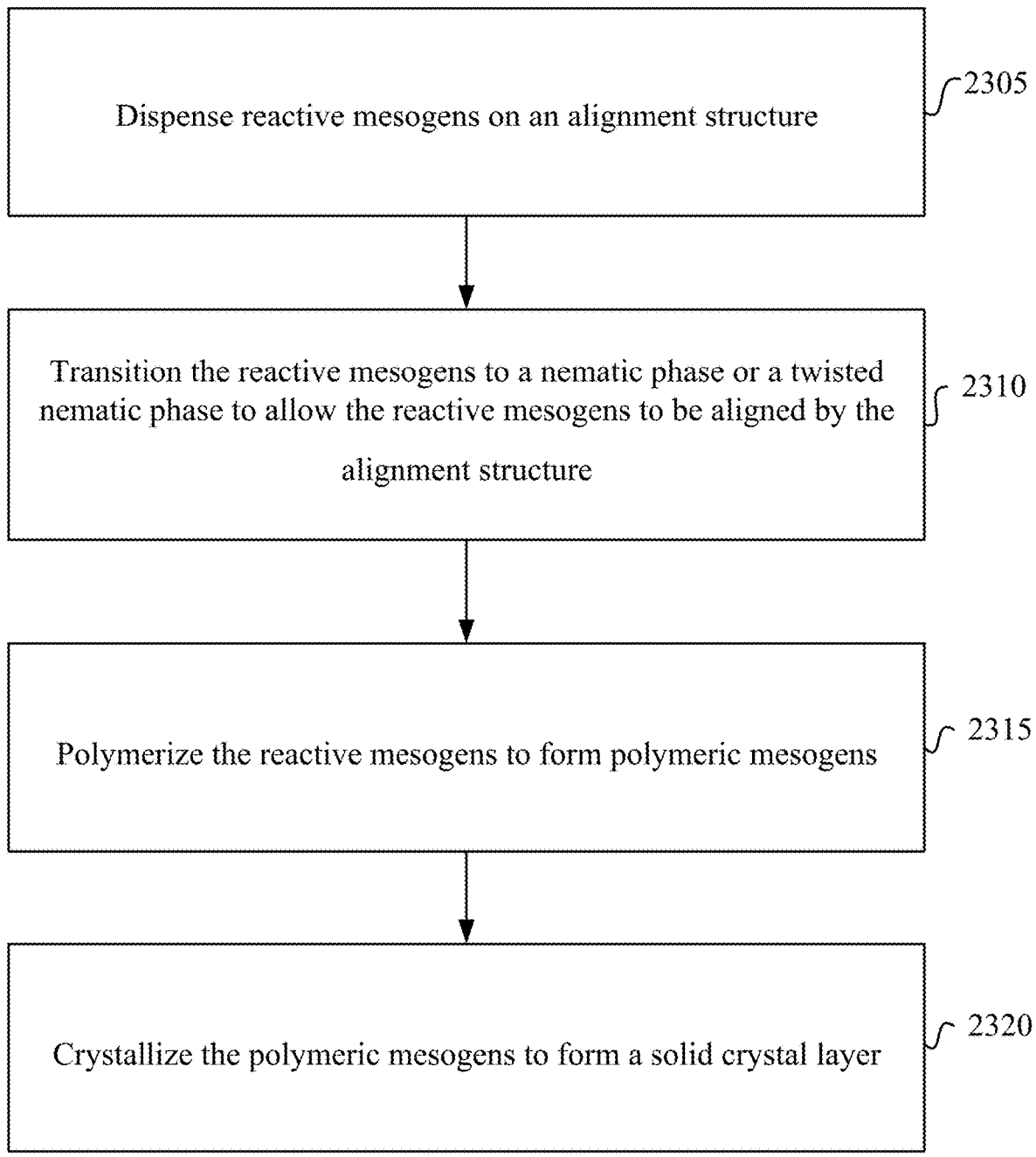

FIG. 23 is a flowchart illustrating a method 2300 for fabricating a solid crystal layer having a predetermined alignment pattern (or for patterning a solid crystal layer), such as an organic solid crystal layer. Method 2300 may include dispensing reactive mesogens on an alignment structure (step 2305). The alignment structure may at least partially define a predetermined alignment pattern. Method 2300 may also include transitioning the reactive mesogens to a nematic phase or a twisted nematic phase to allow the reactive mesogens to be aligned by the alignment structure (step 2310). For example, the reactive mesogens may be heated to a predetermined elevated temperature or may be dissolved in a predetermined solution to transition to the nematic phase or the twisted nematic phase. Method 2300 may also include polymerizing the reactive mesogens to form polymeric mesogens (step 2315). Method 2300 may further include crystallizing the polymeric mesogens to form a solid crystal layer (step 2320). The polymeric mesogens may be used as an organic solid crystal material for forming the solid crystal layer, which may be an organic solid crystal layer. The solid crystal layer may have a predetermined alignment pattern. In some embodiments, the polymeric mesogens may be cooled down (e.g., temperature of the polymeric mesogens may be reduced to a predetermined low temperature) or the solution including the polymeric mesogens may be processed to evaporate the solvent. When the solvent is evaporated or the temperature of the polymeric mesogens is decreased, the polymeric mesogens may solidify. During the solidification process, the molecular orientations may be maintained due to polymer backbone conformation.

Figure 24:
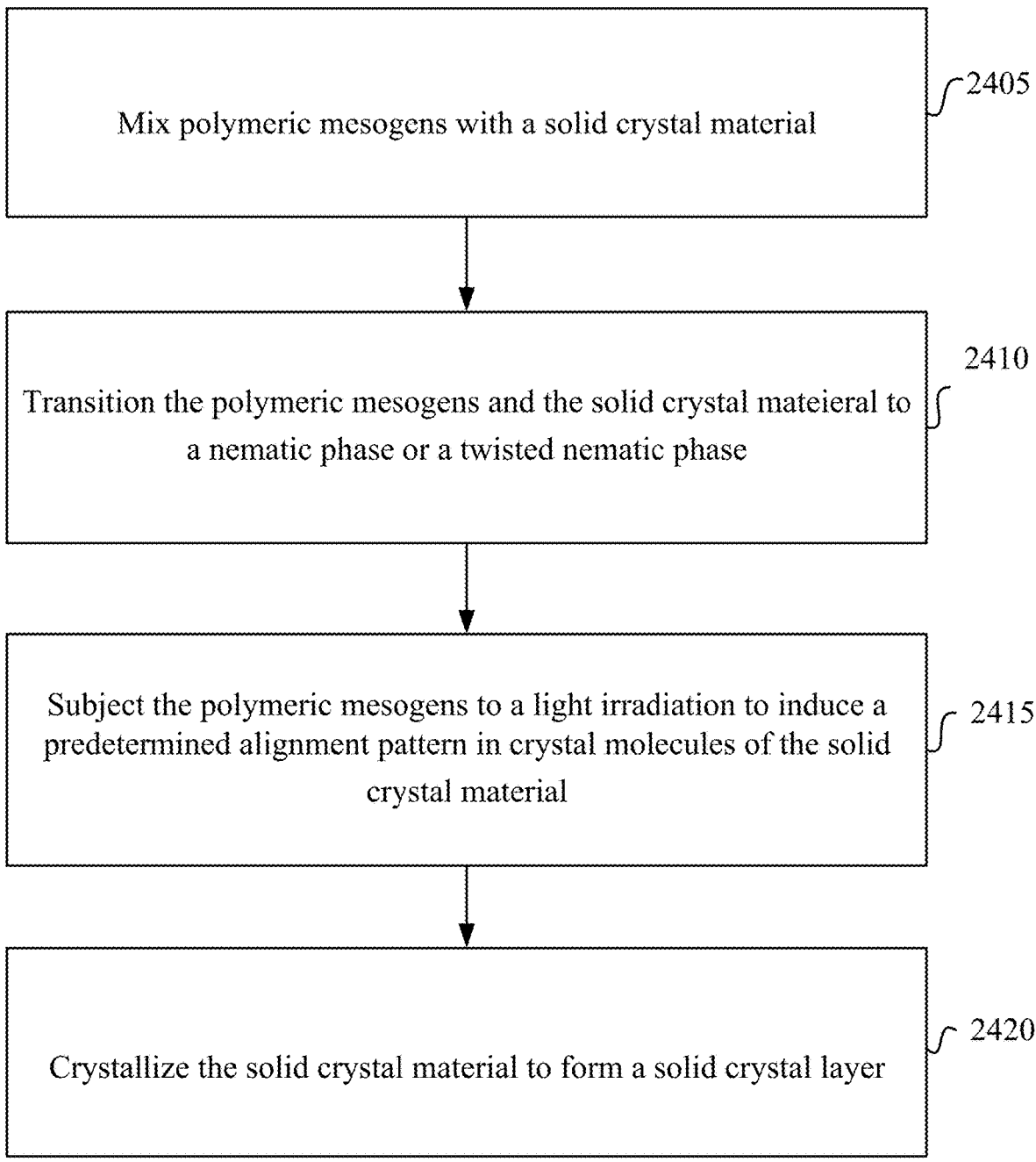

FIG. 24 is a flowchart illustrating a method 2400 for fabricating a solid crystal layer having a predetermined alignment pattern (or for patterning a solid crystal layer), such as an organic solid crystal layer. Method 2400 may include mixing polymeric mesogens with a solid crystal material (step 2405). In some embodiments, the solid crystal material may be an organic solid crystal material. The polymeric mesogens may function as a bulk alignment structure to provide a predetermined alignment pattern for molecules of a solid crystal layer when the solid crystal layer is formed on a substrate. The solid crystal material and the polymeric mesogens may have a similar chemistry. For example, the solid crystal material and the polymeric mesogens may both be transitioned to a nematic phase or a twisted nematic phase when heated to a predetermined elevated temperature or when dissolved in a predetermined solvent. Method 2400 may include transitioning the polymeric mesogens and the solid crystal material to a nematic phase or a twisted nematic phase (step 2410). For example, the mixture of the polymeric mesogens and the solid crystal material may be heated to a predetermined elevated temperature or dissolved in a predetermined solution to transition to the nematic phase or the twisted nematic phase. Method 2400 may include subjecting the polymeric mesogens to a light irradiation to induce a predetermined alignment pattern in crystal molecules of the solid crystal material (step 2415). When subjected to a light irradiation, the polymeric mesogens may induce a bulk alignment in the crystal molecules of the solid crystal material. Method 2400 may also include crystallizing the solid crystal material to form a solid crystal layer (step 2420). In some embodiments, after the crystal molecules of the solid crystal material are aligned, the mixture may be cooled (i.e., the temperature of the mixture may be reduced to a predetermined low temperature) or the mixture may be processed to evaporate the solvent. As a result, the polymeric mesogens may be solidified. During the solidification process, the orientations of the solid crystal molecules of the solid crystal material (i.e., the predetermined alignment pattern of the crystal molecules) may be maintained. The solid crystal material may be crystallized along with the polymeric mesogens mixed therein to form the solid crystal layer having crystal molecules aligned in the predetermined alignment pattern.

Figure 25:
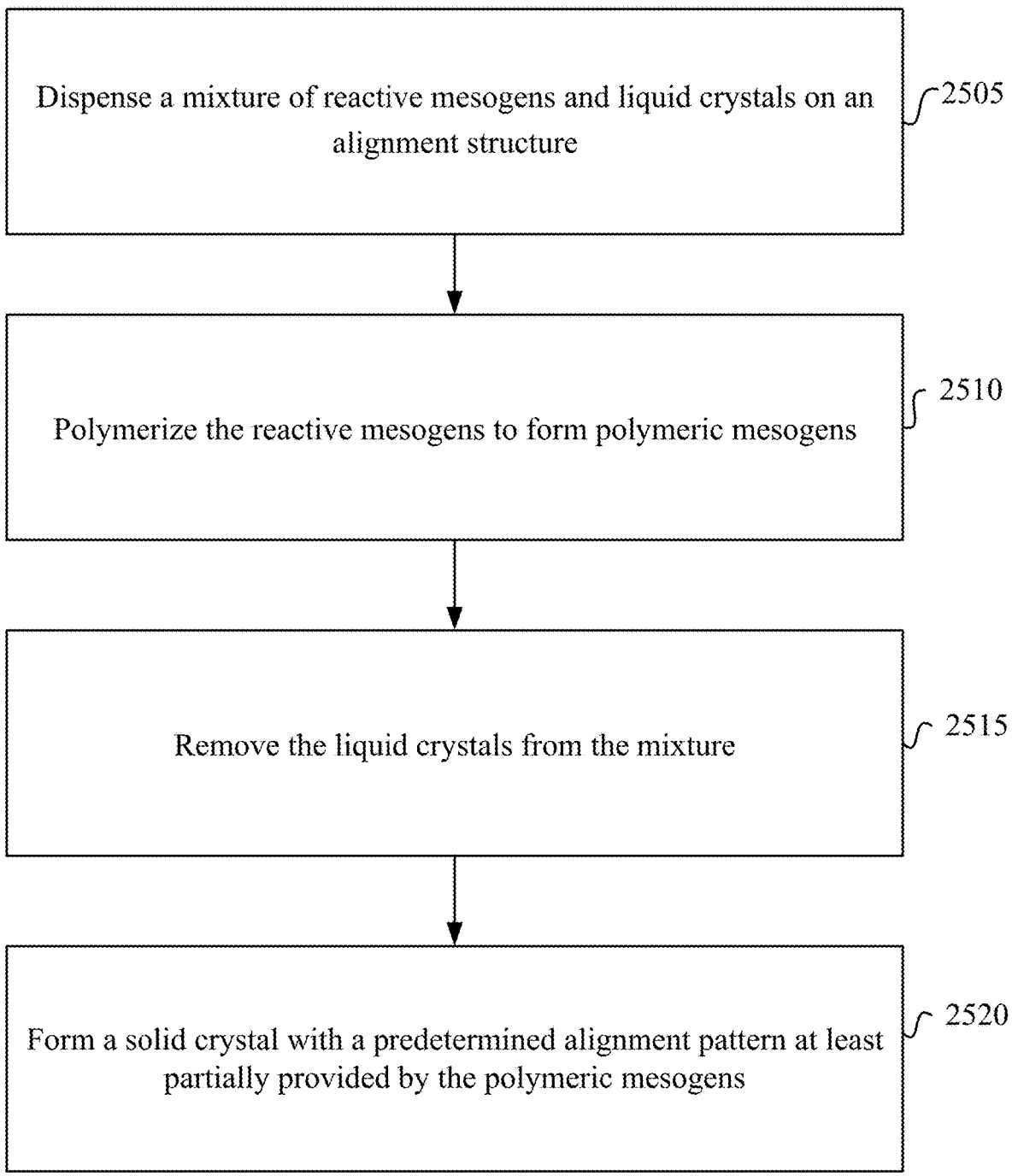

FIG. 25 is a flowchart illustrating a method 2500 for fabricating a solid crystal layer having a predetermined alignment pattern (or for patterning a solid crystal layer), such as an organic solid crystal layer. Method 2500 may include dispensing a mixture of reactive mesogens and liquid crystals on an alignment structure (step 2505). The liquid crystals may be at a nematic phase or a twisted nematic phase at about a room temperature. Method 2500 may further include mixing the reactive mesogens with the liquid crystals at the room temperature. When the mixture is dispensed on the alignment structure, the liquid crystals may be aligned by the alignment structure, and the reactive mesogens may be aligned by the aligned liquid crystal and the alignment structure. That is, the alignments (or the orientations) of the reactive mesogens may be strengthened by the liquid crystals. Method 2500 may also include polymerizing the reactive mesogens to form polymeric mesogens (step 2510). For example, the aligned reactive mesogens may be further polymerized (e.g., photo-polymerized or thermally polymerized) to form polymeric mesogens to partially stabilize the orientations of the polymeric mesogens. Method 2500 may also include removing the liquid crystals from the mixture (step 2515). For example, the liquid crystals may be washed away using a solvent, or the liquid crystals may be removed by heating the mixture of the polymeric mesogens and the liquid crystals to a predetermined temperature (e.g., to evaporate the liquid crystals). Method 2500 may further include forming a solid crystal having a predetermined alignment pattern at least partially provided by the polymeric mesogens (step 2520). For example, a solid crystal layer may be grown from a solid crystal material using the polymeric mesogens as a template (e.g., as an alignment structure for patterning the solid crystal molecules). The solid crystal layer grown on the polymeric mesogens may have a predetermined alignment pattern provided by the polymeric mesogens. In some embodiments, the solid crystal material may be an organic solid crystal material.

FIG. 26 is a flowchart illustrating a method 2600 for fabricating a solid crystal layer having a predetermined alignment pattern (or for patterning a solid crystal layer), such as an organic solid crystal layer. Method 2600 may include dispensing a mixture of a liquid crystal material and a solid crystal material on an alignment structure (step 2605). The mixture may be heated to a predetermined elevated temperature or dissolved in a predetermined solvent to make a homogeneous mixture. The alignment structure may at least partially define a predetermined alignment pattern. The liquid crystal material may be at least partially aligned by the alignment structure in the predetermined alignment pattern. Method 2600 may also include at least partially phase separating the liquid crystal material and the solid crystal material (step 2610). For example, the mixture may be cooled down to a predetermined low temperature or the mixture may be processed to evaporate the solvent. As a result, the liquid crystal material and the solid crystal material may be at least partially phase separated. Method 2600 may further include crystallizing the solid crystal material to form a solid crystal layer with crystal molecules at least partially aligned by the liquid crystal material (step 2615). In some embodiments, the solid crystal material may be an organic solid crystal material, and the solid crystal layer may be an organic solid crystal layer.

Figure 27:
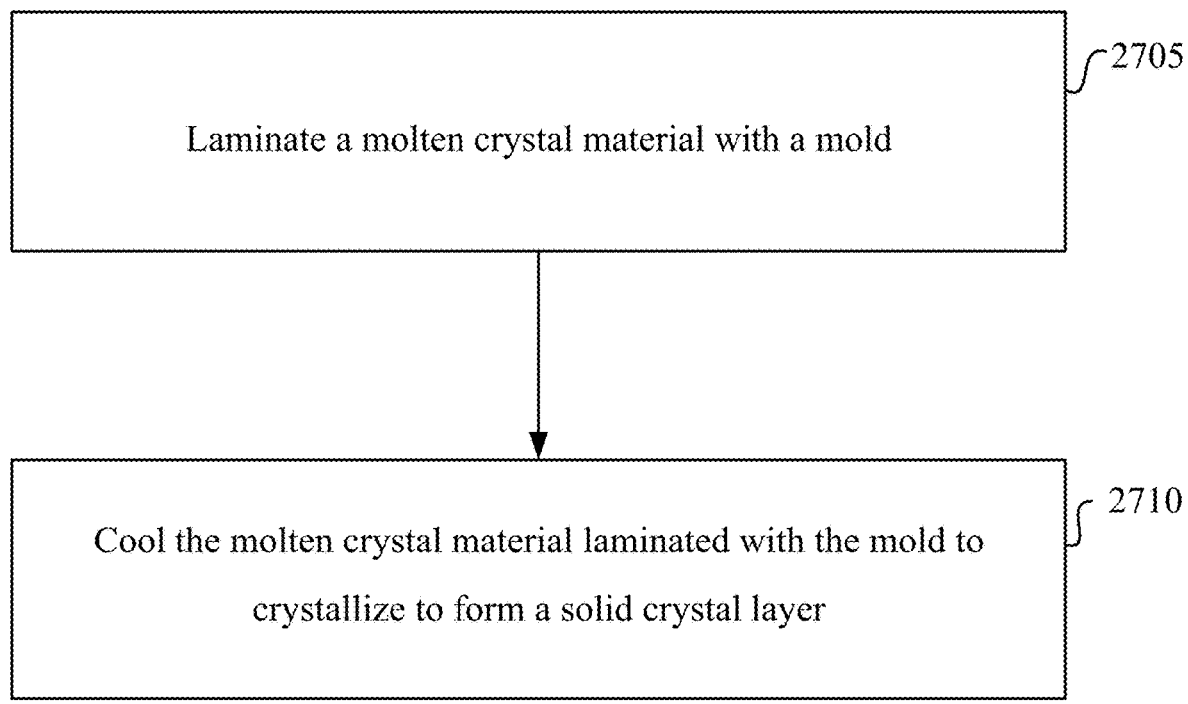

FIG. 27 is a flowchart illustrating a method 2700 for fabricating a solid crystal layer having a predetermined alignment pattern (or for patterning a solid crystal layer), such as an organic solid crystal layer. Method 2700 may include laminating a molten crystal material with a mold (step 2705). In some embodiments, the mold may be a nanoimprint mold configured to provide a predetermined alignment pattern to molecules of the molten crystal material. In some embodiments, the nanoimprint mold may include a plurality of microstructures defining a plurality of grooves. The molten crystal material may be coated to the mold as a layer, which may fill in the grooves. Method 2700 may also include cooling the molten crystal material laminated with the mold to crystallize to form a solid crystal layer (step 2710). Method 2700 may also include heating a solid crystal material to a predetermined melting temperature to generate the molten crystal material. In some embodiments, the solid crystal material may be an organic solid crystal material. Method 2700 may also include removing the solid crystal layer from the mold after cooling and crystallization.

Figure 28:
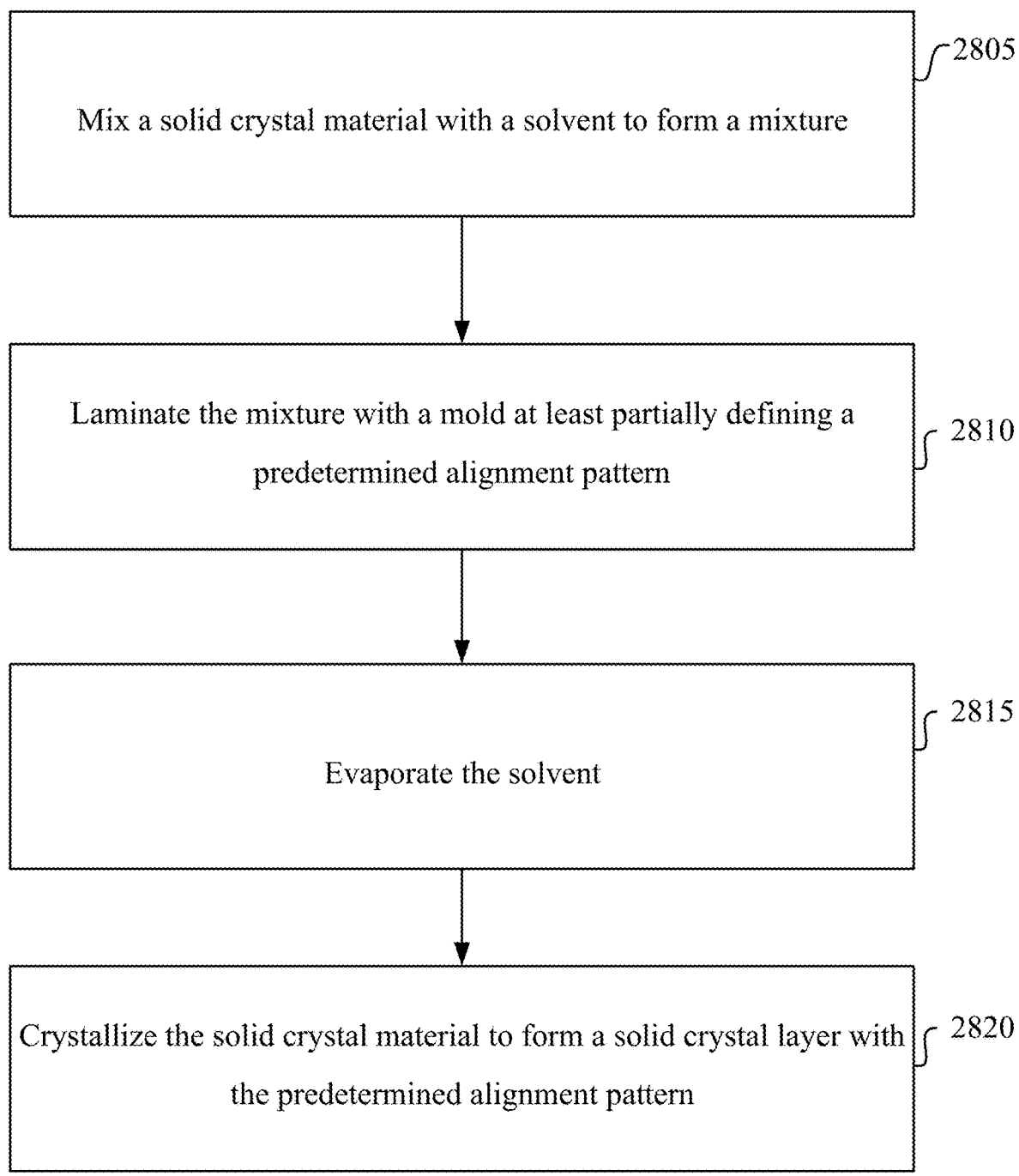

FIG. 28 is a flowchart illustrating a method 2800 for fabricating a solid crystal layer having a predetermined alignment pattern (or for patterning a solid crystal layer), such as an organic solid crystal layer. Method 2800 may include mixing a solid crystal material with a solvent to form a mixture (step 2805). In some embodiments, the solid crystal material may be an organic solid crystal material. Method 2800 may also include laminating the mixture with a mold at least partially defining a predetermined alignment pattern (step 2810). Method 2800 may also include evaporating the solvent (step 2815). Method 2800 may further include crystallizing the solid crystal material to form a solid crystal layer with the predetermined alignment pattern (step 2820). Method 2800 may also include cooling the molten crystal material laminated with the nanoimprint mold to solidify. Method 2800 may also include removing the solid crystal layer from the nanoimprint mold.

Figure 14:
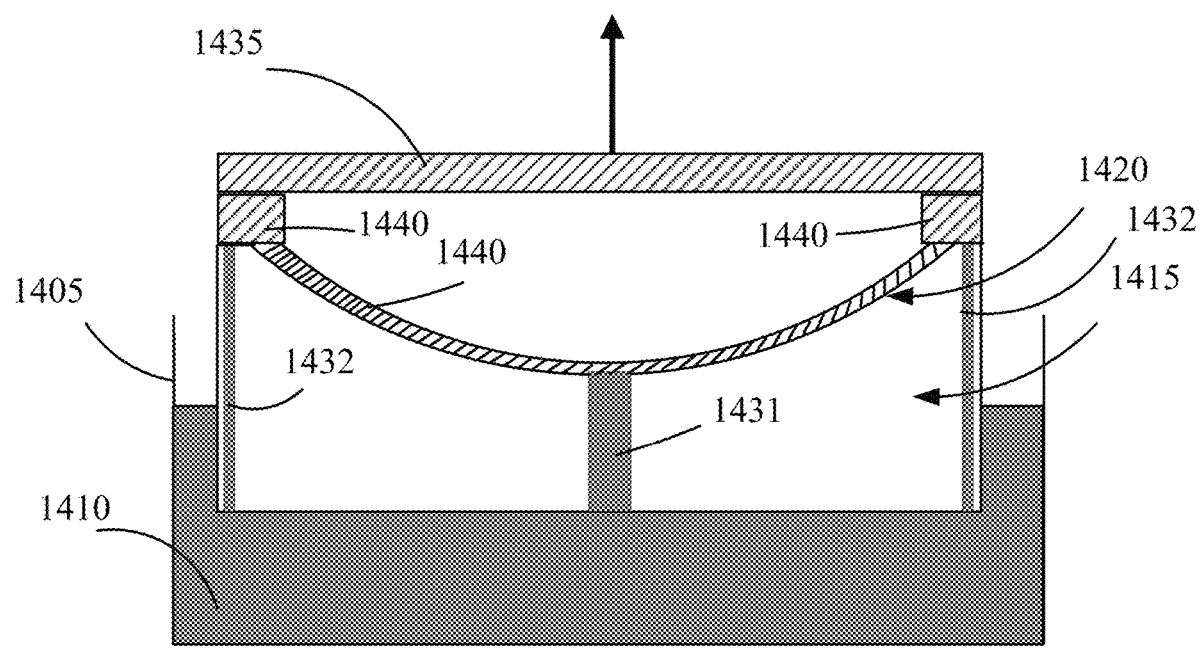
FIG. 14 schematically illustrates a system for fabricating an optical device including a solid crystal, according to an embodiment of the present disclosure.

FIG. 14 schematically illustrates a system 1400 for fabricating an optical device, which may include a solid crystal, according to an embodiment of the present disclosure. The system 1400 may be configured to grow the solid crystal based on a molten crystal material. The system 1400 may include a crucible 1405. A solid crystal material may be placed in the crucible 1405 and may be processed (e.g., heated) to produce a molten crystal material 1410. Devices (e.g., heating elements) for increasing the temperature of the solid crystal material or the crucible 1405 and controller for controlling the heating elements are not shown in FIG. 14. A die 1415 may be disposed in the crucible 1405. The die 1415 may include a plurality of capillaries for guiding the flow of the molten crystal material 1410. For example, the die 1415 may include a center capillary 1431 and a ring capillary 1432. The die 1415 may include a surface 1432. The surface 1432 may include an alignment structure (not labeled) deposited or formed thereon or at least partially in the surface 1432. The alignment structure may define or include an alignment structure pattern. The alignment structure may be configured to at least partially align crystal molecules grown on the alignment structure in a predetermined alignment pattern. A seed crystal 1435 may be disposed over the die 1415. The seed crystal 1435 may be pulled or moved away from the die 1415, allowing the molten crystal material 1410 to follow the movement of the seed crystal 1435. At an interface between the molten crystal material 1410 and the seed crystal 1435, a meniscus may be formed. At the meniscus-crystal interface, solid crystals 1440 may grow. Through the center and ring capillaries 1431 and 1432, the molten crystal material 1410 may flow to the surface 1432 of the die 1415. Solid crystals may grow on the surface 1432, and may be at least partially aligned in the predetermined alignment pattern by the alignment structure provided at the surface 1432. The solid crystal 1440 may be in any suitable shape, depending on the shape of the surface 1432 of the die 1415. For example, the surface 1432 may be a flat surface, and the solid crystal 1440 may include a flat shape.

In addition, according to the disclosed technical solutions, forming (e.g., growing) solid crystals on one or more alignment structures may also improve electronic performances of electronic devices including the formed solid crystals. Forming (e.g., growing) solid crystals on one or more alignment structures may provide a controllable amount of strain, through adjusting the alignment structure so that a certain desirable crystal lattice may be achieved for the solid crystal. In some embodiments, the strain may vary across the solid crystal, e.g., the stain may vary in the same device based on the disclosed solid crystal. In some embodiments, the strain may vary across multiple solid crystals disposed at (e.g., on) the same substrate, e.g., the strain may vary across multiple devices including the respective solid crystals. In some embodiments, the strain may vary in a specific spatial pattern (such as a PBP type pattern), which may aid in novel electronic transport properties.

In some embodiments, an optical element includes a solid crystal including crystal molecules aligned in a predetermined alignment pattern, wherein the predetermined alignment pattern is at least partially defined by an alignment structure to realize a predetermined optical function of the optical element. In some embodiments, the solid crystal is in a form of a continuous layer. In some embodiments, the optical element also includes a substrate, wherein the alignment structure is disposed on the substrate, the solid crystal is disposed on the alignment structure, and the crystal molecules included in the solid crystal are at least partially aligned by the alignment structure. In some embodiments, the optical element includes a substrate, wherein the alignment structure is an integral part of the substrate. In some embodiments, the solid crystal includes a plurality of solid crystals disposed in a stacked configuration, and the optical element may further include a plurality of alignment structures disposed between the solid crystals.

In some embodiments, at least one of the plurality of solid crystals is disposed on each of the plurality of alignment structures, and the at least one of the plurality of solid crystals includes crystal molecules aligned in a corresponding predetermined alignment pattern, which is at least partially defined by a corresponding alignment structure. In some embodiments, the solid crystal is optically anisotropic with a principal refractive index of at least about 1.5 and an optical anisotropy of at least about 0.1, the principal refractive index of the solid crystal being a refractive index in a direction parallel to an axis of the solid crystal, and the axis of the solid crystal being an axis along which the solid crystal has a highest refractive index.

In some embodiments, the solid crystal is configured to guide a light to propagate internally within the solid crystal through total internal reflection ("TIR"), and wherein a wavelength of the light is in a visible wavelength spectrum or a near infrared wavelength spectrum. In some embodiments, the optical element is configured to function as an optical waveguide, and the solid crystal is optically anisotropic with a principal refractive index of at least about 1.5 and an optical anisotropy of at least about 0.1, the principal refractive index of the solid crystal being a refractive index in a direction parallel to an axis of the solid crystal, and the axis of the solid crystal being an axis along which the solid crystal has a highest refractive index. In some embodiments, the solid crystal has a first surface and an opposing second surface, and at least one of the first surface or the second surface is non-rectilinear.

In some embodiments, the optical element includes a first diffraction grating configured to couple an input light into the solid crystal via diffraction, wherein a pitch of the in-coupling diffraction grating is configured such that the solid crystal guides the in-coupled light to propagate internally within the solid crystal through the TIR; and a second diffraction grating configured to decouple the in-coupled light out of the solid crystal via diffraction. In some embodiments, at least one of the first diffraction grating or the second diffraction grating is configured to selectively diffract lights having a predetermined polarization. In some embodiments, at least one of the first diffraction grating or the second diffraction grating may include at least one of a one-dimensional periodic structure or a two-dimensional periodic structure formed at a substrate on which the solid crystal is disposed.

In some embodiments, at least one of the first diffraction grating or the second diffraction grating may include at least one of a one-dimensional periodic structure or a two-dimensional periodic structure formed at the solid crystal. In some embodiments, at least one of the first diffraction grating or the second diffraction grating may include at least one of a one-dimensional periodic structure or a two-dimensional periodic structure formed as a separate element, and wherein the separate element is disposed at a surface of the solid crystal. In some embodiments, at least one of the first diffraction grating or the second diffraction grating may include a volume holographic grating. In some embodiments, a thickness of the solid crystal is between about 300 um to about 1 mm, and at least one lateral dimension of the solid crystal is between about 30 mm to about 100 mm. In some embodiments, an orientation of an axis of the solid crystal spatially varies within the solid crystal, the axis of the solid crystal being an axis along which the solid crystal has a highest refractive index.

In some embodiments, the solid crystal is optically anisotropic with a principal refractive index of at least about 1.5 and an optical anisotropy of at least about 0.1, the principal refractive index of the solid crystal being a refractive index in a direction parallel to the axis of the solid crystal. In some embodiments, the solid crystal is configured to have a spatially varying in-plane orientation of the axis of the solid crystal within the solid crystal. In some embodiments, the crystal molecules are at least partially aligned with the alignment structure to have spatially varying in-plane orientations of axes of the crystal molecules, such that the spatially varying in-plane orientation of the axis of the solid crystal is provided, an axis of a crystal molecule being an axis along which the crystal molecule has a highest refractive index.

In some embodiments, the optical element is configured to function as an Panchratnam Berry Phase optical element operable for lights in a visible wavelength spectrum or a near infrared wavelength spectrum. In some embodiments, the crystal molecules include a first plurality of crystal molecules that are in contact with the alignment structure and a second plurality of crystal molecules disposed over the first plurality of crystal molecules, orientations of the axes of the first plurality of crystal molecules are defined by the alignment structure, and orientations of the axes of the second plurality of crystal molecules are aligned relative to the first plurality of crystal molecules. In some embodiments, the orientations of the axes of the first plurality of crystal molecules vary periodically along a radial in-plane direction.

In some embodiments, orientations of the axes of the first plurality of crystal molecules vary periodically and linearly along one or both in-plane directions. In some embodiments, the solid crystal is cholesteric, and includes chiral organic crystal molecules or organic crystal molecules doped with chiral dopants. In some embodiments, the crystal molecules include a first plurality of crystal molecules that are in contact with the alignment structure and a second plurality of crystal molecules disposed over the first plurality of crystal molecules, orientations of the axes of the first plurality of crystal molecules are defined by the alignment structure, and orientations of the axes of the second plurality of crystal molecules twist in a helical fashion along a direction perpendicular to a first surface of the optical element.

In some embodiments, the orientations of the axes of the first plurality of crystal molecules vary periodically and linearly along one of the in-plane directions, and crystal molecules from the first plurality of crystal molecules and the second plurality of crystal molecules having the same orientations of the axes form slanted periodic planes of a constant refractive index within the solid crystal. In some embodiments, the solid crystal is a first solid crystal, the crystal molecules in the solid crystal are first crystal molecules, the predetermined alignment pattern is a first predetermined alignment pattern, the alignment structure is a first alignment structure, and the optical element further includes a second solid crystal including second crystal molecules aligned in a second predetermined alignment pattern, which is at least partially defined by a second alignment structure, wherein the first solid crystal and second solid crystal are separated from each other by the second alignment structure. In some embodiments, the first solid crystal and the second solid crystal have different optical dispersions.

In some embodiments, the first and second solid crystals are cholesteric, and include chiral organic crystal molecules or organic crystal molecules doped with chiral dopants, and the first and second solid crystals exhibit opposite handedness. In some embodiments, the orientation of the axis of the first solid crystal is at least partially defined by the first alignment structure, and is spatially constant within the first solid crystal, the orientation of the axis of the second solid crystal is at least partially defined by the second alignment structure, and is spatially constant within the second solid crystal, and the orientation of the axis of the second solid crystal is rotated by an angle with respect to the orientation of the axis of the first solid crystal along a direction perpendicular to a first surface of the optical element. In some embodiments, the optical element has a thickness between about 500 mm to about 5 um. In some embodiments, the orientation of the axis of the solid crystal spatially varies smoothly within the solid crystal.

In some embodiments, the solid crystal includes a plurality of grains with grain boundaries, and at least one grain is at least partially aligned with the alignment structure on which the solid crystal is disposed. In some embodiments, one or more of the crystal molecules in the solid crystal include a functional group to facilitate a smooth transition between neighboring grains and the crystal molecules of the solid crystal. In some embodiments, the solid crystal includes an additive or a plasticizer configured to release a local crystalline strain to facilitate a smooth transition between neighboring grains and the crystal molecules in the solid crystal. In some embodiments, the alignment structure is configured to at least partially define uniform orientations, periodic orientations in a linear direction, periodic orientations in a radial direction, or periodic orientations in a circumferential (or azimuthal) direction for axes of the crystal molecules within the solid crystal, an axis of a crystal molecule being an axis along which the molecule has the highest refractive index.

In some embodiments, the solid crystal may include at least one of: a saturated or unsaturated polycyclic hydrocarbon, including at least one of anthracene, tetracene, pentacene, a derivative of the anthracene, a derivative of the tetracene, or a derivative of the pentacene; nitrogen, sulfur, and oxygen heterocycle; quinoline, benzothiophene, or benzopyran; bent and asymmetric acene including at least one of phenanthrene, phenanthroline, pyrene, fluoranthene, or a derivative thereof; 2,6-naphthalene dicarboxylic acid, 2,6 dimethyl carboxylic ester crystal molecules, or a derivative thereof; or biphenyl, terphenyl, quaterphenyl, or phenylacetylene, or their derivatives including substitutes with alkyl groups, cyano groups, isothiocyanate groups, fluorine, chlorine or fluorinated ether. In some embodiments, the solid crystal has a light transmittance of greater than or equal to 60% in a visible wavelength spectrum.

In some embodiments, the optical element includes a substrate, on which the alignment structure is provided, wherein the substrate has a light transmittance of greater than or equal to 60% in a visible wavelength spectrum. In some embodiments, the substrate includes at least one of a glass, a polymer, or a semiconductor material. In some embodiments, at least one surface of the substrate has a curved shape, wherein the curved shape is one of a convex, concave, asphere, cylindrical, or freeform shape. In some embodiments, the solid crystal is disposed at a first surface of the substrate, and the optical element further includes a reflective coating disposed at a second surface of the substrate. In some embodiments, the optical element includes an anti-reflective coating disposed at a surface of the solid crystal. In some embodiments, the solid crystal is switchable between an amorphous state and an aligned crystal state through at least one of a thermal based switching, a polarization based switching, or a photo sensitivity based switching.

In some embodiments, the alignment structure is a first alignment structure, the optical element may further include a second alignment structure configured to at least partially align the crystal molecules in the solid crystal, wherein the solid crystal is in contact with both the first alignment structure and the second alignment structure. In some embodiments, the solid crystal is a first solid crystal, the crystal molecules in the solid crystal are first crystal molecules, the predetermined alignment pattern is a first predetermined alignment pattern, the alignment structure is a first alignment structure, and the optical element further includes: a second solid crystal including second crystal molecules aligned in a second predetermined alignment pattern, which is at least partially defined by a second alignment structure, wherein the first solid crystal and second solid crystal are separated from each other by the second alignment structure.

In some embodiments, the first solid crystal and the second solid crystal include a same or different optical dispersion. In some embodiments, the first predetermined alignment pattern is the same as or different from the second predetermined alignment pattern. In some embodiments, the alignment structure includes at least one of: a photo-alignment material layer; a mechanically rubbed alignment layer; an alignment layer with anisotropic nanoimprint; an anisotropic relief directly formed on a substrate; a ferroelectric or ferromagnetic material deposited on the substrate; a thin crystalline layer or crystalline substrate; or an alignment layer formed by crystallization in a presence of a magnetic field or an electric field. In some embodiments, the alignment structure includes a hexagonal boron nitride or graphene layer. In some embodiments, the solid crystal is uniaxially or biaxially anisotropic.

In some embodiments, a method for fabricating an optical element includes providing an alignment structure; and forming a solid crystal on the alignment structure, wherein the solid crystal includes crystal molecules aligned in a predetermined alignment pattern, which is at least partially defined by the alignment structure. In some embodiments, forming the solid crystal on the alignment structure may include growing the solid crystal on the alignment structure. In some embodiments, forming the solid crystal on the alignment structure is performed using at least one of the following processes: a vapor deposition including at least one of an organic crystal molecule beam epitaxy, or a hot wall epitaxy of organic crystal molecules; a solvent assisted deposition via a thermal alignment, a mold alignment, or a surface alignment; a polymer assisted continuous casting; a temperature assisted zone annealing; a physical vapor transport; a spin coating; or a crystal growth process based on a molten crystal material.

In some embodiments, providing the alignment structure may include depositing the alignment structure on a surface of a substrate. In some embodiments, providing the alignment structure may include at least one of: forming a photoalignment layer on a surface of a substrate by processing a photosensitive material by a light; forming a mechanically rubbed alignment layer on the surface of the substrate; forming an alignment layer with anisotropic nanoimprint on the surface of the substrate; forming an anisotropic relief directly on the surface of the substrate through wet or dry etching of the surface of the substrate; forming the alignment structure on the surface of the substrate based on a ferroelectric or ferromagnetic material deposited on the surface of the substrate; providing a crystalline layer or a crystalline substrate that defines an alignment pattern as the alignment structure; or forming the alignment structure on the surface of the substrate by crystallization in the presence of a magnetic or electric field.

In some embodiments, the alignment structure is a first alignment structure, the predetermined alignment pattern is a first predetermined alignment pattern, the solid crystal is a first solid crystal, the crystal molecules are first crystal molecules, and the method further includes: providing a second alignment structure on the first solid crystal; and forming a second solid crystal on the second alignment structure, wherein the second solid crystal includes second crystal molecules aligned in a second predetermined alignment pattern, which is at least partially defined by the second alignment structure. In some embodiments, the optical element functions as a Panchratnam Berry Phase optical element or an optical waveguide. In some embodiments, the solid crystal is optically anisotropic with a principal refractive index of at least about 1.5 and an optical anisotropy of at least about 0.1, the principal refractive index of the solid crystal being a refractive index in a direction parallel to an axis of the solid crystal, and the axis of the solid crystal being an axis along which the solid crystal has a highest refractive index. In some embodiments, a method for fabricating a solid crystal includes providing a molten crystal material and an alignment structure that are in contact with one another; and producing the solid crystal based on the molten crystal material, wherein the solid crystal includes crystal molecules aligned in a predetermined alignment pattern that is at least partially defined by the alignment structure. In some embodiments, producing the solid crystal includes cooling the molten crystal material.

In some embodiments, producing the solid crystal includes: growing the solid crystal based on the molten crystal material by moving a seed crystal away from a die, wherein the die includes at least one capillary at least partially configured to allow the molten crystal material to flow therethrough during the growth of the solid crystal, wherein the die includes a surface having a predetermined shape and having the alignment structure, and wherein the solid crystal grows along the surface of the die according to the alignment structure.

In some embodiments, a method for fabricating a solid crystal includes: moving a molten crystal material in a space between two substrates while maintaining contact between the molten crystal material and two opposing surfaces of the two substrates, wherein each of the two opposing surfaces includes an alignment structure that is in contact with the molten crystal material; and growing, from the molten crystal material using a seed crystal, the solid crystal including crystal molecules aligned in a predetermined alignment pattern that is at least partially defined by the alignment structures.

In some embodiments, a method for fabricating a solid crystal includes: processing a solid crystal material in a crucible to produce a molten crystal material; guiding, through one or more capillaries of a die, the molten crystal material to flow onto a surface including at least one alignment structure; and growing, from the molten crystal material using a seed crystal, the solid crystal including crystal molecules aligned in a predetermined alignment pattern that is at least partially defined by the at least one alignment structure. In some embodiments, the surface of the die has a predetermined curved shape, and wherein the grown solid crystal has substantially the same curved shape as the surface of the die. In some embodiments, growing the solid crystal includes: moving the seed crystal disposed at a top portion of the die away from the die to allow the solid crystal to grow at a meniscus-crystal interface along the surface of the die, and the method further includes removing the grown solid crystal from the crucible. In some embodiments, the method further includes cooling the solid crystal removed from the crucible.

In some embodiments, the present disclosure provides an organic solid crystal including a layer of organic single crystal or polycrystal having at least one crystal orientation varying periodically along at least one in-plane direction. A first refractive index of the organic solid crystal may be in a range of 1.6-2.6 along at least one crystal orientation. An optical anisotropy of the solid crystal may be no less than 0.1.

In some embodiments, the organic solid crystal may be fabricated at a surface of an alignment layer or alignment structure having a predetermined alignment pattern. An organic solid crystal material may be dispensed to the surface of the alignment layer. Molecules of the organic solid crystal material may be aligned according to the predetermined alignment pattern provided by the alignment layer. In some embodiments, orientations of the molecules may be aligned according to the predetermined alignment pattern to vary continuously along at least one in-plane direction. The orientation of the organic solid crystal may be set by the orientations of the molecules. The orientation of the molecules of the continuous layer of organic solid crystal along an out-of-plane direction (e.g., a thickness direction) may follow the orientation of the molecules that are in contact with the alignment layer.

Any of the steps, operations, or processes described herein may be performed or implemented with one or more hardware and/or software modules, alone or in combination with other devices. In one embodiment, a software module is implemented with a computer program product including a computer-readable medium containing computer program code, which can be executed by a computer processor for performing any or all of the steps, operations, or processes described. In some embodiments, a hardware module may include hardware components such as a device, a system, an optical element, a controller, an electrical circuit, a logic gate, etc.

Embodiments of the disclosure may also relate to an apparatus for performing the operations herein. This apparatus may be specially constructed for the specific purposes, and/or it may include a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. The non-transitory computer-readable storage medium can be any medium that can store program codes, for example, a magnetic disk, an optical disk, a read-only memory ("ROM"), or a random access memory ("RAM"), an Electrically Programmable read only memory ("EPROM"), an Electrically Erasable Programmable read only memory ("EEPROM"), a register, a hard disk, a solid-state disk drive, a smart media card ("SMC"), a secure digital card ("SD"), a flash card, etc. Furthermore, any computing systems described in the specification may include a single processor or may be architectures employing multiple processors for increased computing capability. The processor may be a central processing unit ("CPU"), a graphics processing unit ("GPU"), or any processing device configured to process data and/or performing computation based on data. The processor may include both software and hardware components. For example, the processor may include a hardware component, such as an application-specific integrated circuit ("ASIC"), a programmable logic device ("PLD"), or a combination thereof. The PLD may be a complex programmable logic device ("CPLD"), a field-programmable gate array ("FPGA"), etc.

Further, when an embodiment illustrated in a drawing shows a single element, it is understood that the embodiment may include a plurality of such elements. Likewise, when an embodiment illustrated in a drawing shows a plurality of such elements, it is understood that the embodiment may include only one such element. The number of elements illustrated in the drawing is for illustration purposes only, and should not be construed as limiting the scope of the embodiment. Moreover, unless otherwise noted, the embodiments shown in the drawings are not mutually exclusive, and they may be combined in any suitable manner. For example, elements shown in one embodiment but not another embodiment may nevertheless be included in the other embodiment.

Various embodiments have been described to illustrate the exemplary implementations. Based on the disclosed embodiments, a person having ordinary skills in the art may make various other changes, modifications, rearrangements, and substitutions without departing from the scope of the present disclosure. Thus, while the present disclosure has been described in detail with reference to the above embodiments, the present disclosure is not limited to the above described embodiments. The present disclosure may be embodied in other equivalent forms without departing from the scope of the present disclosure. The scope of the present disclosure is defined in the appended claims.

What is claimed is:

1. An optical element, comprising:
   an alignment structure configured to provide a predetermined in-plane alignment pattern; and
   a solid crystal grown on the alignment structure based on a solid crystal material through crystallization, wherein the alignment structure is configured to interact with solid crystal molecules to at least partially align the solid crystal molecules in the predetermined in-plane alignment pattern as the solid crystal grows on the alignment structure,
   wherein the solid crystal has a principal refractive index of at least 2.2 and a birefringence of at least 0.3.

2. The optical element of claim 1, wherein the solid crystal is in a form of a continuous layer.

3. The optical element of claim 1, wherein
   the solid crystal includes a plurality of solid crystals disposed in a stacked configuration, and
   the optical element further includes a plurality of alignment structures disposed between the solid crystals.

4. The optical element of claim 1, wherein the principal refractive index is between 2.2 and 2.6 and the birefringence is at least about 0.4, the principal refractive index being a refractive index in a direction parallel to an axis of the solid crystal, and the axis of the solid crystal being an axis along which the solid crystal has a highest refractive index.

5. The optical element of claim 1, wherein the alignment structure is configured to at least partially define uniform in-plane orientations, periodic or non-periodic in-plane orientations in a linear direction, in a radial direction, or in a circumferential direction for an axis of the solid crystal.

6. The optical element of claim 1, wherein an orientation of an axis of the solid crystal is spatially constant or spatially varying within the solid crystal, the axis of the solid crystal being an axis along which the solid crystal has a highest refractive index.

7. The optical element of claim 1, wherein the optical element is configured to function as a Panchratnam Berry Phase optical element.

8. The optical element of claim 1, wherein the alignment structure includes at least one of:
- a photo-alignment material layer;
- a mechanically rubbed alignment layer;
- an alignment layer with anisotropic nanoimprint;
- an anisotropic relief directly formed on a substrate;
- a ferroelectric or ferromagnetic material deposited on the substrate;
- a thin crystalline layer or crystalline substrate; or
- an alignment layer formed by crystallization in a presence of a magnetic field or an electric field.

9. The optical element of claim 1, wherein
the solid crystal molecules include a first plurality of solid crystal molecules disposed in contact with the alignment structure and a second plurality of solid crystal molecules disposed over the first plurality of solid crystal molecules,
orientations of axes of the first plurality of solid crystal molecules are defined by the alignment structure, and
orientations of axes of the second plurality of solid crystal molecules twist in a helical fashion.

10. The optical element of claim 1, wherein
the solid crystal includes chiral organic solid crystal molecules or organic solid crystal molecules doped with chiral dopants.

11. The optical element of claim 1, wherein
the solid crystal includes a plurality of grains with grain boundaries, and at least one grain is at least partially aligned by the alignment structure on which the solid crystal is disposed, and
the solid crystal includes a plasticizer configured to release local crystalline strain to provide a smooth transition between neighboring grains.

12. The optical element of claim 1, wherein the solid crystal is switchable between an amorphous state and an aligned crystal state through at least one of a thermal based switching, a polarization based switching, or a photo sensitivity based switching.

13. The optical element of claim 1, wherein the solid crystal is uniaxially or biaxially anisotropic.

14. The optical element of claim 1, wherein the solid crystal comprises at least one of:
- a saturated or unsaturated polycyclic hydrocarbon, including at least one of anthracene, tetracene, pentacene, a derivative of the anthracene, a derivative of the tetracene, or a derivative of the pentacene;
- nitrogen, sulfur, and oxygen heterocycle;
- quinoline, benzothiophene, or benzopyran;
- bent and asymmetric acene including at least one of phenanthrene, phenanthroline, pyrene, fluoranthene, a derivative of the phenanthrene, a derivative of the phenanthroline, a derivative of the pyrene, or a derivative of the fluoranthene;
- 2,6-naphthalene dicarboxylic acid, 2,6 dimethyl carboxylic ester crystal molecules, a derivative of the 2,6-naphthalene dicarboxylic acid, or a derivative of the 2,6 dimethyl carboxylic ester crystal molecules; or
- biphenyl, terphenyl, quaterphenyl, or phenylacetylene, or derivatives of the biphenyl, terphenyl, quaterphenyl, or phenylacetylene including substitutes with alkyl groups, cyano groups, isothiocyanate groups, fluorine, chlorine or fluorinated ether.

15. The optical element of claim 1, wherein the solid crystal is a single crystal layer or a polycrystal layer.

16. The optical element of claim 1, wherein the solid crystal is an organic solid crystal layer comprising at least one polycyclic aromatic hydrocarbon or a derivative of the polycyclic aromatic hydrocarbon.

17. The optical element of claim 1, wherein the solid crystal is an organic crystal layer comprising molecules containing a ring structure system and two terminal group systems.

18. The optical element of claim 1, wherein the solid crystal is an organic crystal layer comprising crystalline polymers having precursors including aromatic hydrocarbon, heteroarene groups, or derivatives thereof.

19. The optical element of claim 1, wherein the solid crystal is an organic crystal layer comprising a binder formed by at least one of amorphous polymers with aliphatic, hetroaliphatic, aromatic hydrocarbon, or heteroarene groups.

* * * * *